(12) United States Patent
Scott et al.

(10) Patent No.: US 11,039,511 B2
(45) Date of Patent: Jun. 15, 2021

(54) DEFROSTING APPARATUS WITH TWO-FACTOR MASS ESTIMATION AND METHODS OF OPERATION THEREOF

(71) Applicant: NXP USA, Inc., Austin, TX (US)

(72) Inventors: James Eric Scott, Gilbert, AZ (US); Nicholas Justin Mountford Spence, Phoenix, AZ (US); Hung Hoa Tran, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 414 days.

(21) Appl. No.: 16/230,425

(22) Filed: Dec. 21, 2018

(65) Prior Publication Data

US 2020/0205247 A1 Jun. 25, 2020

(51) Int. Cl.
*H05B 6/68* (2006.01)
*H05B 6/66* (2006.01)
(Continued)

(52) U.S. Cl.
CPC .............. *H05B 6/688* (2013.01); *H03H 7/40* (2013.01); *H05B 6/50* (2013.01); *H05B 6/54* (2013.01); *H05B 6/62* (2013.01); *H05B 6/6455* (2013.01); *H05B 6/6464* (2013.01); *H05B 6/6467* (2013.01); *H05B 6/686* (2013.01)

(58) Field of Classification Search
CPC ... H03H 7/40; H05B 6/50; H05B 6/54; H05B 6/62; H05B 6/6455; H05B 6/6464; H05B 6/6467; H05B 6/686; H05B 6/688
USPC ....... 219/709, 683, 497, 501, 505, 716, 756, 219/770, 771, 778, 779, 780; 426/238, 426/230, 240, 241, 242, 243; 427/131
See application file for complete search history.

(56) References Cited

U.S. PATENT DOCUMENTS 2,868,940 A  1/1959  Jennings et al.
4,303,820 A  12/1981  Stottmann et al.
(Continued)

FOREIGN PATENT DOCUMENTS

CN  1823683 A   8/2006
CN  101161560 A 4/2008
(Continued)

OTHER PUBLICATIONS

Notice of Allowance; U.S. Appl. No. 15/456,398; pages (dated Apr. 6, 2021).
(Continued)

*Primary Examiner* — Quang T Van

(57) ABSTRACT

A defrosting system includes an RF signal source, one or more electrodes, a transmission path between the RF signal source and the electrode(s), and an impedance matching network coupled along the transmission path. A system controller may modify the impedance matching network to reduce the reflected signal power. The system controller may determine an initial estimate of the mass of the load. Desired signal parameters for the RF signal may be determined based on the initial estimated mass of the load. The system controller may determine a refined estimate of the load mass based on a rate of change of an S11, VSWR, or reflected power parameter measured at the transmission path, or based on elapsed time between matches. Refined signal parameters for the RF signal may be determined based on the refined estimated mass.

20 Claims, 18 Drawing Sheets

(51) Int. Cl.
*H05B 6/64* (2006.01)
*H03H 7/40* (2006.01)
*H05B 6/50* (2006.01)
*H05B 6/54* (2006.01)
*H05B 6/62* (2006.01)

(56) References Cited

U.S. PATENT DOCUMENTS

| | | |
|---|---|---|
| 4,333,521 A | 6/1982 | Stottman et al. |
| 4,341,937 A | 7/1982 | Staats |
| 4,507,530 A | 3/1985 | Smith |
| 4,771,355 A | 9/1988 | Emery et al. |
| 4,803,854 A | 2/1989 | Kikuchi et al. |
| 4,870,235 A | 9/1989 | Steers |
| 4,874,914 A | 10/1989 | Eke |
| 4,874,915 A | 10/1989 | Harms et al. |
| 4,980,530 A | 12/1990 | Butot |
| 5,036,172 A | 7/1991 | Kokkeler et al. |
| 5,180,895 A | 1/1993 | Briggs et al. |
| 5,349,166 A | 9/1994 | Taylor |
| 5,407,524 A | 4/1995 | Patrick et al. |
| 5,436,433 A | 7/1995 | Kim et al. |
| 5,507,055 A | 4/1996 | Blauert et al. |
| 5,512,736 A | 4/1996 | Kang et al. |
| 5,585,766 A | 12/1996 | Shel |
| 5,641,423 A | 6/1997 | Bridges et al. |
| 5,872,475 A | 2/1999 | Otaka |
| 6,198,084 B1 | 3/2001 | Kim |
| 6,247,395 B1 | 6/2001 | Yamamoto |
| 6,252,354 B1 | 6/2001 | Collins et al. |
| 6,259,344 B1 | 7/2001 | Heritier-Best et al. |
| 6,657,173 B2 | 12/2003 | Flugstad et al. |
| 6,784,405 B2 | 8/2004 | Flugstad et al. |
| 6,887,339 B1 | 5/2005 | Goodman et al. |
| 7,761,247 B2 | 7/2010 | Van Zyl |
| 8,162,932 B2 | 4/2012 | Podhajsky et al. |
| 8,207,479 B2 | 6/2012 | Ben-Shmuel et al. |
| 8,375,319 B2 | 2/2013 | Decker et al. |
| 8,562,793 B2 | 10/2013 | Novak |
| 9,131,543 B2 | 9/2015 | Ben-Shumel et al. |
| 9,215,756 B2 | 12/2015 | Bilchinsky et al. |
| 9,298,873 B2 | 3/2016 | Ishizuka et al. |
| 9,306,533 B1 | 4/2016 | Mavretic |
| 9,337,000 B2 | 5/2016 | Marakhtanov et al. |
| 9,584,090 B2 | 2/2017 | Mavretic |
| 9,720,022 B2 | 8/2017 | Howald et al. |
| 9,755,576 B2 | 9/2017 | Perreault et al. |
| 9,809,480 B2 | 11/2017 | Stephenson et al. |
| 9,967,925 B2 | 5/2018 | Brill |
| 9,973,167 B2 | 5/2018 | Shi et al. |
| 10,124,187 B2 | 11/2018 | Schwarz et al. |
| 10,433,376 B2 | 10/2019 | Chaimov et al. |
| 2002/0003141 A1 | 1/2002 | Blaker et al. |
| 2002/0046474 A1 | 4/2002 | Novak et al. |
| 2003/0205571 A1 | 11/2003 | Flugstad et al. |
| 2004/0016744 A1* | 1/2004 | Ottaway ............ A23L 3/005 219/391 |
| 2004/0084380 A1 | 5/2004 | Kicinski |
| 2006/0081624 A1 | 4/2006 | Takada et al. |
| 2008/0264800 A1 | 10/2008 | Schlager et al. |
| 2008/0314999 A1 | 12/2008 | Strand |
| 2009/0058550 A1 | 3/2009 | Ella et al. |
| 2009/0194526 A1 | 8/2009 | Buchanan |
| 2010/0141042 A1 | 6/2010 | Kesler et al. |
| 2010/0239757 A1 | 9/2010 | Murata |
| 2010/0247403 A1 | 9/2010 | Hancock |
| 2011/0176911 A1 | 7/2011 | Couturier et al. |
| 2011/0278284 A1 | 11/2011 | Tian et al. |
| 2012/0000888 A1 | 1/2012 | Kawasaki et al. |
| 2012/0067872 A1 | 3/2012 | Libman et al. |
| 2012/0075033 A1 | 3/2012 | Ouyang et al. |
| 2012/0086519 A1 | 4/2012 | Hauer et al. |
| 2012/0103973 A1 | 5/2012 | Rogers et al. |
| 2012/0119842 A1 | 5/2012 | Gu et al. |
| 2012/0122072 A1 | 5/2012 | Bilchinsky et al. |
| 2012/0164022 A1 | 6/2012 | Muginstein et al. |
| 2012/0168645 A1 | 7/2012 | Atzmony et al. |
| 2013/0080098 A1 | 3/2013 | Hadad et al. |
| 2013/0193913 A1 | 8/2013 | Takada et al. |
| 2013/0257667 A1 | 10/2013 | Kang |
| 2013/0284725 A1 | 10/2013 | Bilchinsky et al. |
| 2013/0119055 A1 | 11/2013 | Wohl et al. |
| 2013/0334214 A1 | 12/2013 | Yogev et al. |
| 2014/0167878 A1 | 6/2014 | Lee |
| 2014/0287100 A1 | 9/2014 | Libman |
| 2014/0312972 A1 | 10/2014 | Yoneda et al. |
| 2015/0091440 A1 | 4/2015 | Marakhtanov et al. |
| 2015/0091441 A1 | 4/2015 | Marakhtanov et al. |
| 2015/0351164 A1 | 12/2015 | Wesson et al. |
| 2016/0095171 A1* | 3/2016 | Chaimov .............. H05B 6/664 219/704 |
| 2016/0095196 A1 | 3/2016 | Chen et al. |
| 2016/0181986 A1 | 6/2016 | Perreault et al. |
| 2016/0198530 A1 | 7/2016 | Piel et al. |
| 2016/0221441 A1 | 8/2016 | Hall et al. |
| 2016/0248396 A1 | 8/2016 | Mavretic |
| 2016/0308560 A1 | 10/2016 | Howald et al. |
| 2016/0343548 A1 | 11/2016 | Howald et al. |
| 2017/0096352 A1 | 4/2017 | Hughes et al. |
| 2017/0181455 A1 | 6/2017 | Bullo et al. |
| 2017/0266986 A1 | 9/2017 | Yamada |
| 2017/0302236 A1 | 10/2017 | Oshita |
| 2018/0042073 A1 | 2/2018 | Scott et al. |
| 2018/0042074 A1 | 2/2018 | Qiu et al. |
| 2018/0062605 A1 | 3/2018 | Brounley et al. |
| 2018/0115298 A1 | 4/2018 | Fujimoto et al. |
| 2018/0146518 A1 | 5/2018 | Ma et al. |
| 2018/0220499 A1 | 8/2018 | Sims et al. |
| 2018/0374685 A1 | 12/2018 | Collins et al. |
| 2019/0008005 A1 | 1/2019 | Dore et al. |
| 2019/0141799 A1 | 5/2019 | Mongin et al. |
| 2019/0158039 A1 | 5/2019 | Koya et al. |
| 2019/0158055 A1 | 5/2019 | Mongin et al. |
| 2019/0191500 A1 | 6/2019 | Mongin et al. |
| 2019/0191501 A1 | 6/2019 | Piel et al. |
| 2019/0306933 A1 | 10/2019 | McCarville et al. |
| 2019/0320506 A1 | 10/2019 | Guatta et al. |
| 2020/0084844 A1 | 3/2020 | Qiu et al. |
| 2020/0092957 A1 | 3/2020 | Ma et al. |
| 2020/0136497 A1 | 4/2020 | Beck |
| 2020/0170081 A1 | 5/2020 | McCarville et al. |

FOREIGN PATENT DOCUMENTS

| | | |
|---|---|---|
| CN | 201914941 U | 8/2011 |
| CN | 102951760 A | 3/2013 |
| CN | 203021337 U | 6/2013 |
| CN | 203247118 U | 10/2013 |
| CN | 103903944 A | 7/2014 |
| CN | 104377106 A | 2/2015 |
| CN | 104782226 A | 7/2015 |
| CN | 104930804 A | 9/2015 |
| CN | 105142253 A | 12/2015 |
| CN | 105206494 A | 12/2015 |
| CN | 105357788 A | 2/2016 |
| CN | 105768922 A | 7/2016 |
| CN | 106225029 A | 12/2016 |
| CN | 106301362 A | 1/2017 |
| CN | 205860137 U | 1/2017 |
| CN | 205919380 U | 2/2017 |
| CN | 206213147 U | 6/2017 |
| CN | 107359705 A | 11/2017 |
| CN | 107373296 A | 11/2017 |
| CN | 206724547 U | 12/2017 |
| CN | 108521691 A | 9/2018 |
| CN | 108812854 A | 11/2018 |
| CN | 109000396 A | 12/2018 |
| CN | 208521691 A | 2/2019 |
| DE | 38 18 491 A1 | 12/1989 |
| DE | 11 2014 001599 T5 | 6/2016 |
| EP | 1 577 281 A1 | 9/2005 |
| EP | 01818076 A1 | 8/2007 |
| EP | 2 445 312 A1 | 4/2012 |
| EP | 3 240 142 A1 | 11/2017 |

(56) References Cited

FOREIGN PATENT DOCUMENTS

| | | |
|---|---|---|
| EP | 0 597 497 A1 | 5/2018 |
| GB | 621320 | 4/1949 |
| GB | 2 465 442 A | 5/2010 |
| JP | S5111237 A | 1/1976 |
| JP | 55-44199 | 3/1980 |
| JP | S56-148273 A | 11/1981 |
| JP | S5950305 | 12/1984 |
| JP | 63-207921 | 8/1988 |
| JP | 3-72840 A | 3/1991 |
| JP | H 0513162 A | 1/1993 |
| JP | H06215955 A | 8/1994 |
| JP | H027269868 A | 10/1995 |
| JP | 08-255682 | 1/1996 |
| JP | 08-185966 A | 7/1996 |
| JP | 10134953 A | 5/1998 |
| JP | 2003 332037 A | 11/2003 |
| JP | 2003347035 A | 12/2003 |
| JP | 2004057101 A | 2/2004 |
| JP | 20040633008 A | 2/2004 |
| JP | 2004247128 | 9/2004 |
| JP | 2005056781 A | 3/2005 |
| JP | 2012207900 A | 10/2012 |
| JP | 2017 182885 A | 10/2017 |
| JP | 6375032 B2 | 8/2018 |
| JP | 0327120 U | 3/2019 |
| KR | 100133085 | 4/1998 |
| WO | 2007/117754 A2 | 10/2007 |
| WO | 2010/060233 A1 | 6/2010 |
| WO | 2012/001523 A2 | 1/2012 |
| WO | 2012/024517 A1 | 2/2012 |
| WO | 2013/033330 A2 | 3/2013 |
| WO | 2014/006510 A2 | 1/2014 |
| WO | 2015/028839 A1 | 3/2015 |
| WO | 2015/052145 A1 | 4/2015 |
| WO | 2017/017407 A1 | 2/2017 |
| WO | 2017/123145 A1 | 7/2017 |
| WO | 2017/144873 A1 | 8/2017 |
| WO | 2018/223939 A1 | 12/2018 |
| WO | 2018/223946 A1 | 12/2018 |

OTHER PUBLICATIONS

Notice of Allowance; U.S. Appl. No. 15/816,802; 5 pages (dated Jun. 4, 2020).
Final Office Action; U.S. Appl. No. 15/843,290; 11 pages (dated Apr. 23, 2020).
Final Office Action; U.S. Appl. No. 15/806,075; 11 pages (dated Jun. 19, 2020).
Notice of Allowance; U.S. Appl. No. 16/126,963; 8 pages (dated Dec. 31, 2020).
Non Final Rejection; U.S. Appl. No. 16/131,636; 20 pages (dated Feb. 23, 2021).
Final Rejection; U.S. Appl. No. 15/923,455; 32 pages (dated Feb. 25, 2021).
Notice of Allowance; U.S. Appl. No. 15/843,290; 7 pages (dated Jul. 31, 2020).
Non Final Office Action; U.S. Appl. No. 16/917,035; 13 pages (dated Aug. 3, 2020).
Non Final Office Action; U.S. Appl. No. 16/126,963; 15 pages (dated Jul. 28, 2020).
U.S. Appl. No. 16/126,963, filed Sep. 10, 2018; not yet published; 102 pages.
U.S. Appl. No. 16/225,749, filed Dec. 19, 2018; not yet published; 102 pages.
Non Final Office Action; U.S. Appl. No. 15/923,455; 20 pages (dated Oct. 29, 2020).
Notice of Allowance; U.S. Appl. No. 15/454,345; 9 pages (dated Jan. 15, 2020).
Non Final Office Action; U.S. Appl. No. 15/806,075; 9 pages (dated Dec. 11, 2019).
Non Final Office Action; U.S. Appl. No. 15/816,802; 22 pages dated Feb. 20, 2020.
Final Office Action; U.S. Appl. No. 15/456,398; 28 pages (dated Jul. 22, 2020).
Non Final Office Action U.S. Appl. No. 15/456,398; 21 pages (dated Jan. 21, 2020).
Notice of Allowance; U.S. Appl. No. 15/806,075; 10 pages (dated Oct. 5, 2020).
Non Final Office Action; U.S. Appl. No. 15/454,345; 17 pages (dated Jun. 12, 2019).
U.S. Appl. No. 16/360,144; not yet published; 85 pages (dated Mar. 21, 2019).
Cottee, Christopher et al; "Design of Matching Circuit Controllers for Radio-Frequency Healing"; IEEE Transactions on Control Systems Technology, vol. 11, No. 1; 10 pages (Jan. 2003).
Ameri, M. et al.; "Pattern Matching Algorithm for Identification of Load Mass of an Elastic Robot Arm"; American Control Conference; 2 pages (1988).
Doherty, Mark F. et al; "Automatic Detection of Mass-Resolved Ion Conics"; IEEE Transactions on Geoscience and Remote Sensing, vol. 31, No. 2; 10 pages (Mar. 1993).

* cited by examiner

| Contents of Cavity | L1/norm. | L2/norm. | L3/norm. | ASH/dB | Mass/g | Temperature/°C | RF Power/W | Time/min | ATime/sec |
|---|---|---|---|---|---|---|---|---|---|
| Empty | 1 | 3.3 | 3.3 | 0 | 0 | -20 | 0 | 0 | N/A |
| Ground beef | 1 | 3 | 3 | 14 | 200 | -20 | 150 | 11 | 5 |
| Ground beef | 1.3 | 2.7 | 2.7 | 11 | 500 | -20 | 250 | 12 | 12 |
| Ground beef | 1.3 | 2.4 | 2.4 | 8 | 1000 | -20 | 300 | 14 | 25 |
| Ground beef | 1.6 | 1.9 | 1.9 | 7 | 1500 | -20 | 300 | 15 | 37 |
| Ground beef | 2 | 1.6 | 1.6 | 5 | 2000 | -20 | 300 | 16 | 50 |

FIG. 16A

| Contents of Cavity | C1/norm. | C2/norm. | C3/norm. | ΔS11/dB | Mass/g | Temperature/°C | RF Power/W | Time/min | ΔTime/sec |
|---|---|---|---|---|---|---|---|---|---|
| Empty | 1 | 1 | 3 | 0 | 0 | -20 | 0 | 0 | NA |
| Ground beef | 1 | 1 | 2.6 | 14 | 200 | -20 | 150 | 11 | 5 |
| Ground beef | 1.5 | 1.5 | 2.2 | 11 | 500 | -20 | 250 | 12 | 12 |
| Ground beef | 2.5 | 2.5 | 1.8 | 8 | 1000 | -20 | 300 | 14 | 25 |
| Ground beef | 3.5 | 3.5 | 1.4 | 7 | 1500 | -20 | 300 | 15 | 27 |
| Ground beef | 4.7 | 4.7 | 1 | 5 | 2000 | -20 | 300 | 16 | 50 |

FIG. 16B

DEFROSTING APPARATUS WITH TWO-FACTOR MASS ESTIMATION AND METHODS OF OPERATION THEREOF

TECHNICAL FIELD

Embodiments of the subject matter described herein relate generally to apparatus and methods of defrosting a load using radio frequency (RF) energy.

BACKGROUND

Conventional capacitive food defrosting (or thawing) systems include large planar electrodes contained within a heating compartment. After a food load is placed between the electrodes and the electrodes are brought into close proximity with the food load, electromagnetic energy is supplied to the electrodes to provide gentle warming of the food load. As the food load thaws during the defrosting operation, the impedance of the food load changes. Accordingly, the power transfer to the food load also changes during the defrosting operation. The duration of the defrosting operation may be determined, for example, based on a timer, which may be used to control cessation of the operation. Some conventional food defrosting (or thawing) systems may require the use of physical weight sensors to determine the weight of a food load. Some conventional systems may forego weight detection entirely, instead depending entirely on user input for the characterization of a food load.

For conventional systems that include physical weight sensors, such sensors may add to the cost and complexity of manufacturing the system. Additionally, although acceptable defrosting results are possible using systems that rely on user input for determining load weight, inaccuracies inherent in relying on user-defined weight of a food load may result in premature cessation of the defrosting operation, or late cessation after the food load has begun to cook. What are needed are apparatus and methods for defrosting food loads (or other types of loads) that may result in efficient and even defrosting throughout the load and cessation of the defrosting operation when the load is at a desired temperature without necessarily requiring the use of physical weight sensors.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 16A is an example of a look-up-table (LUT) that may be used to determine parameters for a defrosting operation and estimate characteristics of a load based on the component values of a variable inductor network; and FIG. 16B is an example of a LUT that may be used to determine parameters for a defrosting operation and estimate characteristics of a load based on the component values of a variable capacitor network.

DETAILED DESCRIPTION

Figure 1:
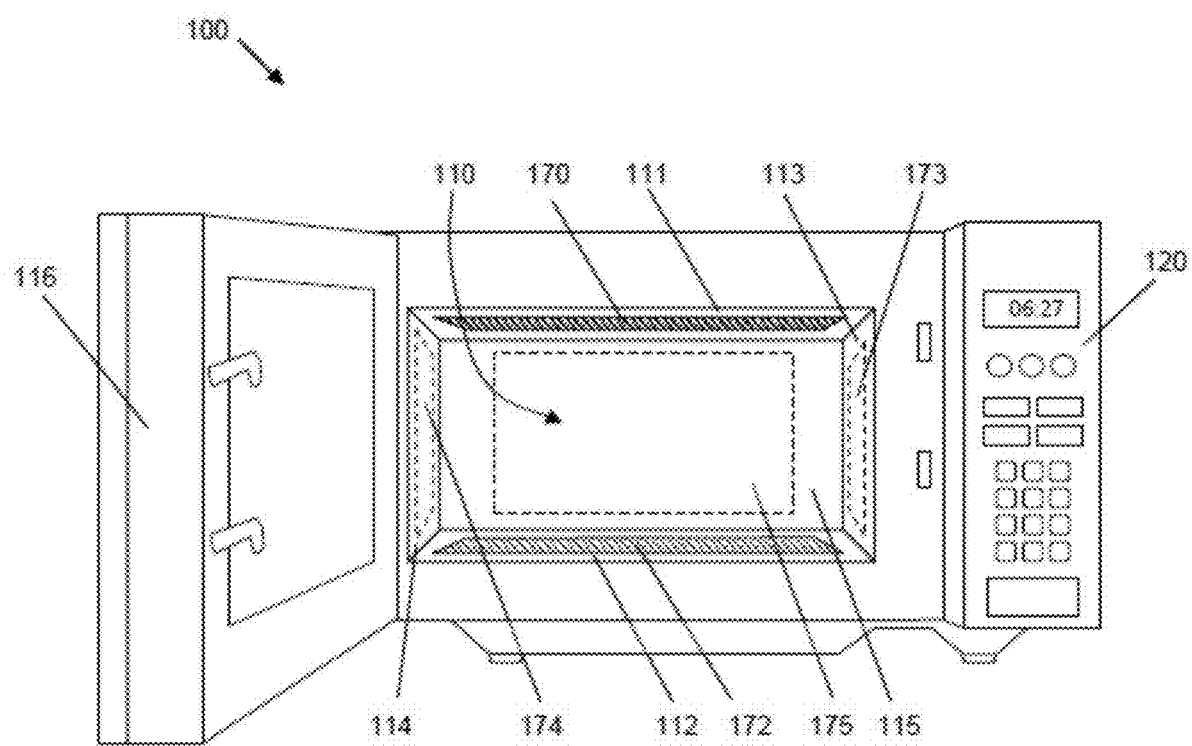
FIG. 1 is a perspective view of a defrosting appliance, in accordance with an example embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of the subject matter described herein relate to solid-state defrosting apparatus that may be incorporated into stand-alone appliances or into other systems. As described in greater detail below, embodiments of solid-state defrosting apparatus include both "unbalanced" defrosting apparatus and "balanced" apparatus. For example, exemplary "unbalanced" defrosting systems are realized using a first electrode disposed in a cavity, a single-ended amplifier arrangement (including one or more transistors), a single-ended impedance matching network coupled between an output of the amplifier arrangement and the first electrode, and a measurement and control system that can detect when a defrosting operation has completed. In contrast, exemplary "balanced" defrosting systems are realized using first and second electrodes disposed in a cavity, a single-ended or double-ended amplifier arrangement (including one or more transistors), a double-ended impedance matching network coupled between an output of the amplifier arrangement and the first and second electrodes, and a measurement and control system that can detect when a defrosting operation has completed. In various embodiments, the impedance matching network includes a variable impedance matching network that can be adjusted during the defrosting operation to improve matching between the amplifier arrangement and the cavity.

Generally, the term "defrosting" means to elevate the temperature of a frozen load (e.g., a food load or other type of load) to a temperature at which the load is no longer frozen (e.g., a temperature at or near 0 degrees Celsius). As used herein, the term "defrosting" more broadly means a process by which the thermal energy or temperature of a load (e.g., a food load or other type of load) is increased through provision of radio frequency (RF) power to the load. Accordingly, in various embodiments, a "defrosting operation" may be performed on a load with any initial temperature (e.g., any initial temperature above or below 0 degrees Celsius), and the defrosting operation may be ceased at any final temperature that is higher than the initial temperature (e.g., including final temperatures that are above or below 0 degrees Celsius). That said, the "defrosting operations" and "defrosting systems" described herein alternatively may be referred to as "thermal increase operations" and "thermal increase systems." The term "defrosting" should not be construed to limit application of the invention to methods or systems that are only capable of raising the temperature of a frozen load to a temperature at or near 0 degrees Celsius. In one embodiment, a defrosting operation may raise the temperature of a food item to a tempered state at or around −1 degrees Celsius.

The mass of a load, may be used as a basis for determining an amount of energy that is sufficient to warm the load to a desired temperature (e.g., −1 degrees Celsius). The energy required to defrost a load may be determined using Equation 1:

$$Q = m*c*\Delta T \qquad \text{(Equation 1)}$$

where Q is an amount of required heat energy, m is a mass of a load to which the heat energy is applied, c is the specific heat of the load, and $\Delta T$ is the change in temperature desired to be effected to the load by the application of the heat energy. The specific heat of various types of food tends to be around 1-2 calories/(gram° C.), where one calorie is approximately 4.1868 joules. The change in temperature applied to a load of a defrosting system is generally from around −20° C. (degrees Celsius) to around 0° C., such that $\Delta T$ may be estimated at around 20° C. Thus, the amount of heat energy (in calories) required to defrost a given load may be estimated as around 30 times the mass of the load (in grams). It should be noted that, in some embodiments, a value for $\Delta T$ may be determined based on an initial temperature input by a user, rather than being assumed to be 20° C.

It should be understood that, while the terms "mass" and "weight" may sometimes be used interchangeably herein, both terms are used to describe a measure of the quantity of matter that a given body (e.g., load) contains. An initial estimate of the mass of a load in a cavity of a defrosting system may be determined based on impedance matching conditions (e.g., variable component values, S11 parameter values, etc.) of the defrosting system after an initial best or acceptable impedance match has been established between an RF signal source (e.g., that provides RF energy for heating the load) and the cavity by the defrosting system. For example, the mass of the load may be estimated by comparing component values of variable components in a variable impedance matching network (upon establishing an initial match) to corresponding component values stored in a look-up table (LUT) that is stored within a memory that is accessible to a system controller, according to various embodiments. Alternatively, the mass of the load may be estimated by comparing a reflected power, a ratio of forward to reflected power (S11 parameter), or the voltage standing wave ratio (VSWR) at the RF signal source (upon establishing an initial match) to corresponding Si i parameter values or VSWR values stored in the LUT. The amount of energy sufficient to warm the load to a desired temperature (e.g., −1 degrees Celsius) may be used to determine RF signal parameters (e.g., RF signal power level) and heating time, as well as other applicable parameters. As described herein, the "RF signal power level" refers to the amplitude of the RF signal to be converted into electromagnetic energy that is applied to the load during a defrosting operation, and the RF signal power level may be varied throughout the operation. As described herein, "heating time" refers to the amount of time for which the electromagnetic energy corresponding to the RF signal is to be applied to the load during a defrosting operation. In this way, given the amount of energy sufficient to warm the load to the desired temperature, desired RF signal parameters (e.g., power level(s)) to be used throughout a defrosting operation may be determined by embodiments of the present system. Additionally, given the amount of energy sufficient to warm the load to the desired temperature and desired RF signal parameters, a total heating (defrosting) time may be determined by embodiments of the present system.

The initial temperature of a load, if unknown to the defrosting system, may be assumed by the system to be a predetermined value (e.g., −20° C.). However, this assumption may not always be accurate, which can affect the accuracy of mass estimation performed by the defrosting system based on the assumed temperature. In particular, a warmer load having a smaller mass may have similar impedance matching conditions to those of a colder load having a larger mass. However, as the load is heated by the defrosting system, the electrical impedance of the load (and, correspondingly, that of the cavity) changes. As a result, the variable impedance matching circuit of the defrosting system may be repeatedly reconfigured during defrosting operations to establish and re-establish an acceptable impedance match between the RF signal source and the cavity (plus load).

A load with a smaller mass may have a greater rate of change in electrical impedance when heated compared to that of load with a larger mass, independent of temperature. The S11 parameter value and the voltage standing wave ratio (VSWR) at the RF signal source are each generally indicative of the quality of the impedance match between the RF signal source and the cavity (plus load). The rate of change of either the S11 parameter or the VSWR as defrosting operations are performed is therefore indicative of the rate of change of the electrical impedance of the load. Thus, a more accurate estimate of the mass of a given load may be obtained by analyzing the rate of change of the S11 parameter or the VSWR at the RF signal source and comparing the S11 or VSWR rate of change to refine (i.e., update) the system's initial estimate of the mass of the load.

The S11 or VSWR rate of change may be determined by periodically measuring (e.g., by a system controller and power detection circuitry) the S11 parameter value or the VSWR value while defrosting operations are being performed following the establishment of an initial impedance match between the RF signal source and the cavity, then determining the slope of the S11 parameter or the VSWR as it changes over time with the changing impedance of the load.

The determined S11 rate of change or VSWR rate of change may then be compared to stored S11 or VSWR rates of change (sometimes referred to as stored parameter rates of change) and corresponding load masses that have been previously obtained through characterization of the defrosting system. For example, a LUT that is stored on a memory device of the defrosting system may include multiple entries, with each entry defining an S11 and/or a VSWR rate of change measured during a defrosting operation performed on a load, an RF power level supplied during the defrosting operation, and a corresponding load mass (e.g., verified during characterization of the defrosting system). After determining the S11 or VSWR rate of change of the defrosting system, the system controller may identify a corresponding entry of the LUT in order to determine the load mass associated with that entry. The system controller then refines the initial mass estimate to be the load mass of the identified LUT entry.

A refined defrost energy estimate (e.g., corresponding to the amount of RF energy estimated to be required to bring the load to a target completion temperature, such as a temperature of about −1° C.) may then be determined based on the refined mass estimate. Refined signal parameters (e.g., the amount of RF energy to be applied and/or the amount of time for which the RF energy is to be applied) may then be determined based on the refined defrost energy estimate. By refining the mass estimate of the load in this way, desired RF signal parameters, such as the amount of RF energy to apply to the cavity and the amount of time for which it should be applied, may be more accurately determined. Users may generally desire accuracy when being informed of the amount of time a defrosting operation is going to take. Additionally, accurate estimation of the amount of RF energy to be applied to a load may allow for more energy efficient operation of the defrosting system.

FIG. 1 is a perspective view of a defrosting system 100, in accordance with an example embodiment. Defrosting system 100 includes a defrosting cavity 110 (e.g., cavity 360, 760, 1174, FIGS. 3, 7, 11), a control panel 120, one or more RF signal sources (e.g., RF signal source 320, 720, 1120, FIGS. 3, 7, 11), a power supply (e.g., power supply 326, 726, FIGS. 3, 7), a first electrode 170 (e.g., electrode 340, 740, 1170, FIGS. 3, 7, 11), a second electrode 172 (e.g., electrode 750, 1172, FIGS. 7, 11), impedance matching circuitry (e.g., circuits 334, 370, 734, 772, 1160, FIGS. 3, 7, 11), power detection circuitry (e.g., power detection circuitry 330, 730, 730', 730", 1180, FIGS. 3, 7, 11), and a system controller (e.g., system controller 312, 712, 1130, FIGS. 3, 7, 11). The defrosting cavity 110 is defined by interior surfaces of top, bottom, side, and back cavity walls 111, 112, 113, 114, 115 and an interior surface of door 116. With door 116 closed, the defrosting cavity 110 defines an enclosed air cavity. As used herein, the term "air cavity" may mean an enclosed area that contains air or other gasses (e.g., defrosting cavity 110).

According to an "unbalanced" embodiment, the first electrode 170 is arranged proximate to a cavity wall (e.g., top wall 111), the first electrode 170 is electrically isolated from the remaining cavity walls (e.g., walls 112-115 and door 116), and the remaining cavity walls are grounded. In such a configuration, the system may be simplistically modeled as a capacitor, where the first electrode 170 functions as one conductive plate (or electrode), the grounded cavity walls (e.g., walls 112-115) function as a second conductive plate (or electrode), and the air cavity (including any load contained therein) function as a dielectric medium between the first and second conductive plates. Although not shown in FIG. 1, a non-electrically conductive barrier (e.g., barrier 362, 762, FIGS. 3, 7) also may be included in the system 100, and the non-conductive barrier may function to electrically and physically isolate the load from the bottom cavity wall 112. Although FIG. 1 shows the first electrode 170 being proximate to the top wall 111, the first electrode 170 alternatively may be proximate to any of the other walls 112-115, as indicated by electrodes 172-175.

According to a "balanced" embodiment, the first electrode 170 is arranged proximate to a first cavity wall (e.g., top wall 111), a second electrode 172 is arranged proximate to an opposite, second cavity wall (e.g., bottom wall 112), and the first and second electrodes 170, 172 are electrically isolated from the remaining cavity walls (e.g., walls 113-115 and door 116). In such a configuration, the system also may be simplistically modeled as a capacitor, where the first electrode 170 functions as one conductive plate (or electrode), the second electrode 172 functions as a second conductive plate (or electrode), and the air cavity (including any load contained therein) function as a dielectric medium between the first and second conductive plates. Although not shown in FIG. 1, a non-electrically conductive barrier (e.g., barrier 762, 1156, FIGS. 7, 11) also may be included in the system 100, and the non-conductive barrier may function to electrically and physically isolate the load from the second electrode 172 and the bottom cavity wall 112. Although FIG. 1 shows the first electrode 170 being proximate to the top wall 111, and the second electrode 172 being proximate to the bottom wall 112, the first and second electrodes 170, 172 alternatively may be proximate to other opposite walls (e.g., the first electrode may be electrode 173 proximate to wall 113, and the second electrode may be electrode 174 proximate to wall 114.

According to an embodiment, during operation of the defrosting system 100, a user (not illustrated) may place one or more loads (e.g., food and/or liquids) into the defrosting cavity 110, and optionally may provide inputs via the control panel 120 that specify characteristics of the load(s). For example, the specified characteristics may include an approximate mass of the load. In addition, the specified load characteristics may indicate the material(s) from which the load is formed (e.g., meat, bread, liquid). In alternate embodiments, the load characteristics may be obtained in some other way, such as by scanning a barcode on the load packaging or receiving a radio frequency identification (RFID) signal from an RFID tag on or embedded within the load. Either way, as will be described in more detail later, information regarding such load characteristics enables the system controller (e.g., system controller 312, 712, 1130, FIGS. 3, 7, 11) to establish an initial state for the impedance matching network of the system at the beginning of the defrosting operation, where the initial state may be relatively close to an optimal state that enables maximum RF power transfer into the load. Alternatively, load characteristics may not be entered or received prior to commencement of a defrosting operation, and the system controller may establish a default initial state for the impedance matching network.

To begin the defrosting operation, the user may provide an input via the control panel 120. In response, the system controller causes the RF signal source(s) (e.g., RF signal source 320, 720, 1120, FIGS. 3, 7, 11) to supply an RF signal to the first electrode 170 in an unbalanced embodiment, or to both the first and second electrodes 170, 172 in a balanced embodiment, and the electrode(s) responsively radiate electromagnetic energy into the defrosting cavity 110. The electromagnetic energy increases the thermal energy of the load (i.e., the electromagnetic energy causes the load to warm up).

During the defrosting operation, the impedance of the load (and thus the total input impedance of the cavity 110 plus load) changes as the thermal energy of the load increases. The impedance changes alter the absorption of RF energy into the load, and thus alter the magnitude of reflected power. According to an embodiment, power detection circuitry (e.g., power detection circuitry 330, 730, 1180, FIGS. 3, 7, 11) continuously or periodically measures the reflected power along a transmission path (e.g., transmission path 328, 728, 1148, FIGS. 3, 7, 11) between the RF signal source (e.g., RF signal source 320, 720, 1120, FIGS. 3, 7, 11) and the electrode(s) 170, 172. Based on these measurements, the system controller (e.g., system controller 312, 712, 1130, FIGS. 3, 7, 11) may detect completion of the defrosting operation, as will be described in detail below. According to a further embodiment, the impedance matching network is variable, and based on the reflected power measurements (or both the forward and reflected power measurements), the system controller may alter the state of the impedance matching network during the defrosting operation to increase the absorption of RF power by the load.

Figure 2:
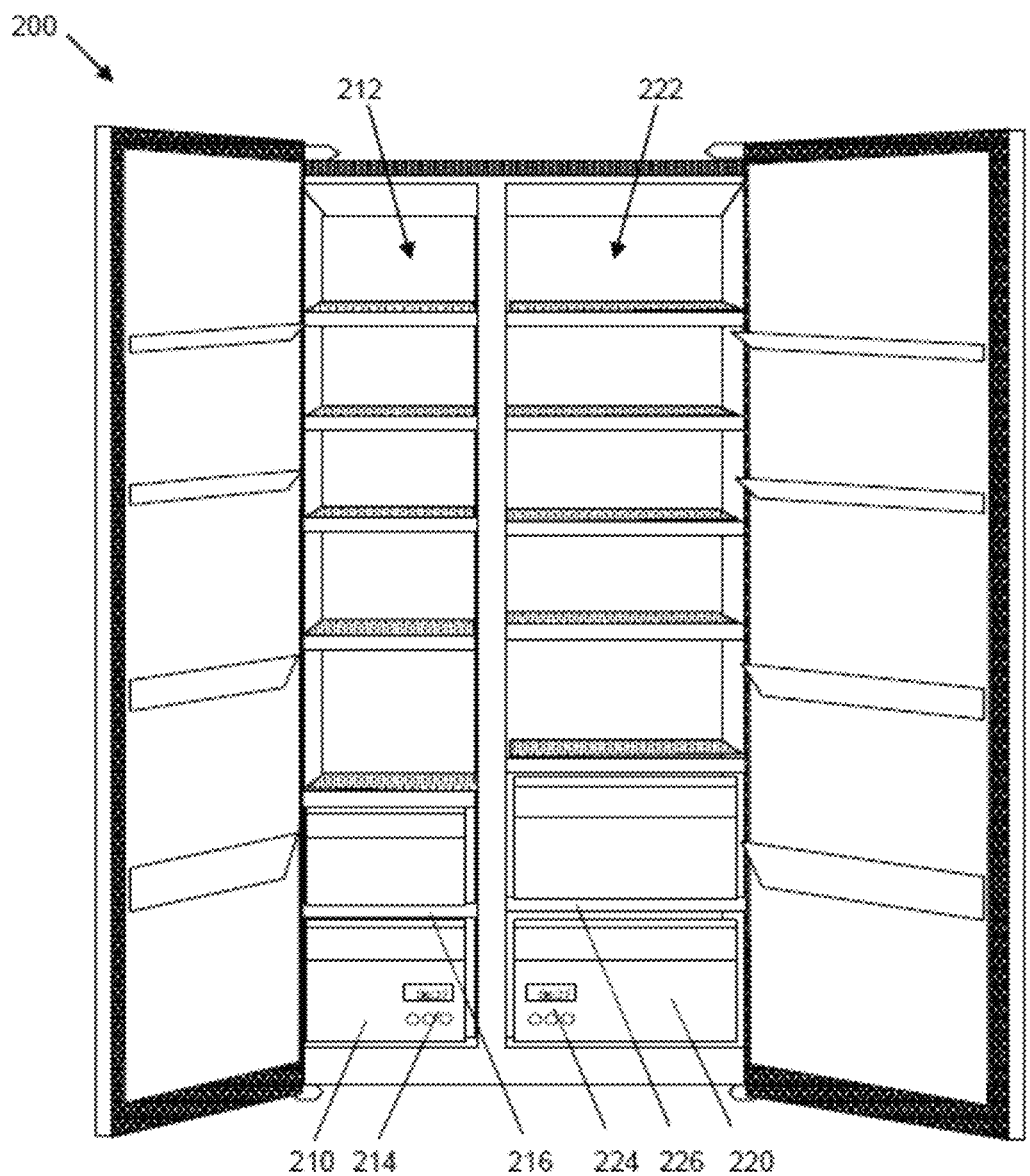
FIG. 2 is a perspective view of a refrigerator/freezer appliance that includes other example embodiments of defrosting systems.

The defrosting system 100 of FIG. 1 is embodied as a counter-top type of appliance. In a further embodiment, the defrosting system 100 also may include components and functionality for performing microwave cooking operations. Alternatively, components of a defrosting system may be incorporated into other types of systems or appliances. For example, FIG. 2 is a perspective view of a refrigerator/freezer appliance 200 that includes other example embodiments of defrosting systems 210, 220. More specifically, defrosting system 210 is shown to be incorporated within a freezer compartment 212 of the system 200, and defrosting system 220 is shown to be incorporated within a refrigerator compartment 222 of the system. An actual refrigerator/freezer appliance likely would include only one of the defrosting systems 210, 220, but both are shown in FIG. 2 to concisely convey both embodiments.

Figure 3:
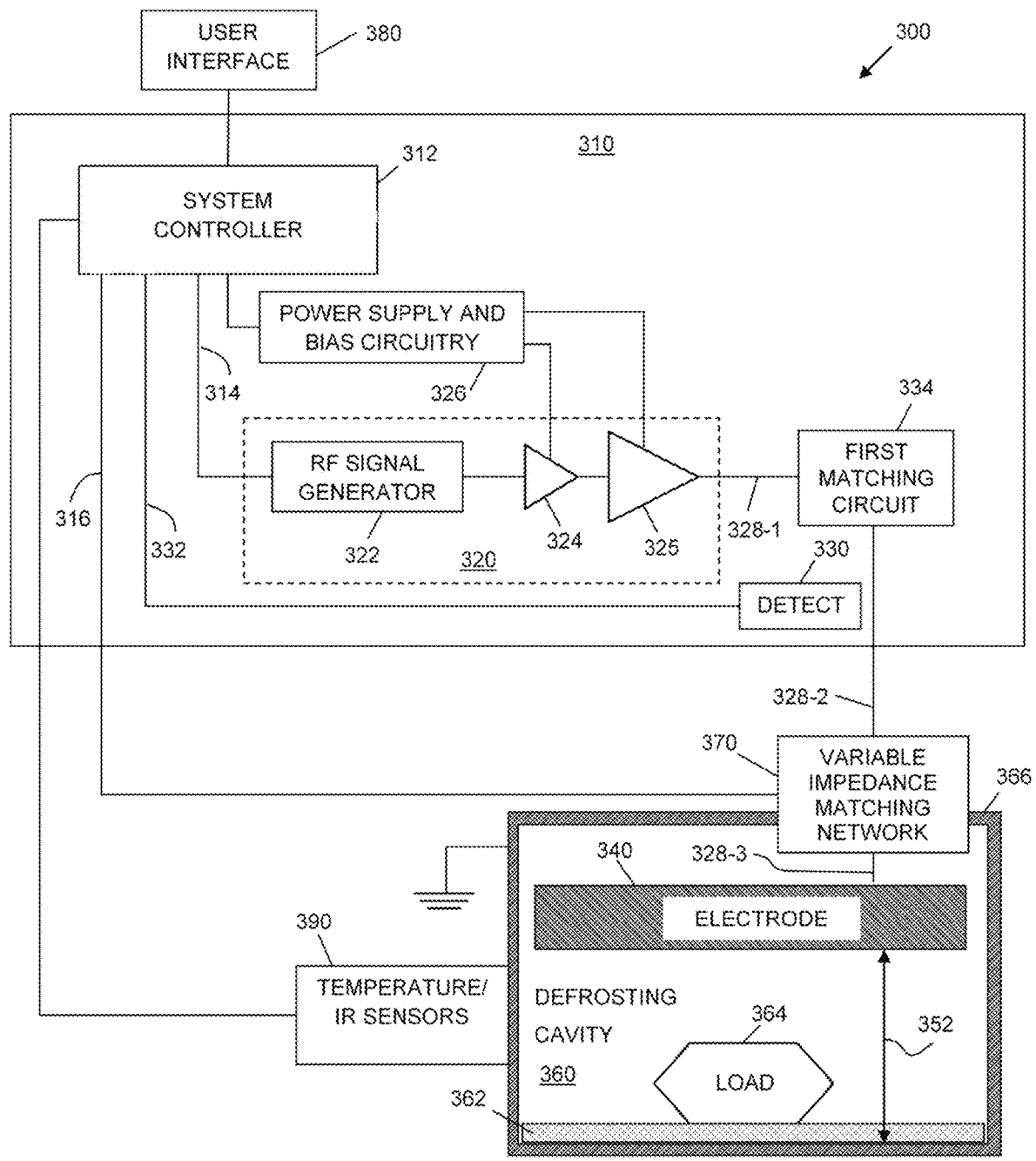
FIG. 3 is a simplified block diagram of an unbalanced defrosting apparatus, in accordance with an example embodiment.
Figure 7:
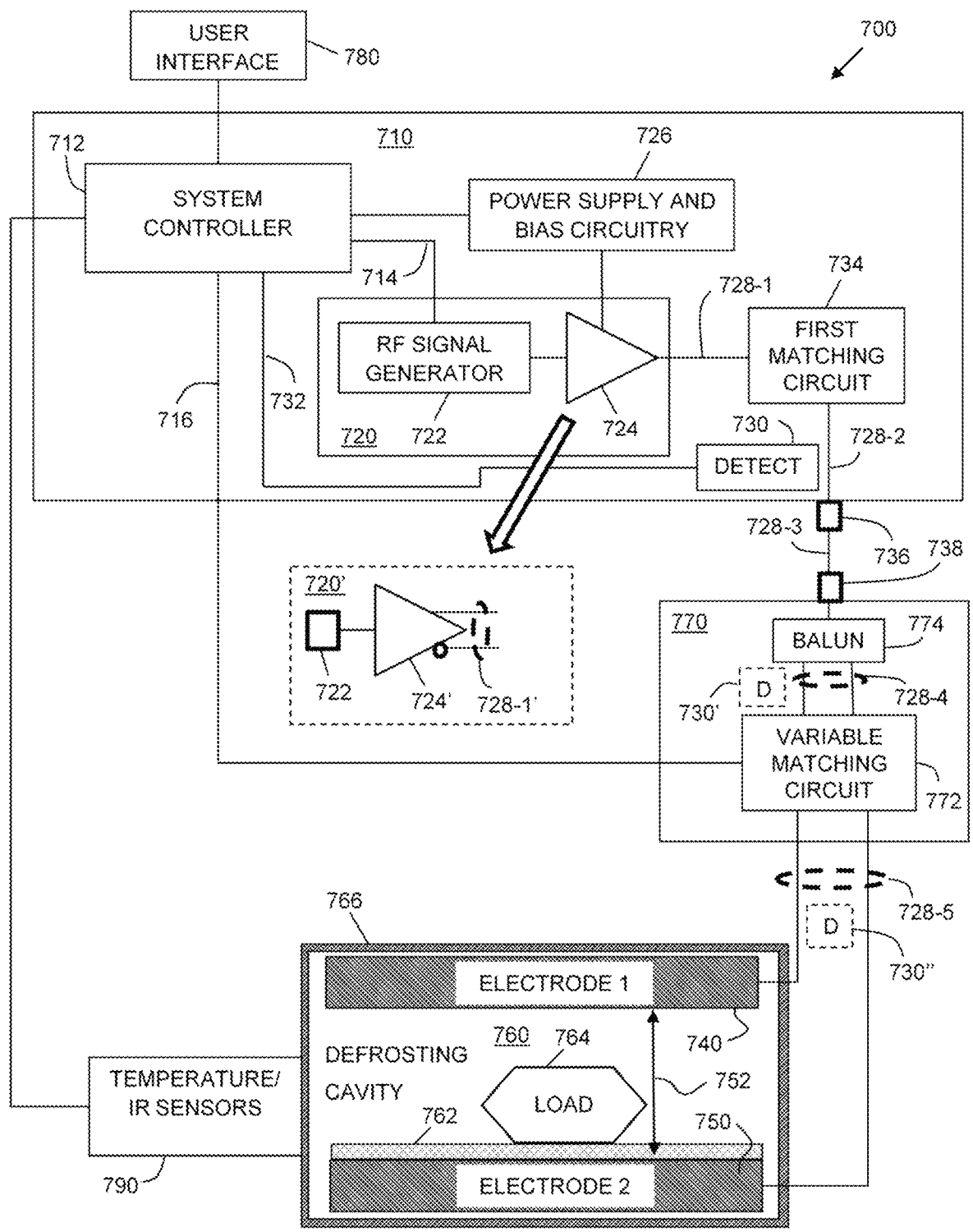
FIG. 7 is a simplified block diagram of a balanced defrosting apparatus, in accordance with another example embodiment.
Figure 11:
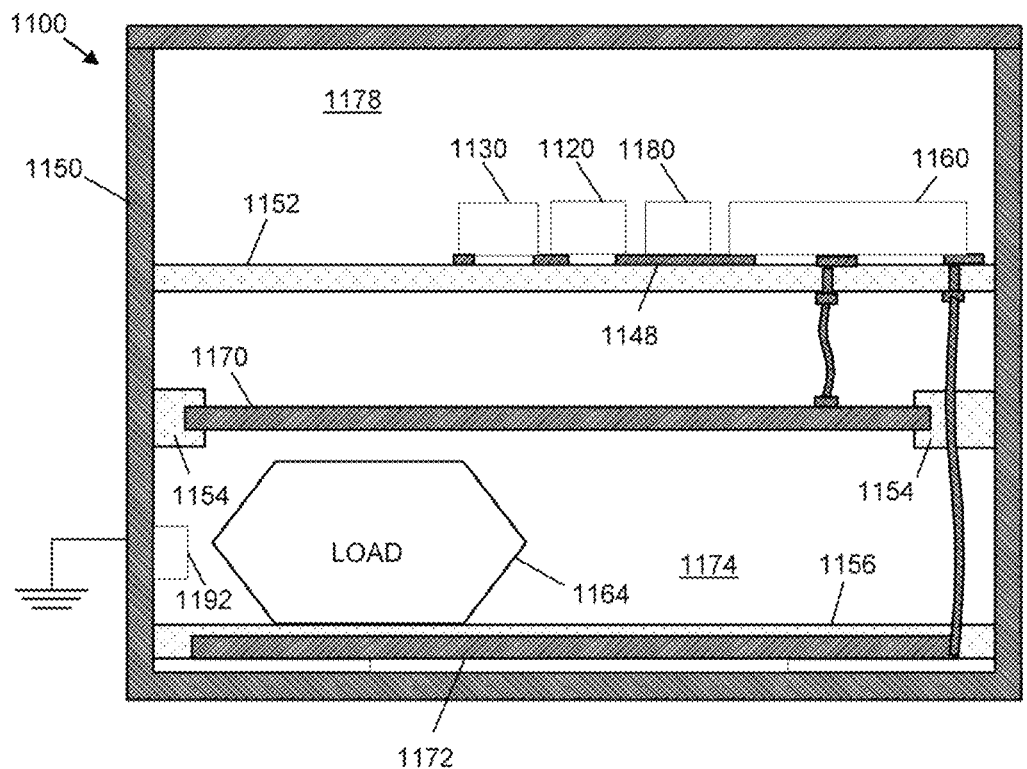
FIG. 11 is a cross-sectional, side view of a defrosting system, in accordance with an example embodiment.

Similar to the defrosting system 100, each of defrosting systems 210, 220 includes a defrosting cavity, a control panel 214, 224, one or more RF signal sources (e.g., RF signal source 320, 720, 1120, FIGS. 3, 7, 11), a power supply (e.g., power supply 326, 726, FIGS. 3, 7), a first electrode (e.g., electrode 340, 740, 1170, FIGS. 3, 7), a second electrode 172 (e.g., containment structure 366, electrode 750, FIGS. 3, 7, 11), impedance matching circuitry (e.g., circuits 334, 370, 734, 772, 1160, FIGS. 3, 7, 11), power detection circuitry (e.g., power detection circuitry 330, 730, 1180, FIGS. 3, 7, 11), and a system controller (e.g., system controller 312, 712, 1130, FIGS. 3, 7, 11). For example, the defrosting cavity may be defined by interior surfaces of bottom, side, front, and back walls of a drawer, and an interior top surface of a fixed shelf 216, 226 under which the drawer slides. With the drawer slid fully under the shelf, the drawer and shelf define the cavity as an enclosed air cavity. The components and functionalities of the defrosting systems 210, 220 may be substantially the same as the components and functionalities of defrosting system 100, in various embodiments.

In addition, according to an embodiment, each of the defrosting systems 210, 220 may have sufficient thermal communication with the freezer or refrigerator compartment 212, 222, respectively, in which the system 210, 220 is disposed. In such an embodiment, after completion of a defrosting operation, the load may be maintained at a safe temperature (i.e., a temperature at which food spoilage is retarded) until the load is removed from the system 210, 220. More specifically, upon completion of a defrosting operation by the freezer-based defrosting system 210, the cavity within which the defrosted load is contained may thermally communicate with the freezer compartment 212, and if the load is not promptly removed from the cavity, the load may re-freeze. Similarly, upon completion of a defrosting operation by the refrigerator-based defrosting system 220, the cavity within which the defrosted load is contained may thermally communicate with the refrigerator compartment 222, and if the load is not promptly removed from the cavity, the load may be maintained in a defrosted state at the temperature within the refrigerator compartment 222.

Those of skill in the art would understand, based on the description herein, that embodiments of defrosting systems may be incorporated into systems or appliances having other configurations, as well. Accordingly, the above-described implementations of defrosting systems in a stand-alone appliance, a microwave oven appliance, a freezer, and a refrigerator are not meant to limit use of the embodiments only to those types of systems.

Although defrosting systems 100, 200 are shown with their components in particular relative orientations with respect to one another, it should be understood that the various components may be oriented differently, as well. In addition, the physical configurations of the various components may be different. For example, control panels 120, 214, 224 may have more, fewer, or different user interface elements, and/or the user interface elements may be differently arranged. In addition, although a substantially cubic defrosting cavity 110 is illustrated in FIG. 1, it should be understood that a defrosting cavity may have a different shape, in other embodiments (e.g., cylindrical, and so on). Further, defrosting systems 100, 210, 220 may include additional components (e.g., a fan, a stationary or rotating plate, a tray, an electrical cord, and so on) that are not specifically depicted in FIGS. 1, 2.

FIG. 3 is a simplified block diagram of an unbalanced defrosting system 300 (e.g., defrosting system 100, 210, 220, FIGS. 1, 2), in accordance with an example embodiment. Defrosting system 300 includes RF subsystem 310, defrosting cavity 360, user interface 380, system controller 312, RF signal source 320, power supply and bias circuitry 326, variable impedance matching network 370, electrode 340, containment structure 366, and power detection circuitry 330, in an embodiment. In addition, in other embodiments, defrosting system 300 may include temperature sensor(s), and/or infrared (IR) sensor(s) 390, although some or all of these sensor components may be excluded. It should be understood that FIG. 3 is a simplified representation of a defrosting system 300 for purposes of explanation and ease of description, and that practical embodiments may include other devices and components to provide additional functions and features, and/or the defrosting system 300 may be part of a larger electrical system.

User interface 380 may correspond to a control panel (e.g., control panel 120, 214, 224, FIGS. 1, 2), for example, which enables a user to provide inputs to the system regarding parameters for a defrosting operation (e.g., characteristics of the load to be defrosted, and so on), start and cancel buttons, mechanical controls (e.g., a door/drawer open latch), and so on. In addition, the user interface may be configured to provide user-perceptible outputs indicating the status of a defrosting operation (e.g., a countdown timer, visible indicia indicating progress or completion of the defrosting operation, and/or audible tones indicating completion of the defrosting operation) and other information.

Some embodiments of defrosting system 300 may include temperature sensor(s), and/or IR sensor(s) 390. The temperature sensor(s) and/or IR sensor(s) may be positioned in locations that enable the temperature of the load 364 to be sensed during the defrosting operation. When provided to the system controller 312, the temperature information enables the system controller 312 to alter the power of the RF signal supplied by the RF signal source 320 (e.g., by controlling the bias and/or supply voltages provided by the power supply and bias circuitry 326), to adjust the state of the variable impedance matching network 370, and/or to determine when the defrosting operation should be terminated. The system controller 312 may use this information, for example, to determine a desired power level for the RF signal supplied by the RF signal source 320, to determine an initial setting for the variable impedance matching network 370, and/or to determine an approximate duration for the defrosting operation.

The RF subsystem 310 includes a system controller 312, an RF signal source 320, first impedance matching circuit 334 (herein "first matching circuit"), power supply and bias circuitry 326, and power detection circuitry 330, in an embodiment. System controller 312 may include one or more general purpose or special purpose processors (e.g., a microprocessor, microcontroller, Application Specific Integrated Circuit (ASIC), and so on), volatile and/or non-volatile memory (e.g., Random Access Memory (RAM), Read Only Memory (ROM), flash, various registers, and so on), one or more communication busses, and other components. According to an embodiment, system controller 312 is coupled to user interface 380, RF signal source 320, variable impedance matching network 370, power detection circuitry 330, and sensors 390 (if included). System controller 312 is configured to receive signals indicating user inputs received via user interface 380, and to receive signals indicating RF signal reflected power (and possibly RF signal forward power) from power detection circuitry 330. Responsive to the received signals and measurements, and as will be described in more detail later, system controller 312 provides control signals to the power supply and bias circuitry 326 and to the RF signal generator 322 of the RF signal source 320. In addition, system controller 312 provides control signals to the variable impedance matching network 370, which cause the network 370 to change its state or configuration.

Defrosting cavity 360 includes a capacitive defrosting arrangement with first and second parallel plate electrodes that are separated by an air cavity within which a load 364 to be defrosted may be placed. For example, a first electrode 340 may be positioned above the air cavity, and a second electrode may be provided by a portion of a containment structure 366. More specifically, the containment structure 366 may include bottom, top, and side walls, the interior surfaces of which define the cavity 360 (e.g., cavity 110, FIG. 1). According to an embodiment, the cavity 360 may be sealed (e.g., with a door 116, FIG. 1 or by sliding a drawer closed under a shelf 216, 226, FIG. 2) to contain the electromagnetic energy that is introduced into the cavity 360 during a defrosting operation. The system 300 may include one or more interlock mechanisms that ensure that the seal is intact during a defrosting operation. If one or more of the interlock mechanisms indicates that the seal is breached, the system controller 312 may cease the defrosting operation. According to an embodiment, the containment structure 366 is at least partially formed from conductive material, and the conductive portion(s) of the containment structure may be grounded. Alternatively, at least the portion of the containment structure 366 that corresponds to the bottom surface of the cavity 360 may be formed from conductive material and grounded. Either way, the containment structure 366 (or at least the portion of the containment structure 366 that is parallel with the first electrode 340) functions as a second electrode of the capacitive defrosting arrangement. To avoid direct contact between the load 364 and the grounded bottom surface of the cavity 360, a non-conductive barrier 362 may be positioned over the bottom surface of the cavity 360.

Essentially, defrosting cavity 360 includes a capacitive defrosting arrangement with first and second parallel plate electrodes 340, 366 that are separated by an air cavity within which a load 364 to be defrosted may be placed. The first electrode 340 is positioned within containment structure 366 to define a distance 352 between the electrode 340 and an opposed surface of the containment structure 366 (e.g., the bottom surface, which functions as a second electrode), where the distance 352 renders the cavity 360 a sub-resonant cavity, in an embodiment.

In various embodiments, the distance 352 is in a range of about 0.10 meters to about 1.0 meter, although the distance may be smaller or larger, as well. According to an embodiment, distance 352 is less than one wavelength of the RF signal produced by the RF subsystem 310. In other words, as mentioned above, the cavity 360 is a sub-resonant cavity. In some embodiments, the distance 352 is less than about half of one wavelength of the RF signal. In other embodiments, the distance 352 is less than about one quarter of one wavelength of the RF signal. In still other embodiments, the distance 352 is less than about one eighth of one wavelength of the RF signal. In still other embodiments, the distance 352 is less than about one 50th of one wavelength of the RF signal. In still other embodiments, the distance 352 is less than about one 100th of one wavelength of the RF signal.

In general, a system 300 designed for lower operational frequencies (e.g., frequencies between 10 megahertz (MHz) and 100 MHz) may be designed to have a distance 352 that is a smaller fraction of one wavelength. For example, when system 300 is designed to produce an RF signal with an operational frequency of about 10 MHz (corresponding to a wavelength of about 30 meters), and distance 352 is selected to be about 0.5 meters, the distance 352 is about one 60th of one wavelength of the RF signal. Conversely, when system 300 is designed for a higher operational frequency of about 300 MHz (corresponding to a wavelength of about 1 meter), and distance 352 is selected to be about 0.5 meters, the distance 352 is about one half of one wavelength of the RF signal.

With the operational frequency and the distance 352 between electrode 340 and containment structure 366 being selected to define a sub-resonant interior cavity 360, the first electrode 340 and the containment structure 366 are capacitively coupled. More specifically, the first electrode 340 may be analogized to a first plate of a capacitor, the containment structure 366 may be analogized to a second plate of a capacitor, and the load 364, barrier 362, and air within the cavity 360 may be analogized to a capacitor dielectric. Accordingly, the first electrode 340 alternatively may be referred to herein as an "anode," and the containment structure 366 may alternatively be referred to herein as a "cathode."

Essentially, the voltage across the first electrode 340 and the containment structure 366 heats the load 364 within the cavity 360. According to various embodiments, the RF subsystem 310 is configured to generate the RF signal to produce voltages between the electrode 340 and the containment structure 366 in a range of about 90 volts to about 3,000 volts, in one embodiment, or in a range of about 3000 volts to about 10,000 volts, in another embodiment, although the system may be configured to produce lower or higher voltages between the electrode 340 and the containment structure 366, as well.

The first electrode 340 is electrically coupled to the RF signal source 320 through a first matching circuit 334, a variable impedance matching network 370, and a conductive transmission path, in an embodiment. The first matching circuit 334 is configured to perform an impedance transformation from an impedance of the RF signal source 320 (e.g., less than about 10 ohms) to an intermediate impedance (e.g., 50 ohms, 75 ohms, or some other value). According to an embodiment, the conductive transmission path includes a plurality of conductors 328-1, 328-2, and 328-3 connected in series, and referred to collectively as transmission path 328. According to an embodiment, the conductive transmission path 328 is an "unbalanced" path, which is configured to carry an unbalanced RF signal (i.e., a single RF signal referenced against ground). In some embodiments, one or more connectors (not shown, but each having male and female connector portions) may be electrically coupled along the transmission path 328, and the portion of the transmission path 328 between the connectors may comprise a coaxial cable or other suitable connector. Such a connection is shown in FIG. 7 and described later (e.g., including connectors 736, 738 and a conductor 728-3 such as a coaxial cable between the connectors 736, 738).

As will be described in more detail later, the variable impedance matching circuit 370 is configured to perform an impedance transformation from the above-mentioned intermediate impedance to an input impedance of defrosting cavity 320 as modified by the load 364 (e.g., on the order of hundreds or thousands of ohms, such as about 1000 ohms to about 4000 ohms or more). In an embodiment, the variable impedance matching network 370 includes a network of passive components (e.g., inductors, capacitors, resistors).

According to one more specific embodiment, the variable impedance matching network 370 includes a plurality of fixed-value lumped inductors (e.g., inductors 412-414, FIG. 4A) that are positioned within the cavity 360 and which are electrically coupled to the first electrode 340. In addition, the variable impedance matching network 370 includes a plurality of variable inductance networks (e.g., networks 410, 411, 500, FIGS. 4A, 5A), which may be located inside or outside of the cavity 360. According to another more specific embodiment, the variable impedance matching network 370 includes a plurality of variable capacitance networks (e.g., networks 442, 446, 540, FIG. 4B, 5B), which may be located inside or outside of the cavity 360. The inductance or capacitance value provided by each of the variable inductance or capacitance networks is established using control signals from the system controller 312, as will be described in more detail later. In any event, by changing the state of the variable impedance matching network 370 over the course of a defrosting operation to dynamically match the ever-changing cavity plus load impedance, the amount of RF power that is absorbed by the load 364 may be maintained at a high level despite variations in the load impedance during the defrosting operation.

According to an embodiment, RF signal source 320 includes an RF signal generator 322 and a power amplifier (e.g., including one or more power amplifier stages 324, 325). In response to control signals provided by system controller 312 over connection 314, RF signal generator 322 is configured to produce an oscillating electrical signal having a frequency in the ISM (industrial, scientific, and medical) band, although the system could be modified to support operations in other frequency bands, as well. The RF signal generator 322 may be controlled to produce oscillating signals of different power levels and/or different frequencies, in various embodiments. For example, the RF signal generator 322 may produce a signal that oscillates in a VHF (very high frequency) range (e.g., about 30 MHz to about 300 MHz), a signal that oscillates in a frequency range of about 10.0 MHz to about 100 MHz, and/or a signal that oscillates in a frequency range of about 100 MHz to about 3.0 gigahertz (GHz). Some desirable frequencies may be, for example, 13.56 MHz (+/−5 percent), 27.125 MHz (+/−5 percent), 40.68 MHz (+/−5 percent), and 2.45 GHz (+/−5 percent). In one particular embodiment, for example, the RF signal generator 322 may produce a signal that oscillates in a range of about 40.66 MHz to about 40.70 MHz and at a power level in a range of about 10 decibel-milliwatts (dBm) to about 15 dBm. Alternatively, the frequency of oscillation and/or the power level may be lower or higher.

In the embodiment of FIG. 3, the power amplifier includes a driver amplifier stage 324 and a final amplifier stage 325. The power amplifier is configured to receive the oscillating signal from the RF signal generator 322, and to amplify the signal to produce a significantly higher-power signal at an output of the power amplifier. For example, the output signal may have a power level in a range of about 100 watts to about 400 watts or more. The gain applied by the power amplifier may be controlled using gate bias voltages and/or drain supply voltages provided by the power supply and bias circuitry 326 to each amplifier stage 324, 325. More specifically, power supply and bias circuitry 326 provides bias and supply voltages to each RF amplifier stage 324, 325 in accordance with control signals received from system controller 312.

In an embodiment, each amplifier stage 324, 325 is implemented as a power transistor, such as a field effect transistor (FET), having an input terminal (e.g., a gate or control terminal) and two current carrying terminals (e.g., source and drain terminals). Impedance matching circuits (not illustrated) may be coupled to the input (e.g., gate) of the driver amplifier stage 324, between the driver and final amplifier stages 325, and/or to the output (e.g., drain terminal) of the final amplifier stage 325, in various embodiments. In an embodiment, each transistor of the amplifier stages 324, 325 includes a laterally diffused metal oxide semiconductor FET (LDMOSFET) transistor. However, it should be noted that the transistors are not intended to be limited to any particular semiconductor technology, and in other embodiments, each transistor may be realized as a gallium nitride (GaN) transistor, another type of MOSFET transistor, a bipolar junction transistor (BJT), or a transistor utilizing another semiconductor technology.

In FIG. 3, the power amplifier arrangement is depicted to include two amplifier stages 324, 325 coupled in a particular manner to other circuit components. In other embodiments, the power amplifier arrangement may include other amplifier topologies and/or the amplifier arrangement may include only one amplifier stage (e.g., as shown in the embodiment of amplifier 724, FIG. 7), or more than two amplifier stages. For example, the power amplifier arrangement may include various embodiments of a single-ended amplifier, a Doherty amplifier, a Switch Mode Power Amplifier (SMPA), or another type of amplifier.

Defrosting cavity 360 and any load 364 (e.g., food, liquids, and so on) positioned in the defrosting cavity 360 present a cumulative load for the electromagnetic energy (or RF power) that is radiated into the cavity 360 by the first electrode 340. More specifically, the cavity 360 and the load 364 present an impedance to the system, referred to herein as a "cavity plus load impedance." The cavity plus load impedance changes during a defrosting operation as the temperature of the load 364 increases. The cavity plus load impedance has a direct effect on the magnitude of reflected signal power along the conductive transmission path 328 between the RF signal source 320 and electrodes 340. In most cases, it is desirable to maximize the magnitude of transferred signal power into the cavity 360, and/or to minimize the reflected-to-forward signal power ratio along the conductive transmission path 328.

In order to at least partially match the output impedance of the RF signal generator 320 to the cavity plus load impedance, a first matching circuit 334 is electrically coupled along the transmission path 328, in an embodiment. The first matching circuit 334 may have any of a variety of configurations. According to an embodiment, the first matching circuit 334 includes fixed components (i.e., components with non-variable component values), although the first matching circuit 334 may include one or more variable components, in other embodiments. For example, the first matching circuit 334 may include any one or more circuits selected from an inductance/capacitance (LC) network, a series inductance network, a shunt inductance network, or a combination of bandpass, high-pass and low-pass circuits, in various embodiments. Essentially, the fixed matching circuit 334 is configured to raise the impedance to an intermediate level between the output impedance of the RF signal generator 320 and the cavity plus load impedance.

Figure 15:
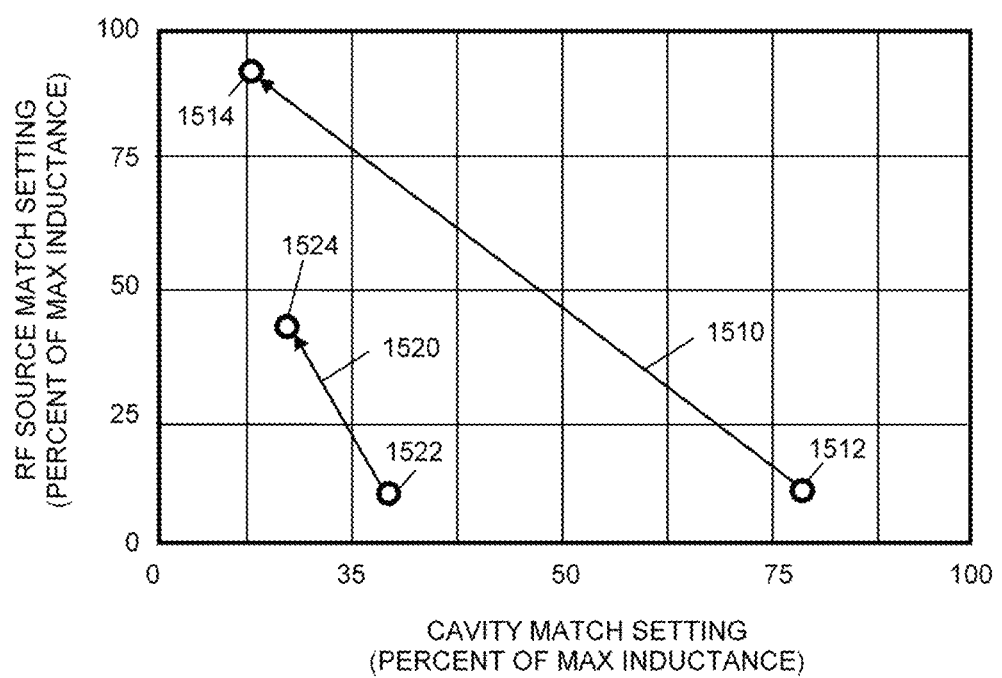
FIG. 15 is a chart plotting cavity match setting versus RF signal source match setting through a defrost operation for two different loads.

As will be described in conjunction with FIG. 15 later, the impedance of many types of food loads changes with respect to temperature in a somewhat predictable manner as the food load transitions from a frozen state to a defrosted state. According to an embodiment, based on reflected power measurements (and forward power measurements, in some embodiments) from the power detection circuitry 330, the system controller 312 is configured to identify a point in time during a defrosting operation when the rate of change of cavity plus load impedance indicates that the load 364 is approaching 0° Celsius, at which time the system controller 312 may terminate the defrosting operation.

According to an embodiment, power detection circuitry 330 is coupled along the transmission path 328 between the output of the RF signal source 320 and the electrode 340. In a specific embodiment, the power detection circuitry 330 forms a portion of the RF subsystem 310, and is coupled to the conductor 328-2 between the output of the first matching circuit 334 and the input to the variable impedance matching network 370, in an embodiment. In alternate embodiments, the power detection circuitry 330 may be coupled to the portion 328-1 of the transmission path 328 between the output of the RF signal source 320 and the input to the first matching circuit 334, or to the portion 328-3 of the transmission path 328 between the output of the variable impedance matching network 370 and the first electrode 340.

Wherever it is coupled, power detection circuitry 330 is configured to monitor, measure, or otherwise detect the power of the reflected signals traveling along the transmission path 328 between the RF signal source 320 and electrode 340 (i.e., reflected RF signals traveling in a direction from electrode 340 toward RF signal source 320). In some embodiments, power detection circuitry 330 also is configured to detect the power of the forward signals traveling along the transmission path 328 between the RF signal source 320 and the electrode 340 (i.e., forward RF signals traveling in a direction from RF signal source 320 toward electrode 340). Over connection 332, power detection circuitry 330 supplies signals to system controller 312 conveying the magnitudes of the reflected signal power (and the forward signal power, in some embodiments) to system controller 312. In embodiments in which both the forward and reflected signal power magnitudes are conveyed, system controller 312 may calculate a reflected-to-forward signal power ratio, or the S11 parameter. In some embodiments the system controller 312 may also calculate the VSWR of the system based on the forward and reflected signal power magnitudes. As will be described in more detail below, when the reflected signal power magnitude exceeds a reflected signal power threshold, or when the reflected-to-forward signal power ratio exceeds an S11 parameter threshold, or when the VSWR exceeds a threshold, this indicates that the system 300 is not adequately matched to the cavity plus load impedance, and that energy absorption by the load 364 within the cavity 360 may be sub-optimal. In such a situation, system controller 312 orchestrates a process of altering the state of the variable matching network 370 to drive the reflected signal power, the S11 parameter, and/or the VSWR toward or below a desired level (e.g., below the reflected signal power threshold, and/or the reflected-to-forward signal power ratio threshold, and/or the VSWR threshold), thus re-establishing an acceptable match and facilitating more optimal energy absorption by the load 364.

More specifically, the system controller 312 may provide control signals over control path 316 to the variable matching circuit 370, which cause the variable matching circuit 370 to vary inductive, capacitive, and/or resistive values of one or more components within the circuit, thus adjusting the impedance transformation provided by the circuit 370. Adjustment of the configuration of the variable matching circuit 370 desirably decreases the magnitude of reflected signal power, which corresponds to decreasing the magnitude of the S11 parameter or decreasing the magnitude of the VSWR, and increasing the power absorbed by the load 364.

As discussed above, the variable impedance matching network 370 is used to match the input impedance of the defrosting cavity 360 plus load 364 to maximize, to the extent possible, the RF power transfer into the load 364. The initial impedance of the defrosting cavity 360 and the load 364 may not be known with accuracy at the beginning of a defrosting operation. Further, the impedance of the load 364 changes during a defrosting operation as the load 364 warms up. According to an embodiment, the system controller 312 may provide control signals to the variable impedance matching network 370, which cause modifications to the state of the variable impedance matching network 370. This enables the system controller 312 to establish an initial state of the variable impedance matching network 370 at the beginning of the defrosting operation that has a relatively low reflected to forward power ratio, and thus a relatively high absorption of the RF power by the load 364. In addition, this enables the system controller 312 to modify the state of the variable impedance matching network 370 so that an adequate match may be maintained throughout the defrosting operation, despite changes in the impedance of the load 364.

Non-limiting examples of configurations for the variable matching network 370 are shown in FIGS. 4A, 4B, 5A, and 5B. For example, the network 370 may include any one or more circuits selected from an inductance/capacitance (LC) network, an inductance-only network, a capacitance-only network, or a combination of bandpass, high-pass and low-pass circuits, in various embodiments. In an embodiment, the variable matching network 370 includes a single-ended network (e.g., network 400, 440, FIG. 4A, 4B). The inductance, capacitance, and/or resistance values provided by the variable matching network 370, which in turn affect the impedance transformation provided by the network 370, are established using control signals from the system controller 312, as will be described in more detail later. In any event, by changing the state of the variable matching network 370 over the course of a defrosting operation to dynamically match the ever-changing impedance of the cavity 360 plus the load 364 within the cavity 360, the system efficiency may be maintained at a high level throughout the defrosting operation.

The variable matching network 370 may have any of a wide variety of circuit configurations, and non-limiting examples of such configurations are shown in FIGS. 4A, 4B, 5A, and 5B. According to an embodiment, as exemplified in FIGS. 4A and 5A, the variable impedance matching network 370 may include a single-ended network of passive components, and more specifically a network of fixed-value inductors (e.g., lumped inductive components) and variable inductors (or variable inductance networks). According to another embodiment, as exemplified in FIGS. 4B and 5B, the variable impedance matching network 370 may include a single-ended network of passive components, and more specifically a network of variable capacitors (or variable capacitance networks). As used herein, the term "inductor" means a discrete inductor or a set of inductive components that are electrically coupled together without intervening components of other types (e.g., resistors or capacitors). Similarly, the term "capacitor" means a discrete capacitor or a set of capacitive components that are electrically coupled together without intervening components of other types (e.g., resistors or inductors).

Figure 4A:
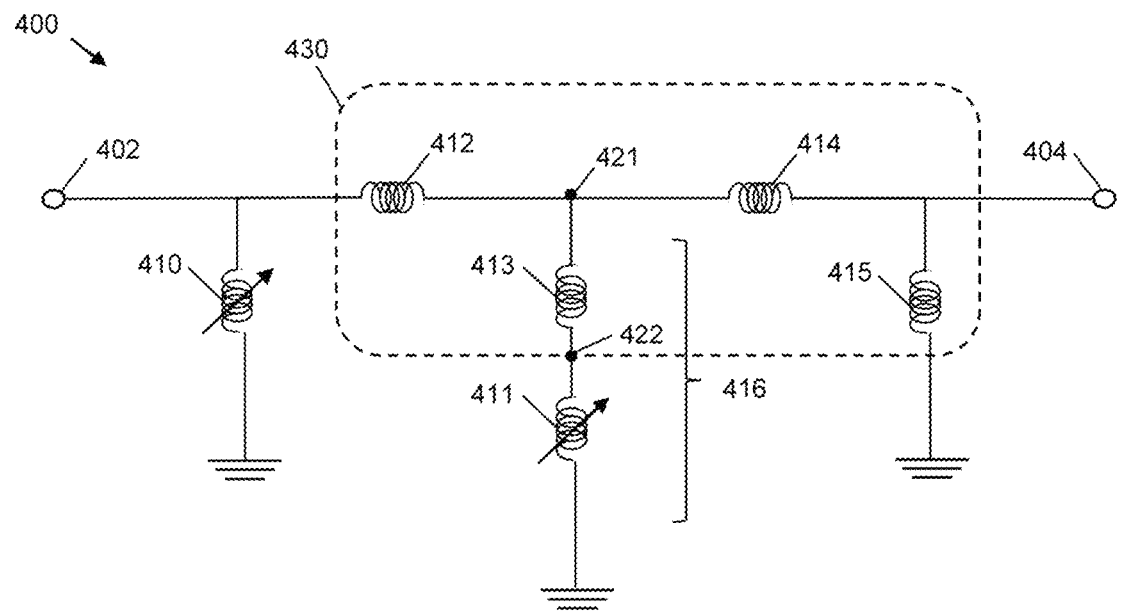
FIG. 4A is a schematic diagram of a single-ended variable inductance matching network, in accordance with an example embodiment.

Referring first to the variable-inductance impedance matching network embodiment, FIG. 4A is a schematic diagram of a single-ended variable impedance matching network 400 (e.g., variable impedance matching network 370, FIG. 3), in accordance with an example embodiment. As will be explained in more detail below, the variable impedance matching network 370 essentially has two portions: one portion to match the RF signal source (or the final stage power amplifier); and another portion to match the cavity plus load.

Variable impedance matching network 400 includes an input node 402, an output node 404, first and second variable inductance networks 410, 411, and a plurality of fixed-value inductors 412-415, according to an embodiment. When incorporated into a defrosting system (e.g., system 300, FIG. 3), the input node 402 is electrically coupled to an output of the RF signal source (e.g., RF signal source 320, FIG. 3), and the output node 404 is electrically coupled to an electrode (e.g., first electrode 340, FIG. 3) within the defrosting cavity (e.g., defrosting cavity 360, FIG. 3).

Between the input and output nodes 402, 404, the variable impedance matching network 400 includes first and second, series coupled lumped inductors 412, 414, in an embodiment. The first and second lumped inductors 412, 414 are relatively large in both size and inductance value, in an embodiment, as they may be designed for relatively low frequency (e.g., about 40.66 MHz to about 40.70 MHz) and high power (e.g., about 50 watts (W) to about 500 W) operation. For example, inductors 412, 414 may have values in a range of about 200 nanohenries (nH) to about 600 nH, although their values may be lower and/or higher, in other embodiments.

The first variable inductance network 410 is a first shunt inductive network that is coupled between the input node 402 and a ground reference terminal (e.g., the grounded containment structure 366, FIG. 3). According to an embodiment, the first variable inductance network 410 is configurable to match the impedance of the RF signal source (e.g., RF signal source 320, FIG. 3) as modified by the first matching circuit (e.g., circuit 334, FIG. 3), or more particularly to match the impedance of the final stage power amplifier (e.g., amplifier 325, FIG. 3) as modified by the first matching circuit 334 (e.g., circuit 334, FIG. 3). Accordingly, the first variable inductance network 410 may be referred to as the "RF signal source matching portion" of the variable impedance matching network 400. According to an embodiment, and as will be described in more detail in conjunction with FIG. 5, the first variable inductance network 410 includes a network of inductive components that may be selectively coupled together to provide inductances in a range of about 10 nH to about 400 nH, although the range may extend to lower or higher inductance values, as well.

In contrast, the "cavity matching portion" of the variable impedance matching network 400 is provided by a second shunt inductive network 416 that is coupled between a node 422 between the first and second lumped inductors 412, 414 and the ground reference terminal. According to an embodiment, the second shunt inductive network 416 includes a third lumped inductor 413 and a second variable inductance network 411 coupled in series, with an intermediate node 422 between the third lumped inductor 413 and the second variable inductance network 411. Because the state of the second variable inductance network 411 may be changed to provide multiple inductance values, the second shunt inductive network 416 is configurable to optimally match the impedance of the cavity plus load (e.g., cavity 360 plus load 364, FIG. 3). For example, inductor 413 may have a value in a range of about 400 nH to about 800 nH, although its value may be lower and/or higher, in other embodiments. According to an embodiment, and as will be described in more detail in conjunction with FIG. 5, the second variable inductance network 411 includes a network of inductive components that may be selectively coupled together to provide inductances in a range of about 50 nH to about 800 nH, although the range may extend to lower or higher inductance values, as well.

Finally, the variable impedance matching network 400 includes a fourth lumped inductor 415 coupled between the output node 404 and the ground reference terminal. For example, inductor 415 may have a value in a range of about 400 nH to about 800 nH, although its value may be lower and/or higher, in other embodiments.

As will be described in more detail in conjunction with FIG. 12A, the set 430 of lumped inductors 412-415 may form a portion of a module that is at least partially physically located within the cavity (e.g., cavity 360, FIG. 3), or at least within the confines of the containment structure (e.g., containment structure 366, FIG. 3). This enables the radiation produced by the lumped inductors 412-415 to be safely contained within the system, rather than being radiated out into the surrounding environment. In contrast, the variable inductance networks 410, 411 may or may not be contained within the cavity or the containment structure, in various embodiments.

According to an embodiment, the variable impedance matching network 400 embodiment of FIG. 4A includes "only inductors" to provide a match for the input impedance of the defrosting cavity 360 plus load 364. Thus, the network 400 may be considered an "inductor-only" matching network. As used herein, the phrases "only inductors" or "inductor-only" when describing the components of the variable impedance matching network means that the network does not include discrete resistors with significant resistance values or discrete capacitors with significant capacitance values. In some cases, conductive transmission lines between components of the matching network may have minimal resistances, and/or minimal parasitic capacitances may be present within the network. Such minimal resistances and/or minimal parasitic capacitances are not to be construed as converting embodiments of the "inductor-only" network into a matching network that also includes resistors and/or capacitors. Those of skill in the art would understand, however, that other embodiments of variable impedance matching networks may include differently configured inductor-only matching networks, and matching networks that include combinations of discrete inductors, discrete capacitors, and/or discrete resistors. As will be described in more detail in conjunction with FIG. 6, an "inductor-only" matching network alternatively may be defined as a matching network that enables impedance matching of a capacitive load using solely or primarily inductive components.

Figure 5A:
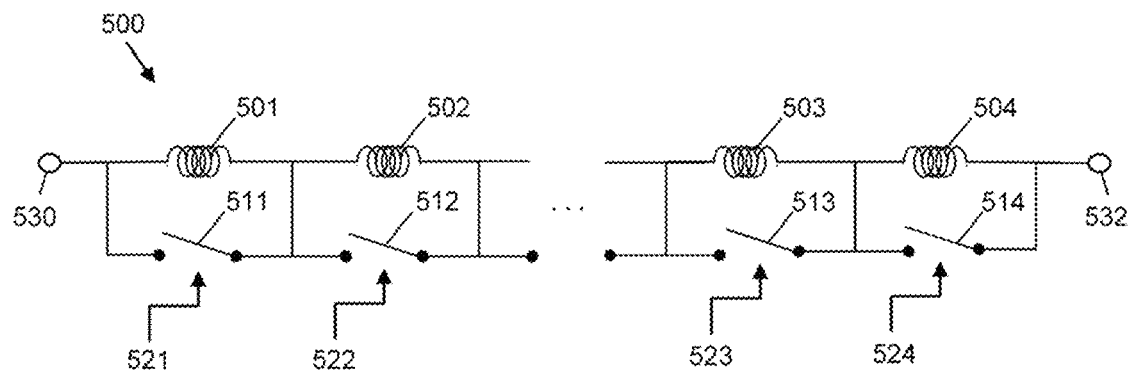
FIG. 5A is a schematic diagram of a single-ended variable inductance network, in accordance with an example embodiment.

FIG. 5A is a schematic diagram of a variable inductance network 500 that may be incorporated into a variable impedance matching network (e.g., as variable inductance networks 410 and/or 411, FIG. 4A), in accordance with an example embodiment. Network 500 includes an input node 530, an output node 532, and a plurality, N, of discrete inductors 501-504 coupled in series with each other between the input and output nodes 530, 532, where N may be an integer between 2 and 10, or more. In addition, network 500 includes a plurality, N, of bypass switches 511-514, where each switch 511-514 is coupled in parallel across the terminals of one of the inductors 501-504. Switches 511-514 may be implemented as transistors, mechanical relays or mechanical switches, for example. The electrically conductive state of each switch 511-514 (i.e., open or closed) is controlled through control signals 521-524 from the system controller (e.g., system controller 312, FIG. 3).

For each parallel inductor/switch combination, substantially all current flows through the inductor when its corresponding switch is in an open or non-conductive state, and substantially all current flows through the switch when the switch is in a closed or conductive state. For example, when all switches 511-514 are open, as illustrated in FIG. 5A, substantially all current flowing between input and output nodes 530, 532 flows through the series of inductors 501-504. This configuration represents the maximum inductance state of the network 500 (i.e., the state of network 500 in which a maximum inductance value is present between input and output nodes 530, 532). Conversely, when all switches 511-514 are closed, substantially all current flowing between input and output nodes 530, 532 bypasses the inductors 501-504 and flows instead through the switches 511-514 and the conductive interconnections between nodes 530, 532 and switches 511-514. This configuration represents the minimum inductance state of the network 500 (i.e., the state of network 500 in which a minimum inductance value is present between input and output nodes 530, 532). Ideally, the minimum inductance value would be near zero inductance. However, in practice a "trace" inductance is present in the minimum inductance state due to the cumulative inductances of the switches 511-514 and the conductive interconnections between nodes 530, 532 and the switches 511-514. For example, in the minimum inductance state, the trace inductance for the variable inductance network 500 may be in a range of about 10 nH to about 50 nH, although the trace inductance may be smaller or larger, as well. Larger, smaller, or substantially similar trace inductances also may be inherent in each of the other network states, as well, where the trace inductance for any given network state is a summation of the inductances of the sequence of conductors and switches through which the current primarily is carried through the network 500.

Starting from the maximum inductance state in which all switches 511-514 are open, the system controller may provide control signals 521-524 that result in the closure of any combination of switches 511-514 in order to reduce the inductance of the network 500 by bypassing corresponding combinations of inductors 501-504. In one embodiment, each inductor 501-504 has substantially the same inductance value, referred to herein as a normalized value of I. For example, each inductor 501-504 may have a value in a range of about 10 nH to about 200 nH, or some other value. In such an embodiment, the maximum inductance value for the network 500 (i.e., when all switches 511-514 are in an open state) would be about N×J, plus any trace inductance that may be present in the network 500 when it is in the maximum inductance state. When any n switches are in a closed state, the inductance value for the network 500 would be about (N−n)×I (plus trace inductance). In such an embodiment, the state of the network 500 may be configured to have any of N+1 values of inductance.

In an alternate embodiment, the inductors 501-504 may have different values from each other. For example, moving from the input node 530 toward the output node 532, the first inductor 501 may have a normalized inductance value of I, and each subsequent inductor 502-504 in the series may have a larger or smaller inductance value. For example, each subsequent inductor 502-504 may have an inductance value that is a multiple (e.g., about twice) the inductance value of the nearest downstream inductor 501-503, although the difference may not necessarily be an integer multiple. In such an embodiment, the state of the network 500 may be configured to have any of $2^N$ values of inductance. For example, when N=4 and each inductor 501-504 has a different value, the network 500 may be configured to have any of 16 values of inductance. For example, but not by way of limitation, assuming that inductor 501 has a value of I, inductor 502 has a value of 2×I, inductor 503 has a value of 4×I, and inductor 504 has a value of 8×I, Table 1, below indicates the total inductance value for all 16 possible states of the network 500 (not accounting for trace inductances):

matching network 370, FIG. 3), which may be implemented instead of the variable-inductance impedance matching network 400 (FIG. 4A), in accordance with an example embodiment. Variable impedance matching network 440 includes an input node 402, an output node 404, first and second variable capacitance networks 442, 446, and at least one inductor 454, according to an embodiment. When incorporated into a defrosting system (e.g., system 300, FIG. 3), the input node 402 is electrically coupled to an output of the

TABLE 1

Total inductance values for all possible variable inductance network states

| Network state | Switch 511 state (501 value = I) | Switch 512 state (502 value = 2 × I) | Switch 513 state (503 value = 4 × I) | Switch 514 state (504 value = 8 × I) | Total network inductance (w/o trace inductance) |
|---|---|---|---|---|---|
| 0 | closed | closed | closed | closed | 0 |
| 1 | open | closed | closed | closed | I |
| 2 | closed | open | closed | closed | 2 × I |
| 3 | open | open | closed | closed | 3 × I |
| 4 | closed | closed | open | closed | 4 × I |
| 5 | open | closed | open | closed | 5 × I |
| 6 | closed | open | open | closed | 6 × I |
| 7 | open | open | open | closed | 7 × I |
| 8 | closed | closed | closed | open | 8 × I |
| 9 | open | closed | closed | open | 9 × I |
| 10 | closed | open | closed | open | 10 × I |
| 11 | open | open | closed | open | 11 × I |
| 12 | closed | closed | open | open | 12 × I |
| 13 | open | closed | open | open | 13 × I |
| 14 | closed | open | open | open | 14 × I |
| 15 | open | open | open | open | 15 × I |

Referring again to FIG. 4A, an embodiment of variable inductance network 410 may be implemented in the form of variable inductance network 500 with the above-described example characteristics (i.e., N=4 and each successive inductor is about twice the inductance of the preceding inductor). Assuming that the trace inductance in the minimum inductance state is about 10 nH, and the range of inductance values achievable by network 410 is about 10 nH (trace inductance) to about 400 nH, the values of inductors 501-504 may be, for example, about 30 nH, about 50 nH, about 100 nH, and about 200 nH, respectively. Similarly, if an embodiment of variable inductance network 411 is implemented in the same manner, and assuming that the trace inductance is about 50 nH and the range of inductance values achievable by network 411 is about 50 nH (trace inductance) to about 800 nH, the values of inductors 501-504 may be, for example, about 50 nH, about 100 nH, about 200 nH, and about 400 nH, respectively. Of course, more or fewer than four inductors 501-504 may be included in either variable inductance network 410, 411, and the inductors within each network 410, 411 may have different values.

Although the above example embodiment specifies that the number of switched inductances in the network 500 equals four, and that each inductor 501-504 has a value that is some multiple of a value of I, alternate embodiments of variable inductance networks may have more or fewer than four inductors, different relative values for the inductors, a different number of possible network states, and/or a different configuration of inductors (e.g., differently connected sets of parallel and/or series coupled inductors). Either way, by providing a variable inductance network in an impedance matching network of a defrosting system, the system may be better able to match the ever-changing cavity plus load impedance that is present during a defrosting operation.

Figure 4B:
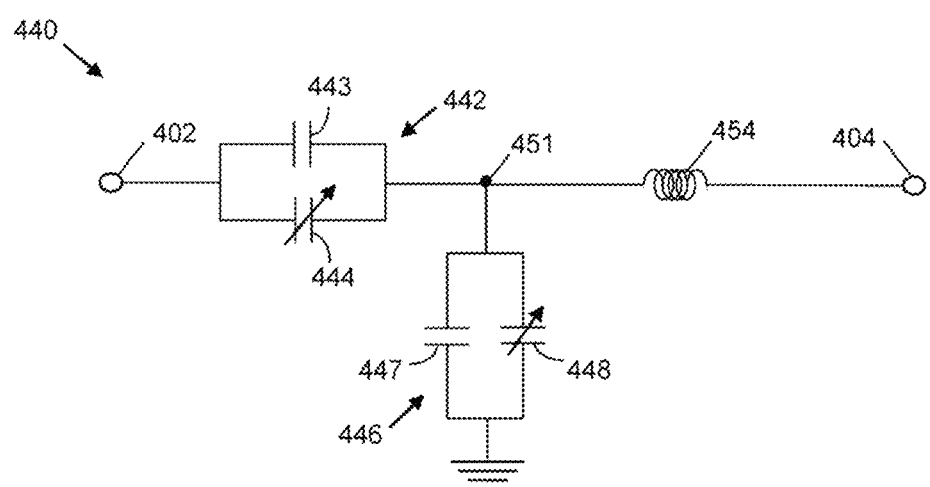
FIG. 4B is a schematic diagram of a single-ended variable capacitive matching network, in accordance with an example embodiment.

FIG. 4B is a schematic diagram of a single-ended variable capacitive matching network 440 (e.g., variable impedance RF signal source (e.g., RF signal source 320, FIG. 3), and the output node 404 is electrically coupled to an electrode (e.g., first electrode 340, FIG. 3) within the defrosting cavity (e.g., defrosting cavity 360, FIG. 3).

Between the input and output nodes 402, 404, the variable impedance matching network 440 includes a first variable capacitance network 442 coupled in series with an inductor 454, and a second variable capacitance network 446 coupled between an intermediate node 451 and a ground reference terminal (e.g., the grounded containment structure 366, FIG. 3), in an embodiment. The inductor 454 may be designed for relatively low frequency (e.g., about 40.66 MHz to about 40.70 MHz) and high power (e.g., about 50 W to about 500 W) operation, in an embodiment. For example, inductor 454 may have a value in a range of about 200 nH to about 600 nH, although its value may be lower and/or higher, in other embodiments. According to an embodiment, inductor 454 is a fixed-value, lumped inductor (e.g., a coil). In other embodiments, the inductance value of inductor 454 may be variable.

The first variable capacitance network 442 is coupled between the input node 402 and the intermediate node 451, and the first variable capacitance network 442 may be referred to as a "series matching portion" of the variable impedance matching network 440. According to an embodiment, the first variable capacitance network 442 includes a first fixed-value capacitor 443 coupled in parallel with a first variable capacitor 444. The first fixed-value capacitor 443 may have a capacitance value in a range of about 1 picofarad (pF) to about 100 pF, in an embodiment. As will be described in more detail in conjunction with FIG. 5B, the first variable capacitor 444 may include a network of capacitive components that may be selectively coupled together to provide capacitances in a range of 0 pF to about 100 pF. Accordingly, the total capacitance value provided by the first variable capacitance network 442 may be in a range of about 1 pF to about 200 pF, although the range may extend to lower or higher capacitance values, as well.

A "shunt matching portion" of the variable impedance matching network 440 is provided by the second variable capacitance network 446, which is coupled between node 451 (located between the first variable capacitance network 442 and lumped inductor 454) and the ground reference terminal. According to an embodiment, the second variable capacitance network 446 includes a second fixed-value capacitor 447 coupled in parallel with a second variable capacitor 448. The second fixed-value capacitor 447 may have a capacitance value in a range of about 1 pF to about 100 pF, in an embodiment. As will be described in more detail in conjunction with FIG. 5B, the second variable capacitor 448 may include a network of capacitive components that may be selectively coupled together to provide capacitances in a range of 0 pF to about 100 pF. Accordingly, the total capacitance value provided by the second variable capacitance network 446 may be in a range of about 1 pF to about 200 pF, although the range may extend to lower or higher capacitance values, as well. The states of the first and second variable capacitance networks 442, 446 may be changed to provide multiple capacitance values, and thus may be configurable to optimally match the impedance of the cavity plus load (e.g., cavity 360 plus load 364, FIG. 3) to the RF signal source (e.g., RF signal source 320, FIG. 3).

Figure 5B:
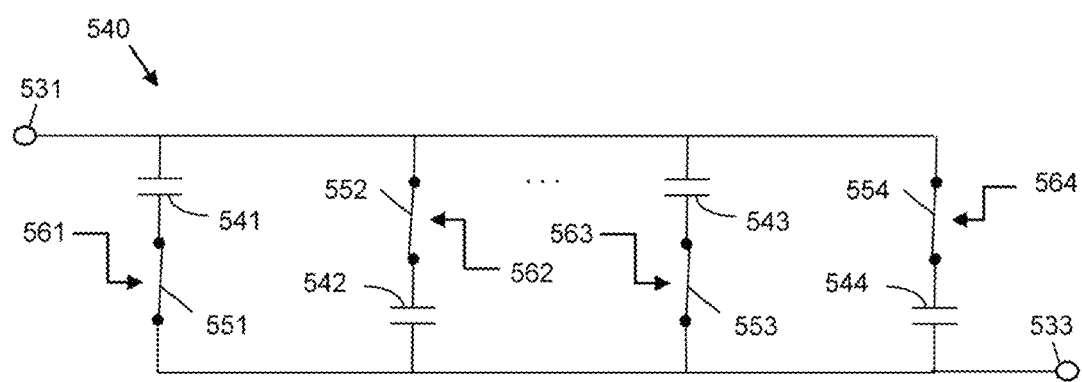
FIG. 5B is a schematic diagram of a single-ended variable capacitive network, in accordance with an example embodiment.

FIG. 5B is a schematic diagram of a single-ended variable capacitive network 540 that may be incorporated into a variable impedance matching network (e.g., for each instance of variable capacitors 444, 448, FIG. 4B), in accordance with an example embodiment. Network 540 includes an input node 531, an output node 533, and a plurality, N, of discrete capacitors 541-544 coupled in parallel with each other between the input and output nodes 531, 533, where N may be an integer between 2 and 10, or more. In addition, network 540 includes a plurality, N, of bypass switches 551-554, where each switch 551-554 is coupled in series with one of the terminals of one of the capacitors 541-544. Switches 551-554 may be implemented as transistors, mechanical relays or mechanical switches, for example. The electrically conductive state of each switch 551-554 (i.e., open or closed) is controlled through control signals 561-564 from the system controller (e.g., system controller 312, FIG. 3). In the embodiment illustrated in FIG. 5B, in each parallel-coupled branch, a single switch is connected to one of the terminals of each capacitor, and the terminal to which the switch is coupled alternates between a bottom terminal (e.g., for capacitors 541 and 543) and a top terminal (e.g., for capacitors 542 and 544) across the series of parallel-coupled capacitors 541-544. In alternate embodiments, the terminal to which the switch is coupled may be the same across the network (e.g., each switch is coupled to a top terminal or to a bottom terminal in each parallel-coupled branch, but not both), or two switches may be coupled to both the top and bottom terminals of each capacitor in each parallel-coupled branch. In the latter embodiment, the two switches coupled to each capacitor may be controlled to open and close in a synchronized manner.

In the illustrated embodiment, for each series capacitor/switch combination in each parallel-coupled branch, substantially all current flows through the capacitor when its corresponding switch is in a closed or conductive state, and substantially zero current flows through the capacitor when the switch is in an open or non-conductive state. For example, when all switches 551-554 are closed, as illustrated in FIG. 5B, substantially all current flowing between input and output nodes 531, 533 flows through the parallel combination of capacitors 541-544. This configuration represents the maximum capacitance state of the network 540 (i.e., the state of network 540 in which a maximum capacitance value is present between input and output nodes 531, 533). Conversely, when all switches 551-554 are open, substantially zero current flows between input and output nodes 531, 533. This configuration represents the minimum capacitance state of the network 540 (i.e., the state of network 540 in which a minimum capacitance value is present between input and output nodes 531, 533).

Starting from the maximum capacitance state in which all switches 551-554 are closed, the system controller may provide control signals 561-564 that result in the opening of any combination of switches 551-554 in order to reduce the capacitance of the network 540 by switching out corresponding combinations of capacitors 541-544. In one embodiment, each capacitor 541-544 has substantially the same capacitance value, referred to herein as a normalized value of J. For example, each capacitor 541-544 may have a value in a range of about 1 pF to about 25 pF, or some other value. In such an embodiment, the maximum capacitance value for the network 540 (i.e., when all switches 551-554 are in a closed state) would be about N×J. When any n switches are in an open state, the capacitance value for the network 540 would be about (N−n)×f. In such an embodiment, the state of the network 540 may be configured to have any of N+1 values of capacitance.

In an alternate embodiment, the capacitors 541-544 may have different values from each other. For example, moving from the input node 531 toward the output node 533, the first capacitor 541 may have a normalized capacitance value of J, and each subsequent capacitor 542-544 in the series may have a larger or smaller capacitance value. For example, each subsequent capacitor 542-544 may have a capacitance value that is a multiple (e.g., about twice) the capacitance value of the nearest downstream capacitor 541-543, although the difference may not necessarily be an integer multiple. In such an embodiment, the state of the network 540 may be configured to have any of $2^N$ values of capacitance. For example, when N=4 and each capacitor 541-544 has a different value, the network 540 may be configured to have any of 16 values of capacitance. For example, but not by way of limitation, assuming that capacitor 541 has a value of J, capacitor 542 has a value of 2×J, capacitor 543 has a value of 4×J, and capacitor 544 has a value of 8×J, the total capacitance value for all 16 possible states of the network 540 may be represented by a table similar to Table 1, above (except switching the value of I for J, and reversing the "open" and "closed" designations).

Figure 6:
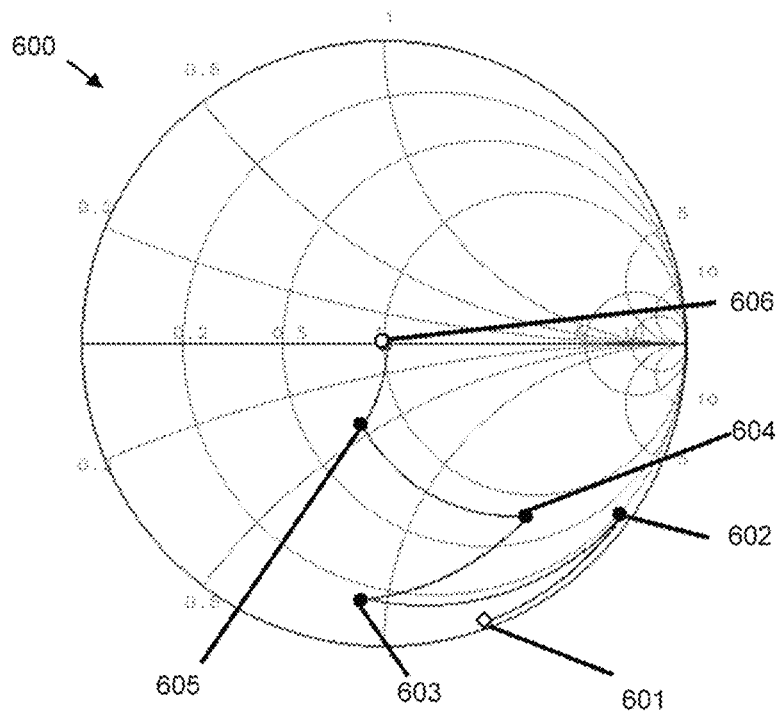
FIG. 6 is an example of a Smith chart depicting how a plurality of variable passive devices in embodiments of a variable impedance matching network may match the cavity plus load impedance to a radio frequency (RF) signal source.

FIG. 6 is an example of a Smith chart 600 depicting how the plurality of inductances in an embodiment of a variable impedance matching network (e.g., network 370, 400, FIGS. 3, 4A) may match the cavity plus load impedance to the RF signal source. Although not illustrated, a plurality of capacitances in an embodiment of a variable impedance matching network (e.g., network 370, 440, FIGS. 3, 4B) may similarly match the cavity plus load impedance to the RF signal source. The example Smith chart 600 assumes that the system is a 50 Ohm system, and that the output of the RF signal source is 50 Ohms. Those of skill in the art would understand, based on the description herein, how the Smith chart could be modified for a system and/or RF signal source with different characteristic impedances.

In Smith chart 600, point 601 corresponds to the point at which the load (e.g., the cavity 360 plus load 364, FIG. 3)

would locate (e.g., at the beginning of a defrosting operation) absent the matching provided by the variable impedance matching network (e.g., network 370, 400, FIGS. 3, 4A). As indicated by the position of the load point 601 in the lower right quadrant of the Smith chart 600, the load is a capacitive load. According to an embodiment, the shunt and series inductances of the variable impedance matching network sequentially move the substantially-capacitive load impedance toward an optimal matching point 606 (e.g., 50 Ohms) at which RF energy transfer to the load may occur with minimal losses. More specifically, and referring also to FIG. 4A, shunt inductance 415 moves the impedance to point 602, series inductance 414 moves the impedance to point 603, shunt inductance 416 moves the impedance to point 604, series inductance 412 moves the impedance to point 605, and shunt inductance 410 moves the impedance to the optimal matching point 606.

It should be noted that the combination of impedance transformations provided by embodiments of the variable impedance matching network keep the impedance at any point within or very close to the lower right quadrant of the Smith chart 600. As this quadrant of the Smith chart 600 is characterized by relatively high impedances and relatively low currents, the impedance transformation is achieved without exposing components of the circuit to relatively high and potentially damaging currents. Accordingly, an alternate definition of an "inductor-only" matching network, as used herein, may be a matching network that enables impedance matching of a capacitive load using solely or primarily inductive components, where the impedance matching network performs the transformation substantially within the lower right quadrant of the Smith chart.

As discussed previously, the impedance of the load changes during the defrosting operation. Accordingly, point 601 correspondingly moves during the defrosting operation. Movement of load point 601 is compensated for, according to the previously-described embodiments, by varying the impedance of the first and second shunt inductances 410, 411 so that the final match provided by the variable impedance matching network still may arrive at or near the optimal matching point 606. Although a specific variable impedance matching network has been illustrated and described herein, those of skill in the art would understand, based on the description herein, that differently-configured variable impedance matching networks may achieve the same or similar results to those conveyed by Smith chart 600. For example, alternative embodiments of a variable impedance matching network may have more or fewer shunt and/or series inductances, and or different ones of the inductances may be configured as variable inductance networks (e.g., including one or more of the series inductances). Accordingly, although a particular variable inductance matching network has been illustrated and described herein, the inventive subject matter is not limited to the illustrated and described embodiment.

The description associated with FIGS. 3-6 discuss, in detail, an "unbalanced" defrosting apparatus, in which an RF signal is applied to one electrode (e.g., electrode 340, FIG. 3), and the other "electrode" (e.g., the containment structure 366, FIG. 3) is grounded. As mentioned above, an alternate embodiment of a defrosting apparatus comprises a "balanced" defrosting apparatus. In such an apparatus, balanced RF signals are provided to both electrodes.

For example, FIG. 7 is a simplified block diagram of a balanced defrosting system 700 (e.g., defrosting system 100, 210, 220, FIGS. 1, 2), in accordance with an example embodiment. Defrosting system 700 includes RF subsystem 710, defrosting cavity 760, user interface 780, system controller 712, RF signal source 720, power supply and bias circuitry 726, variable impedance matching network 770, two electrodes 740, 750, and power detection circuitry 730, in an embodiment. In addition, in other embodiments, defrosting system 700 may include temperature sensor(s), and/or infrared (IR) sensor(s) 790, although some or all of these sensor components may be excluded. It should be understood that FIG. 7 is a simplified representation of a defrosting system 700 for purposes of explanation and ease of description, and that practical embodiments may include other devices and components to provide additional functions and features, and/or the defrosting system 700 may be part of a larger electrical system.

User interface 780 may correspond to a control panel (e.g., control panel 120, 214, 224, FIGS. 1, 2), for example, which enables a user to provide inputs to the system regarding parameters for a defrosting operation (e.g., characteristics of the load to be defrosted, and so on), start and cancel buttons, mechanical controls (e.g., a door/drawer open latch), and so on. In addition, the user interface may be configured to provide user-perceptible outputs indicating the status of a defrosting operation (e.g., a countdown timer, visible indicia indicating progress or completion of the defrosting operation, and/or audible tones indicating completion of the defrosting operation) and other information.

The RF subsystem 710 includes a system controller 712, an RF signal source 720, a first impedance matching circuit 734 (herein "first matching circuit"), power supply and bias circuitry 726, and power detection circuitry 730, in an embodiment. System controller 712 may include one or more general purpose or special purpose processors (e.g., a microprocessor, microcontroller, ASIC, and so on), volatile and/or non-volatile memory (e.g., RAM, ROM, flash, various registers, and so on), one or more communication busses, and other components. According to an embodiment, system controller 712 is operatively and communicatively coupled to user interface 780, RF signal source 720, power supply and bias circuitry 726, power detection circuitry 730 (or 730' or 730"), variable matching subsystem 770, sensor(s) 790 (if included), and sensors 792 (if included). System controller 712 is configured to receive signals indicating user inputs received via user interface 780, to receive signals indicating RF signal reflected power (and possibly RF signal forward power) from power detection circuitry 730 (or 730' or 730"), and to receive sensor signals from sensor(s) 790. Responsive to the received signals and measurements, and as will be described in more detail later, system controller 712 provides control signals to the power supply and bias circuitry 726 and/or to the RF signal generator 722 of the RF signal source 720. In addition, system controller 712 provides control signals to the variable matching subsystem 770 (over path 716), which cause the subsystem 770 to change the state or configuration of a variable impedance matching circuit 772 of the subsystem 770 (herein "variable matching circuit").

Defrosting cavity 760 includes a capacitive defrosting arrangement with first and second parallel plate electrodes 740, 750 that are separated by an air cavity within which a load 764 to be defrosted may be placed. Within a containment structure 766, first and second electrodes 740, 750 (e.g., electrodes 140, 150, FIG. 1) are positioned in a fixed physical relationship with respect to each other on either side of an interior defrosting cavity 760 (e.g., interior cavity 260, FIG. 2). According to an embodiment, a distance 752 between the electrodes 740, 750 renders the cavity 760 a sub-resonant cavity, in an embodiment.

The first and second electrodes 740, 750 are separated across the cavity 760 by a distance 752. In various embodiments, the distance 752 is in a range of about 0.10 meters to about 1.0 meter, although the distance may be smaller or larger, as well. According to an embodiment, distance 752 is less than one wavelength of the RF signal produced by the RF subsystem 710. In other words, as mentioned above, the cavity 760 is a sub-resonant cavity. In some embodiments, the distance 752 is less than about half of one wavelength of the RF signal. In other embodiments, the distance 752 is less than about one quarter of one wavelength of the RF signal. In still other embodiments, the distance 752 is less than about one eighth of one wavelength of the RF signal. In still other embodiments, the distance 752 is less than about one 50th of one wavelength of the RF signal. In still other embodiments, the distance 752 is less than about one 100th of one wavelength of the RF signal.

In general, a system 700 designed for lower operational frequencies (e.g., frequencies between 10 MHz and 100 MHz) may be designed to have a distance 752 that is a smaller fraction of one wavelength. For example, when system 700 is designed to produce an RF signal with an operational frequency of about 10 MHz (corresponding to a wavelength of about 30 meters), and distance 752 is selected to be about 0.5 meters, the distance 752 is about one 60th of one wavelength of the RF signal. Conversely, when system 700 is designed for a higher operational frequency of about 300 MHz (corresponding to a wavelength of about 1 meter), and distance 752 is selected to be about 0.5 meters, the distance 752 is about one half of one wavelength of the RF signal.

With the operational frequency and the distance 752 between electrodes 740, 750 being selected to define a sub-resonant interior cavity 760, the first and second electrodes 740, 750 are capacitively coupled. More specifically, the first electrode 740 may be analogized to a first plate of a capacitor, the second electrode 750 may be analogized to a second plate of a capacitor, and the load 764, barrier 762, and air within the cavity 760 may be analogized to a capacitor dielectric. Accordingly, the first electrode 740 alternatively may be referred to herein as an "anode," and the second electrode 750 may alternatively be referred to herein as a "cathode."

Essentially, the voltage across the first and second electrodes 740, 750 heats the load 764 within the cavity 760. According to various embodiments, the RF subsystem 710 is configured to generate the RF signal to produce voltages across the electrodes 740, 750 in a range of about 70 volts to about 3000 volts, in one embodiment, or in a range of about 3000 volts to about 10,000 volts, in another embodiment, although the system may be configured to produce lower or higher voltages across electrodes 740, 750, as well.

An output of the RF subsystem 710, and more particularly an output of RF signal source 720, is electrically coupled to the variable matching subsystem 770 through a conductive transmission path, which includes a plurality of conductors 728-1, 728-2, 728-3, 728-4, and 728-5 connected in series, and referred to collectively as transmission path 728. According to an embodiment, the conductive transmission path 728 includes an "unbalanced" portion and a "balanced" portion, where the "unbalanced" portion is configured to carry an unbalanced RF signal (i.e., a single RF signal referenced against ground), and the "balanced" portion is configured to carry a balanced RF signal (i.e., two signals referenced against each other). The "unbalanced" portion of the transmission path 728 may include unbalanced first and second conductors 728-1, 728-2 within the RF subsystem 710, one or more connectors 736, 738 (each having male and female connector portions), and an unbalanced third conductor 728-3 electrically coupled between the connectors 736, 738. According to an embodiment, the third conductor 728-3 comprises a coaxial cable, although the electrical length may be shorter or longer, as well. In an alternate embodiment, the variable matching subsystem 770 may be housed with the RF subsystem 710, and in such an embodiment, the conductive transmission path 728 may exclude the connectors 736, 738 and the third conductor 728-3. Either way, the "balanced" portion of the conductive transmission path 728 includes a balanced fourth conductor 728-4 within the variable matching subsystem 770, and a balanced fifth conductor 728-5 electrically coupled between the variable matching subsystem 770 and electrodes 740, 750, in an embodiment.

As indicated in FIG. 7, the variable matching subsystem 770 houses an apparatus configured to receive, at an input of the apparatus, the unbalanced RF signal from the RF signal source 720 over the unbalanced portion of the transmission path (i.e., the portion that includes unbalanced conductors 728-1, 728-2, and 728-3), to convert the unbalanced RF signal into two balanced RF signals (e.g., two RF signals having a phase difference between 120 and 240 degrees, such as about 180 degrees), and to produce the two balanced RF signals at two outputs of the apparatus. For example, the conversion apparatus may be a balun 774, in an embodiment. The balanced RF signals are conveyed over balanced conductors 728-4 to the variable matching circuit 772 and, ultimately, over balanced conductors 728-5 to the electrodes 740, 750.

In an alternate embodiment, as indicated in a dashed box in the center of FIG. 7, and as will be discussed in more detail below, an alternate RF signal generator 720' may produce balanced RF signals on balanced conductors 728-1', which may be directly coupled to the variable matching circuit 772 (or coupled through various intermediate conductors and connectors). In such an embodiment, the balun 774 may be excluded from the system 700. Either way, as will be described in more detail below, a double-ended variable matching circuit 772 (e.g., variable matching circuit 800, 900, 1000, FIGS. 8-10) is configured to receive the balanced RF signals (e.g., over connections 728-4 or 728-1'), to perform an impedance transformation corresponding to a then-current configuration of the double-ended variable matching circuit 772, and to provide the balanced RF signals to the first and second electrodes 740, 750 over connections 728-5.

According to an embodiment, RF signal source 720 includes an RF signal generator 722 and a power amplifier 724 (e.g., including one or more power amplifier stages). In response to control signals provided by system controller 712 over connection 714, RF signal generator 722 is configured to produce an oscillating electrical signal having a frequency in an ISM (industrial, scientific, and medical) band, although the system could be modified to support operations in other frequency bands, as well. The RF signal generator 722 may be controlled to produce oscillating signals of different power levels and/or different frequencies, in various embodiments. For example, the RF signal generator 722 may produce a signal that oscillates in a VHF (very high frequency) range (e.g., about 30 MHz to about 300 MHz), a signal that oscillates in a frequency range of about 10.0 MHz to about 100 MHz, and/or or a signal that oscillates in a frequency range of about 100 MHz to about 3.0 GHz. Some desirable frequencies may be, for example, 13.56 MHz (+/−5 percent), 27.125 MHz (+/−5 percent), 40.68 MHz (+/−5 percent), and 2.45 GHz (+/−5 percent). In one particular embodiment, for example, the RF signal generator 722 may produce a signal that oscillates in a range of about 40.66 MHz to about 40.70 MHz and at a power level in a range of about 10 dBm to about 15 dBm. Alternatively, the frequency of oscillation and/or the power level may be lower or higher than the above-given ranges or values.

The power amplifier 724 is configured to receive the oscillating signal from the RF signal generator 722, and to amplify the signal to produce a significantly higher-power signal at an output of the power amplifier 724. For example, the output signal may have a power level in a range of about 100 watts to about 400 watts or more, although the power level may be lower or higher, as well. The gain applied by the power amplifier 724 may be controlled using gate bias voltages and/or drain bias voltages provided by the power supply and bias circuitry 726 to one or more stages of amplifier 724. More specifically, power supply and bias circuitry 726 provides bias and supply voltages to the inputs and/or outputs (e.g., gates and/or drains) of each RF amplifier stage in accordance with control signals received from system controller 712.

The power amplifier may include one or more amplification stages. In an embodiment, each stage of amplifier 724 is implemented as a power transistor, such as a FET, having an input terminal (e.g., a gate or control terminal) and two current carrying terminals (e.g., source and drain terminals). Impedance matching circuits (not illustrated) may be coupled to the input (e.g., gate) and/or output (e.g., drain terminal) of some or all of the amplifier stages, in various embodiments. In an embodiment, each transistor of the amplifier stages includes an LDMOS FET. However, it should be noted that the transistors are not intended to be limited to any particular semiconductor technology, and in other embodiments, each transistor may be realized as a GaN transistor, another type of MOS FET transistor, a BJT, or a transistor utilizing another semiconductor technology.

In FIG. 7, the power amplifier arrangement 724 is depicted to include one amplifier stage coupled in a particular manner to other circuit components. In other embodiments, the power amplifier arrangement 724 may include other amplifier topologies and/or the amplifier arrangement may include two or more amplifier stages (e.g., as shown in the embodiment of amplifier 324/325, FIG. 3). For example, the power amplifier arrangement may include various embodiments of a single-ended amplifier, a double-ended (balanced) amplifier, a push-pull amplifier, a Doherty amplifier, a Switch Mode Power Amplifier (SMPA), or another type of amplifier.

For example, as indicated in the dashed box in the center of FIG. 7, an alternate RF signal generator 720' may include a push-pull or balanced amplifier 724', which is configured to receive, at an input, an unbalanced RF signal from the RF signal generator 722, to amplify the unbalanced RF signal, and to produce two balanced RF signals at two outputs of the amplifier 724', where the two balanced RF signals are thereafter conveyed over conductors 728-1' to the electrodes 740, 750. In such an embodiment, the balun 774 may be excluded from the system 700, and the conductors 728-1' may be directly connected to the variable matching circuit 772 (or connected through multiple coaxial cables and connectors or other multi-conductor structures).

Defrosting cavity 760 and any load 764 (e.g., food, liquids, and so on) positioned in the defrosting cavity 760 present a cumulative load for the electromagnetic energy (or RF power) that is radiated into the interior chamber 762 by the electrodes 740, 750. More specifically, and as described previously, the defrosting cavity 760 and the load 764 present an impedance to the system, referred to herein as a "cavity plus load impedance." The cavity plus load impedance changes during a defrosting operation as the temperature of the load 764 increases. The cavity plus load impedance has a direct effect on the magnitude of reflected signal power along the conductive transmission path 728 between the RF signal source 720 and the electrodes 740, 750. In most cases, it is desirable to maximize the magnitude of transferred signal power into the cavity 760, and/or to minimize the reflected-to-forward signal power ratio along the conductive transmission path 728.

In order to at least partially match the output impedance of the RF signal generator 720 to the cavity plus load impedance, a first matching circuit 734 is electrically coupled along the transmission path 728, in an embodiment. The first matching circuit 734 is configured to perform an impedance transformation from an impedance of the RF signal source 720 (e.g., less than about 10 ohms) to an intermediate impedance (e.g., 50 ohms, 75 ohms, or some other value). The first matching circuit 734 may have any of a variety of configurations. According to an embodiment, the first matching circuit 734 includes fixed components (i.e., components with non-variable component values), although the first matching circuit 734 may include one or more variable components, in other embodiments. For example, the first matching circuit 734 may include any one or more circuits selected from an inductance/capacitance (LC) network, a series inductance network, a shunt inductance network, or a combination of bandpass, high-pass and low-pass circuits, in various embodiments. Essentially, the first matching circuit 734 is configured to raise the impedance to an intermediate level between the output impedance of the RF signal generator 720 and the cavity plus load impedance.

According to an embodiment, and as mentioned above, power detection circuitry 730 is coupled along the transmission path 728 between the output of the RF signal source 720 and the electrodes 740, 750. In a specific embodiment, the power detection circuitry 730 forms a portion of the RF subsystem 710, and is coupled to the conductor 728-2 between the RF signal source 720 and connector 736. In alternate embodiments, the power detection circuitry 730 may be coupled to any other portion of the transmission path 728, such as to conductor 728-1, to conductor 728-3, to conductor 728-4 between the RF signal source 720 (or balun 774) and the variable matching circuit 772 (i.e., as indicated with power detection circuitry 730'), or to conductor 728-5 between the variable matching circuit 772 and the electrode(s) 740, 750 (i.e., as indicated with power detection circuitry 730"). For purposes of brevity, the power detection circuitry is referred to herein with reference number 730, although the circuitry may be positioned in other locations, as indicated by reference numbers 730' and 730".

Wherever it is coupled, power detection circuitry 730 is configured to monitor, measure, or otherwise detect the power of the reflected signals traveling along the transmission path 728 between the RF signal source 720 and one or both of the electrode(s) 740, 750 (i.e., reflected RF signals traveling in a direction from electrode(s) 740, 750 toward RF signal source 720). In some embodiments, power detection circuitry 730 also is configured to detect the power of the forward signals traveling along the transmission path 728 between the RF signal source 720 and the electrode(s)

740, 750 (i.e., forward RF signals traveling in a direction from RF signal source 720 toward electrode(s) 740, 750).

Over connection 732, power detection circuitry 730 supplies signals to system controller 712 conveying the measured magnitudes of the reflected signal power, and in some embodiments, also the measured magnitude of the forward signal power. In embodiments in which both the forward and reflected signal power magnitudes are conveyed, system controller 712 may calculate a reflected-to-forward signal power ratio, or the S11 parameter. In some embodiments the system controller 712 may also calculate the VSWR of the system based on the forward and reflected signal power magnitudes. As will be described in more detail below, when the reflected signal power magnitude exceeds a reflected signal power threshold, or when the reflected-to-forward signal power ratio exceeds an S11 parameter threshold, or when the VSWR exceeds a VSWR threshold, this indicates that the system 700 is not adequately matched to the cavity plus load impedance, and that energy absorption by the load 764 within the cavity 760 may be sub-optimal. In such a situation, system controller 712 orchestrates a process of altering the state of the variable matching circuit 772 to drive the reflected signal power or the S11 parameter or the VSWR toward or below a desired level (e.g., below the reflected signal power threshold and/or the reflected-to-forward signal power ratio threshold), thus re-establishing an acceptable match and facilitating more optimal energy absorption by the load 764.

More specifically, the system controller 712 may provide control signals over control path 716 to the variable matching circuit 772, which cause the variable matching circuit 772 to vary inductive, capacitive, and/or resistive values of one or more components within the circuit, thus adjusting the impedance transformation provided by the circuit 772. Adjustment of the configuration of the variable matching circuit 772 desirably decreases the magnitude of reflected signal power, which corresponds to decreasing the magnitude of the S11 parameter or the VSWR and increasing the power absorbed by the load 764.

As discussed above, the variable matching circuit 772 is used to match the input impedance of the defrosting cavity 760 plus load 764 to maximize, to the extent possible, the RF power transfer into the load 764. The initial impedance of the defrosting cavity 760 and the load 764 may not be known with accuracy at the beginning of a defrosting operation. Further, the impedance of the load 764 changes during a defrosting operation as the load 764 warms up. According to an embodiment, the system controller 712 may provide control signals to the variable matching circuit 772, which cause modifications to the state of the variable matching circuit 772. This enables the system controller 712 to establish an initial state of the variable matching circuit 772 at the beginning of the defrosting operation that has a relatively low reflected to forward power ratio, and thus a relatively high absorption of the RF power by the load 764. In addition, this enables the system controller 712 to modify the state of the variable matching circuit 772 so that an adequate match may be maintained throughout the defrosting operation, despite changes in the impedance of the load 764.

The variable matching circuit 772 may have any of a variety of configurations. For example, the circuit 772 may include any one or more circuits selected from an inductance/capacitance (LC) network, an inductance-only network, a capacitance-only network, or a combination of bandpass, high-pass and low-pass circuits, in various embodiments. In an embodiment in which the variable matching circuit 772 is implemented in a balanced portion of the transmission path 728, the variable matching circuit 772 is a double-ended circuit with two inputs and two outputs. In an alternate embodiment in which the variable matching circuit is implemented in an unbalanced portion of the transmission path 728, the variable matching circuit may be a single-ended circuit with a single input and a single output (e.g., similar to matching circuit 400 or 440, FIGS. 4A, 4B). According to a more specific embodiment, the variable matching circuit 772 includes a variable inductance network (e.g., double-ended network 800, 900, FIGS. 8, 9). According to another more specific embodiment, the variable matching circuit 772 includes a variable capacitance network (e.g., double-ended network 1000, FIG. 10). In still other embodiments, the variable matching circuit 772 may include both variable inductance and variable capacitance elements. The inductance, capacitance, and/or resistance values provided by the variable matching circuit 772, which in turn affect the impedance transformation provided by the circuit 772, are established through control signals from the system controller 712, as will be described in more detail later. In any event, by changing the state of the variable matching circuit 772 over the course of a treatment operation to dynamically match the ever-changing impedance of the cavity 760 plus the load 764 within the cavity 760, the system efficiency may be maintained at a high level throughout the defrosting operation.

Figure 8:
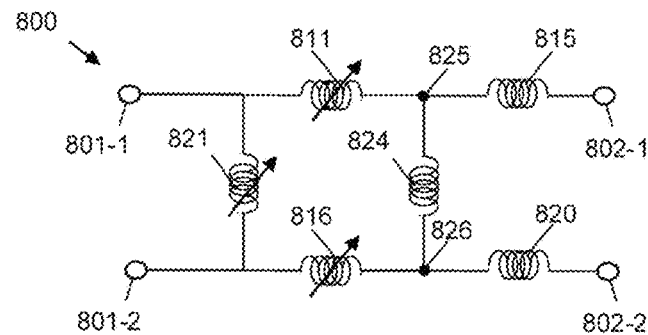
FIG. 8 is a schematic diagram of a double-ended variable impedance matching network with variable inductances, in accordance with another example embodiment.
Figure 9:
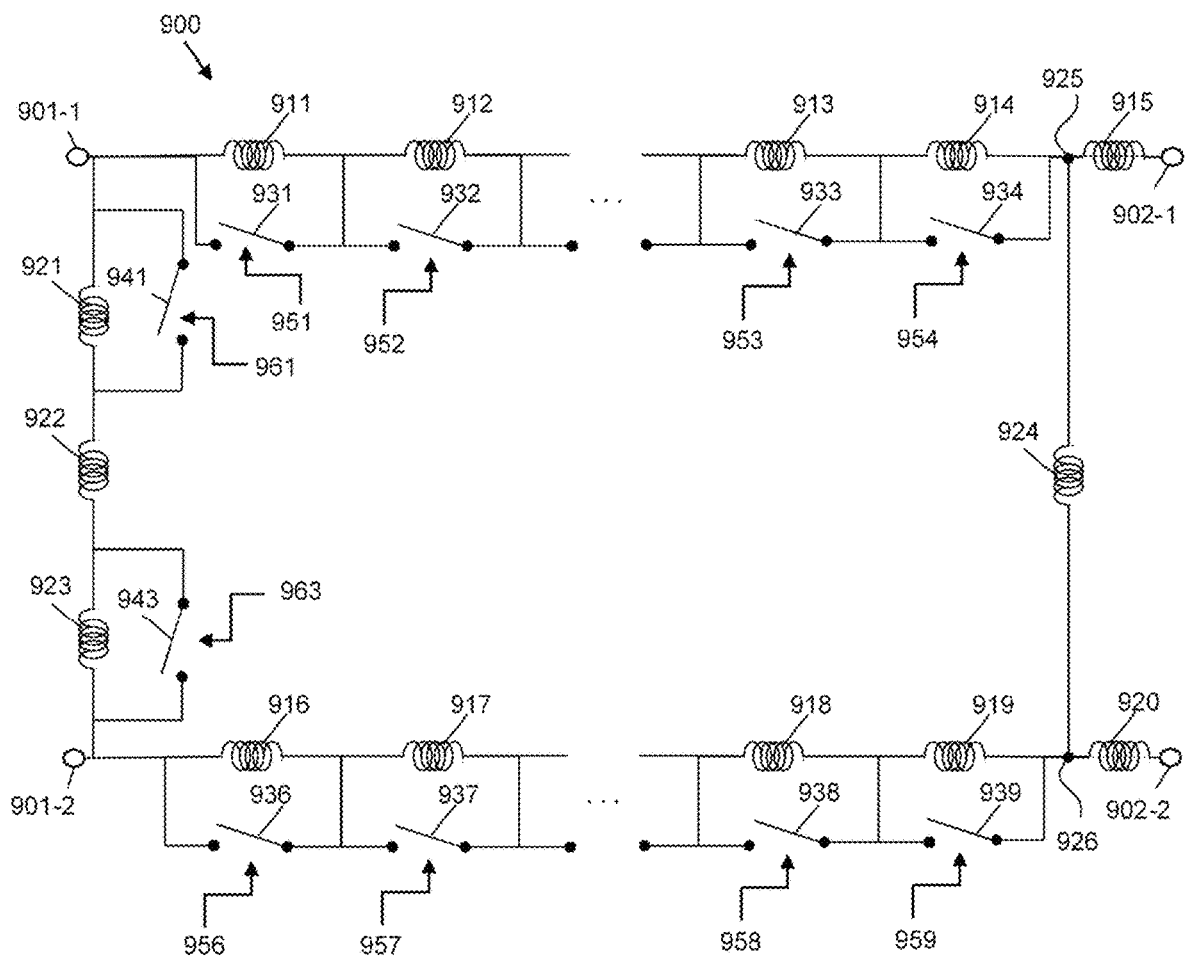
FIG. 9 is a schematic diagram of a double-ended variable impedance network with variable inductances, in accordance with another example embodiment.
Figure 10:
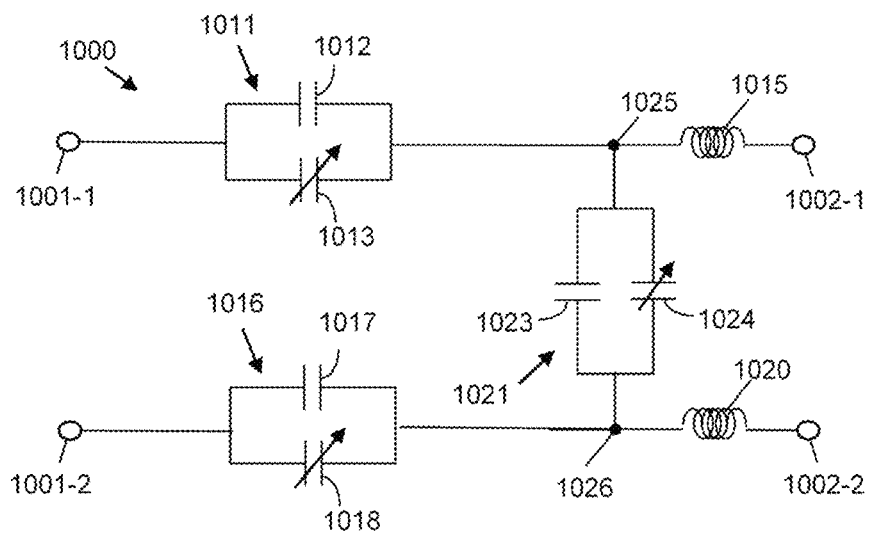
FIG. 10 is a schematic diagram of a double-ended variable impedance network with variable capacitances, in accordance with another example embodiment.

The variable matching circuit 772 may have any of a wide variety of circuit configurations, and non-limiting examples of such configurations are shown in FIGS. 8-10. For example, FIG. 8 is a schematic diagram of a double-ended variable impedance matching circuit 800 that may be incorporated into a defrosting system (e.g., system 100, 200, 700, FIGS. 1, 2, 7), in accordance with an example embodiment. According to an embodiment, the variable matching circuit 800 includes a network of fixed-value and variable passive components.

Circuit 800 includes a double-ended input 801-1, 801-2 (referred to as input 801), a double-ended output 802-1, 802-2 (referred to as output 802), and a network of passive components connected in a ladder arrangement between the input 801 and output 802. For example, when connected into system 700, the first input 801-1 may be connected to a first conductor of balanced conductor 728-4, and the second input 801-2 may be connected to a second conductor of balanced conductor 728-4. Similarly, the first output 802-1 may be connected to a first conductor of balanced conductor 728-5, and the second output 802-2 may be connected to a second conductor of balanced conductor 728-5.

In the specific embodiment illustrated in FIG. 8, circuit 800 includes a first variable inductor 811 and a first fixed inductor 815 connected in series between input 801-1 and output 802-1, a second variable inductor 816 and a second fixed inductor 820 connected in series between input 801-2 and output 802-2, a third variable inductor 821 connected between inputs 801-1 and 801-2, and a third fixed inductor 824 connected between nodes 825 and 826.

According to an embodiment, the third variable inductor 821 corresponds to an "RF signal source matching portion", which is configurable to match the impedance of the RF signal source (e.g., RF signal source 720, FIG. 7) as modified by the first matching circuit (e.g., circuit 734, FIG. 7), or more particularly to match the impedance of the final stage power amplifier (e.g., amplifier 724, FIG. 7) as modified by the first matching circuit (e.g., circuit 734, FIG. 7). According to an embodiment, the third variable inductor 821 includes a network of inductive components that may be selectively coupled together to provide inductances in a range of about 5 nH to about 200 nH, although the range may extend to lower or higher inductance values, as well.

In contrast, the "cavity matching portion" of the variable impedance matching network 800 is provided by the first and second variable inductors 811, 816, and fixed inductors 815, 820, and 824. Because the states of the first and second variable inductors 811, 816 may be changed to provide multiple inductance values, the first and second variable inductors 811, 816 are configurable to optimally match the impedance of the cavity plus load (e.g., cavity 760 plus load 764, FIG. 7). For example, inductors 811, 816 each may have a value in a range of about 10 nH to about 200 nH, although their values may be lower and/or higher, in other embodiments.

The fixed inductors 815, 820, 824 also may have inductance values in a range of about 50 nH to about 800 nH, although the inductance values may be lower or higher, as well. Inductors 811, 815, 816, 820, 821, 824 may include discrete inductors, distributed inductors (e.g., printed coils), wirebonds, transmission lines, and/or other inductive components, in various embodiments. In an embodiment, variable inductors 811 and 816 are operated in a paired manner, meaning that their inductance values during operation are controlled to be equal to each other, at any given time, in order to ensure that the RF signals conveyed to outputs 802-1 and 802-2 are balanced.

As discussed above, variable matching circuit 800 is a double-ended circuit that is configured to be connected along a balanced portion of the transmission path 728 (e.g., between connectors 728-4 and 728-5), and other embodiments may include a single-ended (i.e., one input and one output) variable matching circuit that is configured to be connected along the unbalanced portion of the transmission path 728.

By varying the inductance values of inductors 811, 816, 821 in circuit 800, the system controller 712 may increase or decrease the impedance transformation provided by circuit 800. Desirably, the inductance value changes improve the overall impedance match between the RF signal source 720 and the cavity plus load impedance, which should result in a reduction of the reflected signal power and/or the reflected-to-forward signal power ratio. In most cases, the system controller 712 may strive to configure the circuit 800 in a state in which a maximum electromagnetic field intensity is achieved in the cavity 760, and/or a maximum quantity of power is absorbed by the load 764, and/or a minimum quantity of power is reflected by the load 764.

FIG. 9 is a schematic diagram of a double-ended variable impedance matching network 900, in accordance with another example embodiment. Network 900 includes a double-ended input 901-1, 901-2 (referred to as input 901), a double-ended output 902-1, 902-2 (referred to as output 902), and a network of passive components connected in a ladder arrangement between the input 901 and output 902. The ladder arrangement includes a first plurality, N, of discrete inductors 911-914 coupled in series with each other between input 901-1 and output 902-1, where N may be an integer between 2 and 10, or more. The ladder arrangement also includes a second plurality, N, of discrete inductors 916-919 coupled in series with each other between input 901-2 and output 902-2. Additional discrete inductors 915 and 920 may be coupled between intermediate nodes 925, 926 and the output nodes 902-1, 902-2. Further still, the ladder arrangement includes a third plurality of discrete inductors 921-923 coupled in series with each other between inputs 901-1 and 901-2, and an additional discrete inductor 924 coupled between nodes 925 and 926. For example, the fixed inductors 915, 920, 924 each may have inductance values in a range of about 50 nH to about 800 nH, although the inductance values may be lower or higher, as well.

The series arrangement of inductors 911-914 may be considered a first variable inductor (e.g., inductor 811, FIG. 8), the series arrangement of inductors 916-919 may be considered a second variable inductor (e.g., inductor 816, FIG. 8), and series arrangement of inductors 921-923 may be considered a third variable inductor (e.g., inductor 821, FIG. 8). To control the variability of the "variable inductors", network 900 includes a plurality of bypass switches 931-934, 936-939, 941, and 943, where each switch 931-934, 936-939, 941, and 943 is coupled in parallel across the terminals of one of inductors 911-914, 916-919, 921, and 923. Switches 931-934, 936-939, 941, and 943 may be implemented as transistors, mechanical relays or mechanical switches, for example. The electrically conductive state of each switch 931-934, 936-939, 941, and 943 (i.e., open or closed) is controlled using control signals 951-954, 956-959, 961, 963 from the system controller (e.g., control signals from system controller 712 provided over connection 716, FIG. 7).

In an embodiment, sets of corresponding inductors in the two paths between input 901 and output 902 have substantially equal values, and the conductive state of the switches for each set of corresponding inductors is operated in a paired manner, meaning that the switch states during operation are controlled to be the same as each other, at any given time, in order to ensure that the RF signals conveyed to outputs 902-1 and 902-2 are balanced. For example, inductors 911 and 916 may constitute a first "set of corresponding inductors" or "paired inductors" with substantially equal values, and during operation, the states of switches 931 and 936 are controlled to be the same (e.g., either both open or both closed), at any given time. Similarly, inductors 912 and 917 may constitute a second set of corresponding inductors with equal inductance values that are operated in a paired manner, inductors 913 and 918 may constitute a third set of corresponding inductors with equal inductance values that are operated in a paired manner, and inductors 914 and 919 may constitute a fourth set of corresponding inductors with equal inductance values that are operated in a paired manner.

For each parallel inductor/switch combination, substantially all current flows through the inductor when its corresponding switch is in an open or non-conductive state, and substantially all current flows through the switch when the switch is in a closed or conductive state. For example, when all switches 931-934, 936-939, 941, and 943 are open, as illustrated in FIG. 9, substantially all current flowing between input and output nodes 901-1, 902-1 flows through the series of inductors 911-915, and substantially all current flowing between input and output nodes 901-2, 902-2 flows through the series of inductors 916-920 (as modified by any current flowing through inductors 921-923 or 924). This configuration represents the maximum inductance state of the network 900 (i.e., the state of network 900 in which a maximum inductance value is present between input and output nodes 901, 902). Conversely, when all switches 931-934, 936-939, 941, and 943 are closed, substantially all current flowing between input and output nodes 901, 902 bypasses the inductors 911-914 and 916-919 and flows instead through the switches 931-934 or 936-939, inductors 915 or 920, and the conductive interconnections between the input and output nodes 901, 902 and switches 931-934, 936-939. This configuration represents the minimum inductance state of the network 900 (i.e., the state of network 900 in which a minimum inductance value is present between input and output nodes 901, 902). Ideally, the minimum inductance value would be near zero inductance. However, in practice a relatively small inductance is present in the minimum inductance state due to the cumulative inductances of the switches 931-934 or 936-939, inductors 915 or 920, and the conductive interconnections between nodes 901, 902 and the switches 931-934 or 936-939. For example, in the minimum inductance state, a trace inductance for the series combination of switches 931-934 or 936-939 may be in a range of about 10 nH to about 400 nH, although the trace inductance may be smaller or larger, as well. Larger, smaller, or substantially similar trace inductances also may be inherent in each of the other network states, as well, where the trace inductance for any given network state is a summation of the inductances of the sequence of conductors and switches through which the current primarily is carried through the network 900.

Starting from the maximum inductance state in which all switches 931-934, 936-939 are open, the system controller may provide control signals 951-954, 956-959 that result in the closure of any combination of switches 931-934, 936-939 in order to reduce the inductance of the network 900 by bypassing corresponding combinations of inductors 911-914, 916-919.

Similar to the embodiment of FIG. 8, in circuit 900, the first and second pluralities of discrete inductors 911-914, 916-919 and fixed inductor 924 correspond to a "cavity matching portion" of the circuit. Similar to the embodiment described above in conjunction with FIG. 5A, in one embodiment, each inductor 911-914, 916-919 has substantially the same inductance value, referred to herein as a normalized value of I. For example, each inductor 911-914, 916-919 may have a value in a range of about 1 nH to about 400 nH, or some other value. In such an embodiment, the maximum inductance value between input node 901-1 and 902-2, and the maximum inductance value between input node 901-2 and 902-2 (i.e., when all switches 931-934, 936-939 are in an open state) would be about N×I, plus any trace inductance that may be present in the network 900 when it is in the maximum inductance state. When any n switches are in a closed state, the inductance value between corresponding input and output nodes would be about (N-n) x1 (plus trace inductance).

As also explained in conjunction with FIG. 5A, above, in an alternate embodiment, the inductors 911-914, 916-919 may have different values from each other. For example, moving from the input node 901-1 toward the output node 902-1, the first inductor 911 may have a normalized inductance value of I, and each subsequent inductor 912-914 in the series may have a larger or smaller inductance value. Similarly, moving from the input node 901-2 toward the output node 902-2, the first inductor 916 may have a normalized inductance value of I, and each subsequent inductor 917-919 in the series may have a larger or smaller inductance value. For example, each subsequent inductor 912-914 or 917-919 may have an inductance value that is a multiple (e.g., about twice or half) the inductance value of the nearest downstream inductor 911-914 or 916-918. The example of Table 1, above, applies also to the first series inductance path between input and output nodes 901-1 and 902-1, and the second series inductance path between input and output nodes 901-2 and 902-1. More specifically, inductor/switch combinations 911/931 and 916/956 each are analogous to inductor/switch combination 501/511, inductor/switch combinations 912/932 and 917/957 each are analogous to inductor/switch combination 502/512, inductor/switch combinations 913/933 and 918/958 each are analogous to inductor/switch combination 503/513, and inductor/switch combinations 914/934 and 919/959 each are analogous to inductor/switch combination 504/514.

Assuming that the trace inductance through series inductors 911-914 in the minimum inductance state is about 10 nH, and the range of inductance values achievable by the series inductors 911-914 is about 10 nH (trace inductance) to about 400 nH, the values of inductors 911-914 may be, for example, about 10 nH, about 20 nH, about 40 nH, about 80 nH, and about 160 nH, respectively. The combination of series inductors 916-919 may be similarly or identically configured. Of course, more or fewer than four inductors 911-914 or 916-919 may be included in either series combination between input and output nodes 901-1/902-1 or 901-2/902-2, and the inductors within each series combination may have different values from the example values given above.

Although the above example embodiment specifies that the number of switched inductances in each series combination between corresponding input and output nodes equals four, and that each inductor 911-914, 916-919 has a value that is some multiple of a value of I, alternate embodiments of variable series inductance networks may have more or fewer than four inductors, different relative values for the inductors, and/or a different configuration of inductors (e.g., differently connected sets of parallel and/or series coupled inductors). Either way, by providing a variable inductance network in an impedance matching network of a defrosting system, the system may be better able to match the ever-changing cavity plus load impedance that is present during a defrosting operation.

As with the embodiment of FIG. 8, the third plurality of discrete inductors 921-923 corresponds to an "RF signal source matching portion" of the circuit. The third variable inductor comprises the series arrangement of inductors 921-923, where bypass switches 941 and 943 enable inductors 921 and 923 selectively to be connected into the series arrangement or bypassed based on control signals 961 and 963. In an embodiment, each of inductors 921-923 may have equal values (e.g., values in a range of about 1 nH to about 100 nH. In an alternate embodiment, the inductors 921-923 may have different values from each other. Inductor 922 is electrically connected between input terminals 901-1 and 901-2 regardless of the state of bypass switches 941 and 943. Accordingly, the inductance value of inductor 922 serves as a baseline (i.e., minimum) inductance between input terminals 901-1 and 901-2. According to an embodiment, the first and third inductors 921, 923 may have inductance values that are a ratio of each other. For example, when the first inductor 921 has a normalized inductance value of J, inductor 923 may have a value of 2*J, 3*J, 4*J, or some other ratio, in various embodiments.

FIG. 10 is a schematic diagram of a double-ended variable impedance matching circuit 1000 that may be incorporated into a defrosting system (e.g., system 100, 200, 700, FIGS. 1, 2, 7), in accordance with another example embodiment. As with the matching circuits 800, 900 (FIGS. 8 and 9), according to an embodiment, the variable matching circuit 1000 includes a network of fixed-value and variable passive components.

Circuit 1000 includes a double-ended input 1001-1, 1001-2 (referred to as input 1001), a double-ended output 1002-1, 1002-2 (referred to as output 1002), and a network of passive components connected between the input 1001 and output 1002. For example, when connected into system 700, the first input 1001-1 may be connected to a first conductor of balanced conductor 728-4, and the second input 1001-2 may be connected to a second conductor of balanced conductor 728-4. Similarly, the first output 1002-1 may be connected to a first conductor of balanced conductor 728-5, and the second output 1002-2 may be connected to a second conductor of balanced conductor 728-5.

In the specific embodiment illustrated in FIG. 10, circuit 1000 includes a first variable capacitance network 1011 and a first inductor 1015 connected in series between input 1001-1 and output 1002-1, a second variable capacitance network 1016 and a second inductor 1020 connected in series between input 1001-2 and output 1002-2, and a third variable capacitance network 1021 connected between nodes 1025 and 1026. The inductors 1015, 1020 are relatively large in both size and inductance value, in an embodiment, as they may be designed for relatively low frequency (e.g., about 40.66 MHz to about 40.70 MHz) and high power (e.g., about 50 W to about 500 W) operation. For example, inductors 1015, 1020 each may have a value in a range of about 100 nH to about 1000 nH (e.g., in a range of about 200 nH to about 600 nH), although their values may be lower and/or higher, in other embodiments. According to an embodiment, inductors 1015, 1020 are fixed-value, lumped inductors (e.g., coils, discrete inductors, distributed inductors (e.g., printed coils), wirebonds, transmission lines, and/or other inductive components, in various embodiments). In other embodiments, the inductance value of inductors 1015, 1020 may be variable. In any event, the inductance values of inductors 1015, 1020 are substantially the same either permanently (when inductors 1015, 1020 are fixed-value) or at any given time (when inductors 1015, 1020 are variable, they are operated in a paired manner), in an embodiment.

The first and second variable capacitance networks 1011, 1016 correspond to "series matching portions" of the circuit 1000. According to an embodiment, the first variable capacitance network 1011 includes a first fixed-value capacitor 1012 coupled in parallel with a first variable capacitor 1013. The first fixed-value capacitor 1012 may have a capacitance value in a range of about 1 pF to about 100 pF, in an embodiment. As was described previously in conjunction with FIG. 5B, the first variable capacitor 1013 may include a network of capacitive components that may be selectively coupled together to provide capacitances in a range of 0 pF to about 100 pF. Accordingly, the total capacitance value provided by the first variable capacitance network 1011 may be in a range of about 1 pF to about 200 pF, although the range may extend to lower or higher capacitance values, as well.

Similarly, the second variable capacitance network 1016 includes a second fixed-value capacitor 1017 coupled in parallel with a second variable capacitor 1018. The second fixed-value capacitor 1017 may have a capacitance value in a range of about 1 pF to about 100 pF, in an embodiment. As was described previously in conjunction with FIG. 5B, the second variable capacitor 1018 may include a network of capacitive components that may be selectively coupled together to provide capacitances in a range of 0 pF to about 100 pF. Accordingly, the total capacitance value provided by the second variable capacitance network 1016 may be in a range of about 1 pF to about 200 pF, although the range may extend to lower or higher capacitance values, as well.

In any event, to ensure the balance of the signals provided to outputs 1002-1 and 1002-2, the capacitance values of the first and second variable capacitance networks 1011, 1016 are controlled to be substantially the same at any given time, in an embodiment. For example, the capacitance values of the first and second variable capacitors 1013, 1018 may be controlled so that the capacitance values of the first and second variable capacitance networks 1011, 1016 are substantially the same at any given time. The first and second variable capacitors 1013, 1018 are operated in a paired manner, meaning that their capacitance values during operation are controlled, at any given time, to ensure that the RF signals conveyed to outputs 1002-1 and 1002-2 are balanced. The capacitance values of the first and second fixed-value capacitors 1012, 1017 may be substantially the same, in some embodiments, although they may be different, in others.

The "shunt matching portion" of the variable impedance matching network 1000 is provided by the third variable capacitance network 1021 and fixed inductors 1015, 1020. According to an embodiment, the third variable capacitance network 1021 includes a third fixed-value capacitor 1023 coupled in parallel with a third variable capacitor 1024. The third fixed-value capacitor 1023 may have a capacitance value in a range of about 1 pF to about 500 pF, in an embodiment. As was described previously in conjunction with FIG. 5B, the third variable capacitor 1024 may include a network of capacitive components that may be selectively coupled together to provide capacitances in a range of 0 pF to about 200 pF. Accordingly, the total capacitance value provided by the third variable capacitance network 1021 may be in a range of about 1 pF to about 700 pF, although the range may extend to lower or higher capacitance values, as well.

Because the states of the variable capacitance networks 1011, 1016, 1021 may be changed to provide multiple capacitance values, the variable capacitance networks 1011, 1016, 1021 are configurable to optimally match the impedance of the cavity plus load (e.g., cavity 760 plus load 764, FIG. 7) to the RF signal source (e.g., RF signal source 720, 720', FIG. 7). By varying the capacitance values of capacitors 1013, 1018, 1024 in circuit 1000, the system controller (e.g., system controller 712, FIG. 7) may increase or decrease the impedance transformation provided by circuit 1000. Desirably, the capacitance value changes improve the overall impedance match between the RF signal source 720 and the impedance of the cavity plus load, which should result in a reduction of the reflected signal power and/or the reflected-to-forward signal power ratio. In most cases, the system controller 712 may strive to configure the circuit 1000 in a state in which a maximum electromagnetic field intensity is achieved in the cavity 760, and/or a maximum quantity of power is absorbed by the load 764, and/or a minimum quantity of power is reflected by the load 764.

It should be understood that the variable impedance matching circuits 800, 900, 100 illustrated in FIGS. 8-10 are but three possible circuit configurations that may perform the desired double-ended variable impedance transformations. Other embodiments of double-ended variable impedance matching circuits may include differently arranged inductive or capacitive networks, or may include passive networks that include various combinations of inductors, capacitors, and/or resistors, where some of the passive components may be fixed-value components, and some of the passive components may be variable-value components (e.g., variable inductors, variable capacitors, and/or variable resistors). Further, the double-ended variable impedance matching circuits may include active devices (e.g., transistors) that switch passive components into and out of the network to alter the overall impedance transformation provided by the circuit.

A particular physical configuration of a defrosting system will now be described in conjunction with FIG. 11. More particularly, FIG. 11 is a cross-sectional, side view of a defrosting system 1100, in accordance with an example embodiment. The defrosting system 1100 generally includes a defrosting cavity 1174, a user interface (not shown), a system controller 1130, an RF signal source 1120, power supply and bias circuitry (not shown), power detection circuitry 1180, a variable impedance matching network 1160, a first electrode 1170, and a second electrode 1172, in an embodiment. According to an embodiment, the system controller 1130, RF signal source 1120, power supply and bias circuitry, and power detection circuitry 1180, may form portions of a first module (e.g., RF module 1300, FIG. 13), and the variable impedance matching network 1160 may form portions of a second module (e.g., either module 1200 or 1240, FIGS. 12A, 12B). In addition, in some embodiments, defrosting system 1100 may include temperature sensor(s), and/or IR sensor(s) 1192.

The defrosting system 1100 is contained within a containment structure 1150, in an embodiment. According to an embodiment, the containment structure 1150 may define two or more interior areas, such as the defrosting cavity 1174 and a circuit housing area 1178. The containment structure 1150 includes bottom, top, and side walls. Portions of the interior surfaces of some of the walls of the containment structure 1150 may define the defrosting cavity 1174. The defrosting cavity 1174 includes a capacitive defrosting arrangement with first and second parallel plate electrodes 1170, 1172 that are separated by an air cavity within which a load 1164 to be defrosted may be placed. For example, the first electrode 1170 may be positioned above the air cavity, and a second electrode 1172 may be, in the single-ended system embodiment, provided by a conductive portion of the containment structure 1150 (e.g., a portion of the bottom wall of the containment structure 1150). Alternatively, in the single- or double-ended system embodiments, the second electrode 1172 may be formed from a conductive plate, as shown, that is distinct from the containment structure 1150. According to an embodiment, non-electrically conductive support structure(s) 1154 may be employed to suspend the first electrode 1170 above the air cavity, to electrically isolate the first electrode 1170 from the containment structure 1150, and to hold the first electrode 1170 in a fixed physical orientation with respect to the air cavity. In addition, to avoid direct contact between the load 1164 and the second electrode 1172, a non-conductive support and barrier structure 1156 may be positioned over the bottom surface of the containment structure 1150.

According to an embodiment, the containment structure 1150 is at least partially formed from conductive material, and the conductive portion(s) of the containment structure may be grounded to provide a ground reference for various electrical components of the system. Alternatively, at least the portion of the containment structure 1150 that corresponds to the second electrode 1172 may be formed from conductive material and grounded.

The temperature sensor(s) and/or IR sensor(s) 1192 may be positioned in locations that enable the temperature of the load 1164 to be sensed both before, during, and after a defrosting operation. According to an embodiment, the temperature sensor(s) and/or IR sensor(s) 1192 are configured to provide load temperature estimates to the system controller 1130.

Some or all of the various components of the system controller 1130, the RF signal source 1120, the power supply and bias circuitry (not shown), the power detection circuitry 1180, and the variable impedance matching network 1160, may be coupled to one or more common substrates (e.g., substrate 1152) within the circuit housing area 1178 of the containment structure 1150, in an embodiment. For example, some of all of the above-listed components may be included in an RF module (e.g., RF module 1300, FIG. 13) and a variable impedance matching circuit module (e.g., a variation of module 1200 or 1240, FIGS. 12A, 12B), which are housed within the circuit housing area 1178 of the containment structure 1150. According to an embodiment, the system controller 1130 is coupled to the user interface, RF signal source 1120, variable impedance matching network 1160, and power detection circuitry 1180 through various conductive interconnects on or within the common substrate 1152, and/or through various cables (e.g., coaxial cables), not shown. In addition, the power detection circuitry 1180 is coupled along the transmission path 1148 between the output of the RF signal source 1120 and the input to the variable impedance matching network 1160, in an embodiment. For example, the substrate 1152 (or the substrates defining an RF module 1300 or variable impedance matching network module 1200, 1240) may include a microwave or RF laminate, a polytetrafluoroethylene (PTFE) substrate, a printed circuit board (PCB) material substrate (e.g., FR-4), an alumina substrate, a ceramic tile, or another type of substrate. In various alternate embodiments, various ones of the components may be coupled to different substrates with electrical interconnections between the substrates and components. In still other alternate embodiments, some or all of the components may be coupled to a cavity wall, rather than being coupled to a distinct substrate.

In either a single-ended or double-ended embodiment, the first electrode 1170 is electrically coupled to the RF signal source 1120 through a variable impedance matching network 1160 and a transmission path 1148, in an embodiment. In a double-ended embodiment, the second electrode 1172 also is electrically coupled to the RF signal source 1120 through a variable impedance matching network 1160 and a transmission path 1148. As discussed previously, single-ended embodiments of the variable impedance matching network 1160 may include a single-ended variable inductance network (e.g., network 400, FIG. 4A) or a single-ended variable capacitance network (e.g., network 440, FIG. 4B). Alternatively, double-ended embodiments of the variable impedance matching network 1160 may include a double-ended variable inductance network (e.g., network 800, 900, FIGS. 8, 9) or a double-ended variable capacitance network (e.g., network 1000, FIG. 10). In an embodiment, the variable impedance matching network 1160 is implemented as a module (e.g., one of modules 1200, 1240, FIGS. 12A, 12B), or is coupled to the common substrate 1152 and located within the circuit housing area 1178. Conductive structures (e.g., conductive vias, traces, cables, wires, and other structures) may provide for electrical communication between the circuitry within the circuit housing area 1178 and electrodes 1170, 1172.

According to various embodiments, the circuitry associated with the single-ended or double-ended variable impedance matching networks discussed herein may be implemented in the form of one or more modules, where a "module" is defined herein as an assembly of electrical components coupled to a common substrate. For example, FIGS. 12A and 12B are a perspective views of examples of modules 1200, 1240 that include a double-ended variable impedance matching network (e.g., networks 800, 900, 1000, FIGS. 8-10), in accordance with two example embodiments. More specifically, FIG. 12A illustrates a module 1200 that houses a variable inductance impedance matching network (e.g., networks 800, 900, FIGS. 8, 9), and FIG. 12B illustrates a module 1240 that houses a variable capacitance impedance matching network (e.g., network 1000, FIG. 10).

Each of the modules 1200, 1240 includes a printed circuit board (PCB) 1204, 1244 with a front side 1206, 1246 and an opposite back side 1208, 1248. The PCB 1204, 1244 is formed from one or more dielectric layers, and two or more printed conductive layers. Conductive vias (not visible in FIGS. 12A, 12B) may provide for electrical connections between the multiple conductive layers. At the front side 1206, 1246, a plurality of printed conductive traces formed from a first printed conductive layer provides for electrical connectivity between the various components that are coupled to the front side 1206, 1246 of the PCB 1204, 1244. Similarly, at the back side 1208, 1248, a plurality of printed conductive traces formed from a second printed conductive layer provides for electrical connectivity between the various components that are coupled to the back side 1208, 1248 of the PCB 1204, 1244.

Figure 12A:
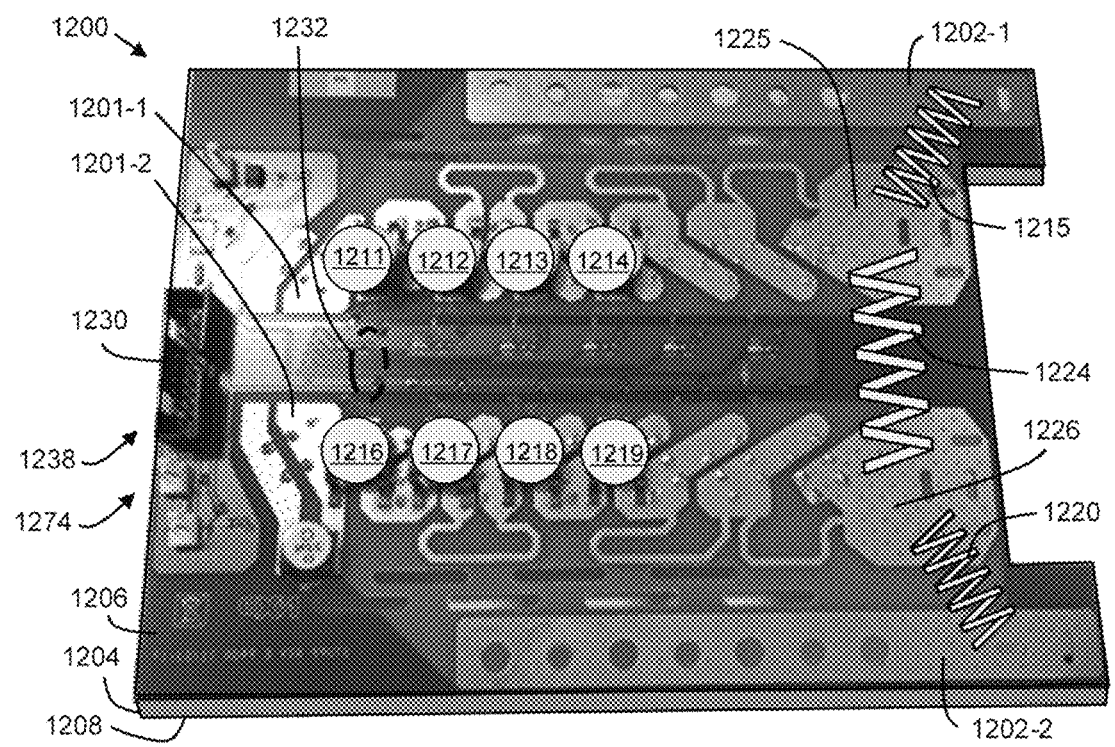
FIG. 12A is a perspective view of a double-ended variable impedance matching network module with variable inductances, in accordance with an example embodiment.
Figure 12B:
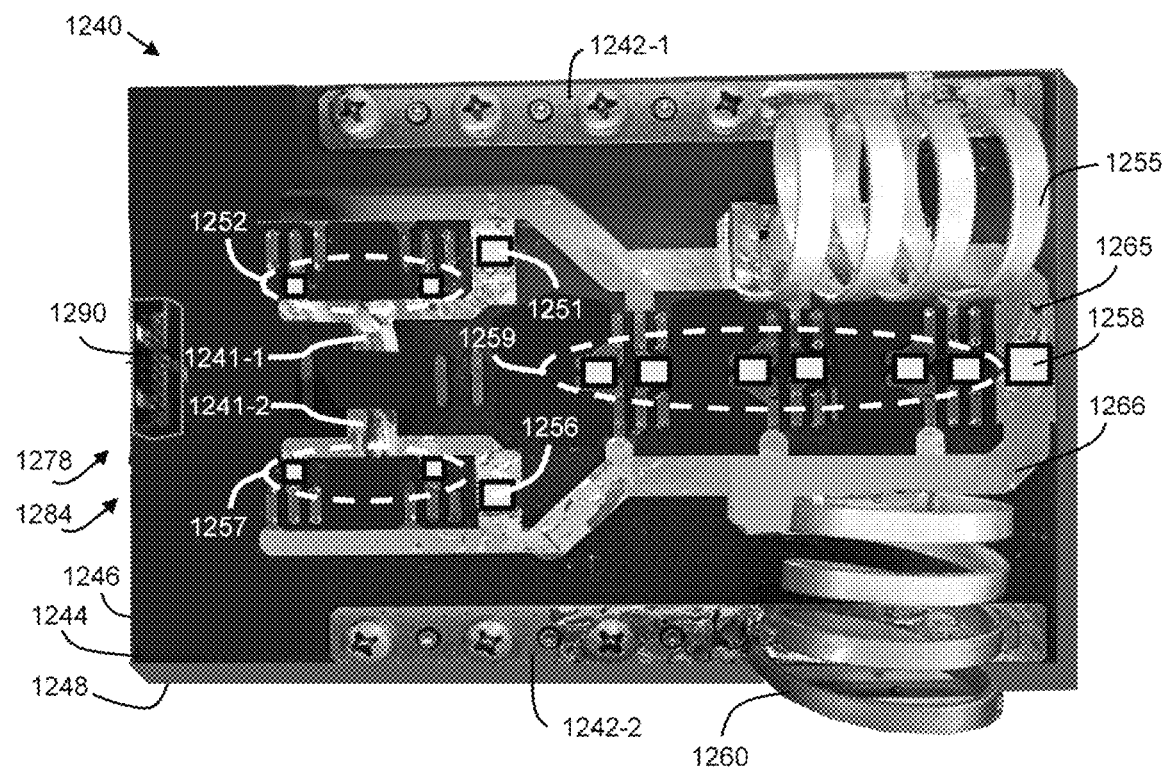
FIG. 12B is a perspective view of a double-ended variable impedance matching network module with variable capacitances, in accordance with another example embodiment.

According to an embodiment, each PCB 1204, 1244 houses an RF input connector 1238, 1278 (e.g., coupled to back side 1208, 1248 and thus not visible in the views of FIGS. 12A, 12B, but corresponding to connector 738, FIG. 7) and a balun 1274, 1284 (e.g., coupled to back side 1208, 1248 and thus not visible in the view of FIGS. 12A, 12B, but corresponding to balun 774, FIG. 7). The input connector 1238, 1278 is configured to be electrically connected to an RF subsystem (e.g., subsystem 310, 710, FIGS. 3, 7) with a connection (e.g., connection 728-3, FIG. 7) such as a coaxial cable or other type of conductor. In such an embodiment, an unbalanced RF signal received by the balun 1274, 1284 from the RF input connector 1238, 1278 is converted to a balanced signal, which is provided over a pair of balanced conductors (e.g., connections 728-4, FIG. 7) to a double-ended input that includes first and second inputs 1201-1, 1201-2 or 1241-1, 1242-2. The connection between the input connector 1238, 1278 and the balun 1274, 1284, and the connections between the balun 1274, 1284 and the inputs 1201-1, 1201-2, 1241-1, 1241-2 each may be implemented using conductive traces and vias formed on and in the PCB 1204, 1244. In an alternate embodiment, as discussed above, an alternate embodiment may include a balanced amplifier (e.g., balanced amplifier 724', FIG. 7), which produces a balanced signal on connections (e.g., conductors 728-1', FIG. 7) that can be directly coupled to the inputs 1201-1, 1201-2, 1241-1, 1241-2. In such an embodiment, the balun 1274, 1284 may be excluded from the module 1200, 1240.

In addition, each PCB 1204, 1244 houses circuitry associated with a double-ended variable impedance matching network (e.g., network 772, 800, 900, 1000, FIGS. 7-10). Referring first to FIG. 12A, which corresponds to a module 1200 that houses a variable inductance impedance matching network (e.g., networks 800, 900, FIGS. 8, 9), the circuitry housed by the PCB 1204 includes the double-ended input 1201-1, 1201-2 (e.g., inputs 901-1, 901-2, FIG. 9), a double-ended output 1202-1, 1202-2 (e.g., outputs 902-1, 902-2, FIG. 9), a first plurality of inductors 1211, 1212, 1213, 1214, 1215 (e.g., inductors 911-915, FIG. 9) coupled in series between a first input 1201-1 of the double-ended input and a first output 1202-1 of the double-ended output, a second plurality of inductors 1216, 1217, 1218, 1219, 1220 (e.g., inductors 916-920, FIG. 9) coupled in series between a second input 1201-2 of the double-ended input and a second output 1202-2 of the double-ended output, a third plurality of inductors (not visible in the view of FIG. 12, but corresponding to inductors 921-923, FIG. 9, for example) coupled in series between the first and second inputs 1201-1, 1201-2, and one or more additional inductors 1224 (e.g., inductor 924, FIG. 9) coupled between nodes 1225 and 1226 (e.g., nodes 925, 926).

A plurality of switches or relays (e.g., not visible in the view of FIG. 12, but corresponding to switches 931-934, 936-939, 941, 943, FIG. 9, for example) also are coupled to the PCB 1204. For example, the plurality of switches or relays may be coupled to the front side 1206 or to the back side 1208 of the PCB 1204. Each of the switches or relays is electrically connected in parallel across one of the inductors 1211-1214, 1216-1219, or one of the inductors (e.g., inductors 921, 923, FIG. 9) between inputs 1202-1 and 1202-2, in an embodiment. A control connector 1230 is coupled to the PCB 1204, and conductors of the control connector 1230 are electrically coupled to conductive traces 1232 to provide control signals to the switches (e.g., control signals 951-954, 956-959, 961, 963, FIG. 9), and thus to switch the inductors into or out of the circuit, as described previously. As shown in FIG. 12A, fixed-value inductors 1215, 1220 (e.g., inductors 915, 920, FIG. 9) may be formed from relatively large coils, although they may be implemented using other structures as well. Further, as shown in the embodiment of FIG. 12A, the conductive features corresponding to outputs 1202-1, 1202-2 may be relatively large, and may be elongated for direct attachment to the electrodes (e.g., electrodes 740, 750, FIG. 7) of the system.

Referring now to FIG. 12B, which corresponds to a module 1240 that houses a variable capacitance impedance matching network (e.g., network 1000, FIG. 10), the circuitry housed by the PCB 1244 includes a double-ended input 1241-1, 1241-2 (e.g., inputs 1001-1, 1001-2, FIG. 10), a double-ended output 1242-1, 1242-2 (e.g., outputs 1002-1, 1002-2, FIG. 10), a first plurality of capacitors 1251, 1252 (e.g., capacitors 1012, 1013, FIG. 10) that comprise a first variable capacitance network (e.g., network 1011, FIG. 10) coupled between a first input 1241-1 of the double-ended input and a first intermediate node 1265 (e.g., node 1025, FIG. 10), a second plurality of capacitors 1256, 1257 (e.g., capacitors 1017, 1018, FIG. 10) that comprise a second variable capacitance network (e.g., network 1016, FIG. 10) coupled between a second input 1241-2 of the double-ended input and a second intermediate node 1266 (e.g., node 1026, FIG. 10), a third plurality of capacitors 1258, 1259 (e.g., capacitors 1023, 1024, FIG. 10) coupled between nodes 1265, 1266 (e.g., nodes 1025, 1026), and one or more additional inductors 1255, 1260 (e.g., inductors 1015, 1020, FIG. 10) coupled between nodes 1265 and 1266 and outputs 1242-1, 1242-2.

The first, second, and third pluralities of capacitors each include a fixed capacitor 1251, 1256, 1258 (e.g., capacitors 1012, 1017, 1023, FIG. 10), and a set of one or more capacitors 1252, 1257, 1259 that make up a variable capacitor (e.g., variable capacitors 1013, 1018, 1024). Each set of variable capacitors 1252, 1257, 1259 may be implemented using a capacitive network, such as network 500, FIG. 5. A plurality of switches or relays (e.g., not visible in the view of FIG. 12B, but corresponding to switches 551-554, FIG. 5, for example) also are coupled to the PCB 1244. For example, the plurality of switches or relays may be coupled to the front side 1246 or to the back side 1248 of the PCB 1244. Each of the switches or relays is electrically connected in series with a terminal of a different one of the capacitors associated with the variable capacitors 1252, 1257, 1259. A control connector 1290 is coupled to the PCB 1244, and conductors of the control connector (not shown in FIG. 12B) are electrically coupled to conductive traces within PCB 1244 to provide control signals to the switches (e.g., control signals 561-564, FIG. 5), and thus to switch the capacitors into or out of the circuit, as described previously.

As shown in FIG. 12B, fixed-value inductors 1255, 1260 (e.g., inductors 1015, 1020, FIG. 10) are electrically coupled between intermediate nodes 1265 and 1266 and outputs 1242-1, 1242-2. The inductors 1255, 1260 may be formed from relatively large coils, although they may be implemented using other structures as well. Further, as shown in the embodiment of FIG. 12B, the conductive features corresponding to outputs 1242-1, 1242-2 may be relatively large, and may be elongated for direct attachment to the electrodes (e.g., electrodes 740, 750, FIG. 7) of the system. According to an embodiment, and as illustrated in FIG. 12B, the inductors 1255, 1260 are arranged so that their primary axes are perpendicular to each other (i.e., the axes extending through the centers of the inductors 1255, 1260 are at about 90 degree angles). This may result in significantly reduced electromagnetic coupling between the inductors 1255, 1260. In other embodiments, the inductors 1255, 1260 may be arranged so that their primary axes are parallel, or may be arranged with other angular offsets.

Figure 13:
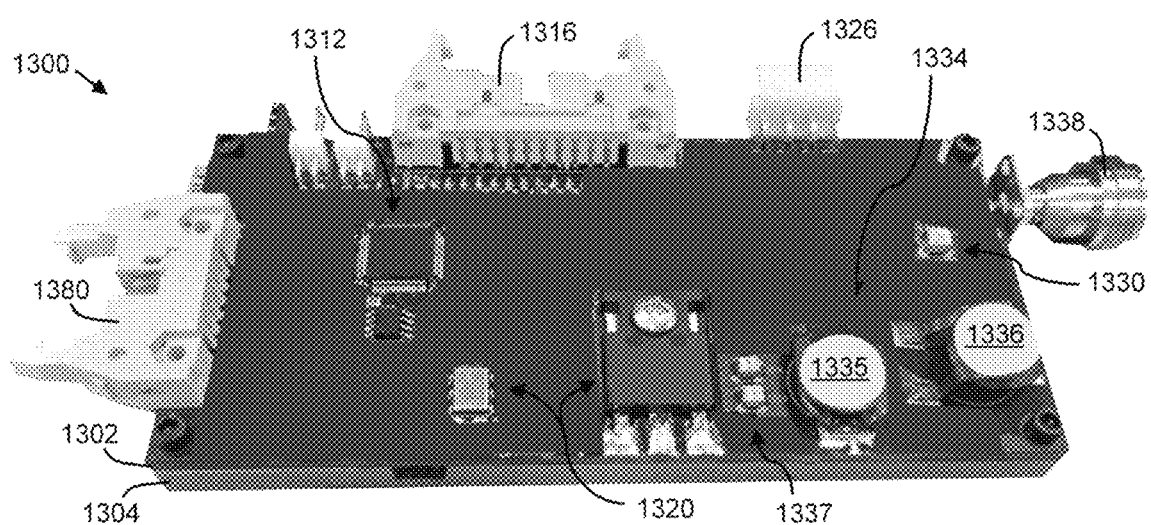
FIG. 13 is a perspective view of an RF module, in accordance with an example embodiment.

In various embodiments, the circuitry associated with the RF subsystem (e.g., RF subsystem 310, 710, FIGS. 3, 7) also may be implemented in the form of one or more modules. For example, FIG. 13 is a perspective view of an RF module 1300 that includes an RF subsystem (e.g., RF subsystem 310, 710, FIGS. 3, 7), in accordance with an example embodiment. The RF module 1300 includes a PCB 1302 coupled to a ground substrate 1304. The ground substrate 1304 provides structural support for the PCB 1302, and also provides an electrical ground reference and heat sink functionality for the various electrical components coupled to the PCB 1302.

According to an embodiment, the PCB 1302 houses the circuitry associated with the RF subsystem (e.g., subsystem 310 or 710, FIGS. 3, 7). Accordingly, the circuitry housed by the PCB 1302 includes system controller circuitry 1312 (e.g., corresponding to system controller 312, 712, FIGS. 3, 7), RF signal source circuitry 1320 (e.g., corresponding to RF signal source 320, 720, FIGS. 3, 7, including an RF signal generator 322, 722 and power amplifier 324, 325, 724), power detection circuitry 1330 (e.g., corresponding to power detection circuitry 330, 730, FIGS. 3, 7), and impedance matching circuitry 1334 (e.g., corresponding to first matching circuitry 334, 734, FIGS. 3, 7).

In the embodiment of FIG. 13, the system controller circuitry 1312 includes a processor IC and a memory IC, the RF signal source circuitry 1320 includes a signal generator IC and one or more power amplifier devices, the power detection circuitry 1330 includes a power coupler device, and the impedance matching circuitry 1334 includes a plurality of passive components (e.g., inductors 1335, 1336 and capacitors 1337) connected together to form an impedance matching network. The circuitry 1312, 1320, 1330, 1334 and the various sub-components may be electrically coupled together through conductive traces on the PCB 1302 as discussed previously in reference to the various conductors and connections discussed in conjunction with FIGS. 3, 7.

RF module 1300 also includes a plurality of connectors 1316, 1326, 1338, 1380, in an embodiment. For example, connector 1380 may be configured to connect with a host system that includes a user interface (e.g., user interface 380, 780, FIGS. 3, 7) and other functionality. Connector 1316 may be configured to connect with a variable matching circuit (e.g., circuit 372, 772, FIGS. 3, 7) to provide control signals to the circuit, as previously described. Connector 1326 may be configured to connect to a power supply to receive system power. Finally, connector 1338 (e.g., connector 336, 736, FIGS. 3, 7) may be configured to connect to a coaxial cable or other transmission line, which enables the RF module 1300 to be electrically connected (e.g., through a coaxial cable implementation of conductor 328-2, 728-3, FIGS. 3, 7) to a variable matching subsystem (e.g., subsystem 370, 770, FIGS. 3, 7). In an alternate embodiment, components of the variable matching subsystem (e.g., variable matching network 370, balun 774, and/or variable matching circuit 772, FIGS. 3, 7) also may be integrated onto the PCB 1302, in which case connector 1338 may be excluded from the module 1300. Other variations in the layout, subsystems, and components of RF module 1300 may be made, as well.

Embodiments of an RF module (e.g., module 1300, FIG. 13) and a variable impedance matching network module (e.g., module 1200, 1240, FIGS. 12A, 12B) may be electrically connected together, and connected with other components, to form a defrosting apparatus or system (e.g., apparatus 100, 200, 300, 700, 1100, FIGS. 1-3, 7, 11). For example, an RF signal connection may be made through a connection (e.g., conductor 728-3, FIG. 7), such as a coaxial cable, between the RF connector 1338 (FIG. 13) and the RF connector 1238 (FIG. 12A) or RF connector 1278 (FIG. 12B), and control connections may be made through connections (e.g., conductors 716, FIG. 7), such as a multi-conductor cable, between the connector 1316 (FIG. 13) and the connector 1230 (FIG. 12A) or connector 1290 (FIG. 12B). To further assemble the system, a host system or user interface may be connected to the RF module 1300 through connector 1380, a power supply may be connected to the RF module 1300 through connector 1326, and electrodes (e.g., electrodes 740, 750, FIG. 7) may be connected to the outputs 1202-1, 1202-2 (FIG. 12A) or 1242-1, 1242-2 (FIG. 12B). Of course, the above-described assembly also would be physically connected to various support structures and other system components so that the electrodes are held in a fixed relationship to each other across a defrosting cavity (e.g., cavity 110, 360, 760, FIGS. 1, 3, 7), and the defrosting apparatus may be integrated within a larger system (e.g., systems 100, 200, FIGS. 1, 2).

Figure 14A:
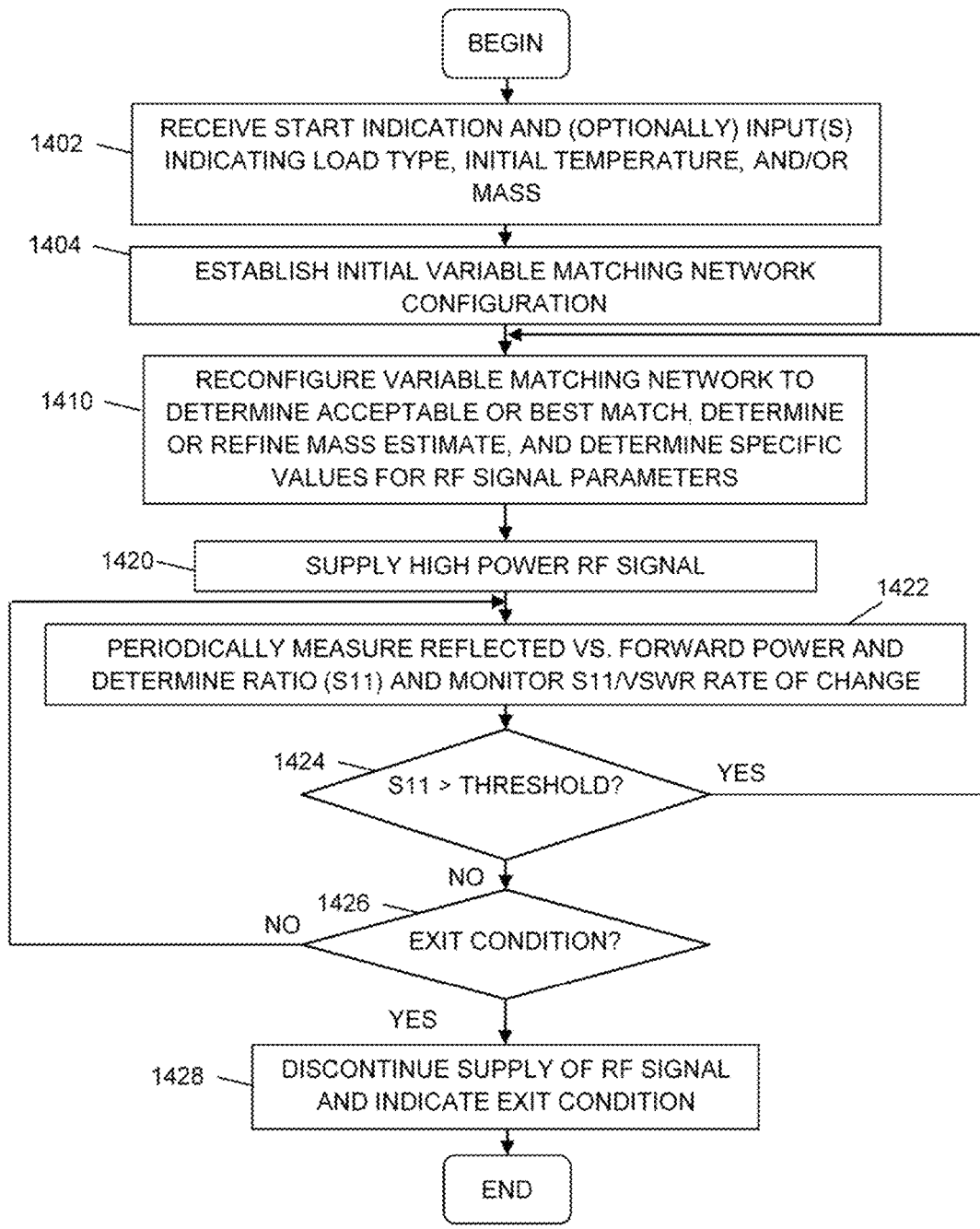
FIG. 14A is a flowchart of a method of operating a defrosting system with dynamic load matching, in accordance with an example embodiment.
Figure 14B:
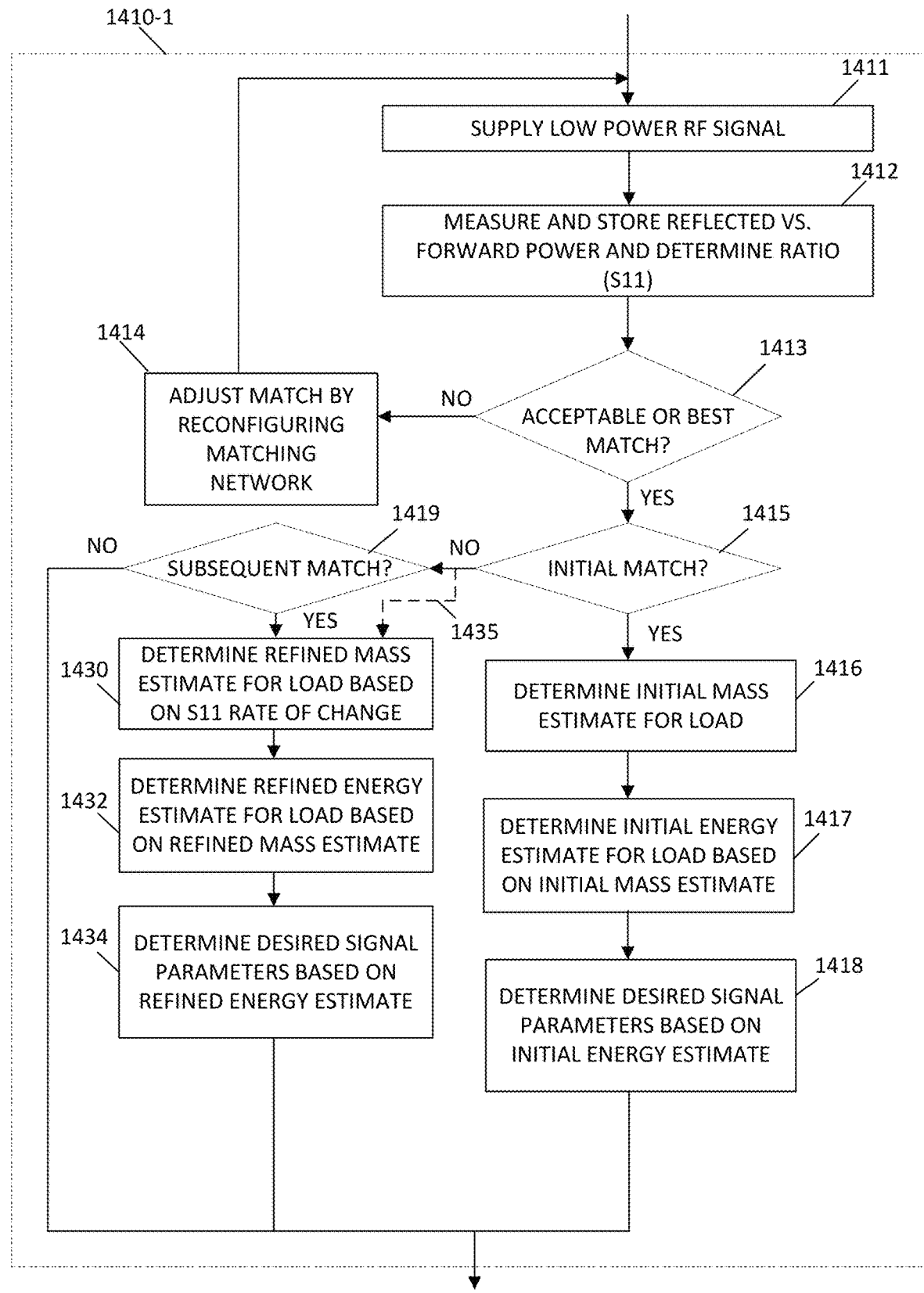
FIG. 14B is a flowchart of a method of variable matching network reconfiguration, load mass estimation, load mass estimate refinement based on the rate of change of one or more signal parameters, and determining desired RF signal parameters in accordance with an example embodiment.
Figure 14C:
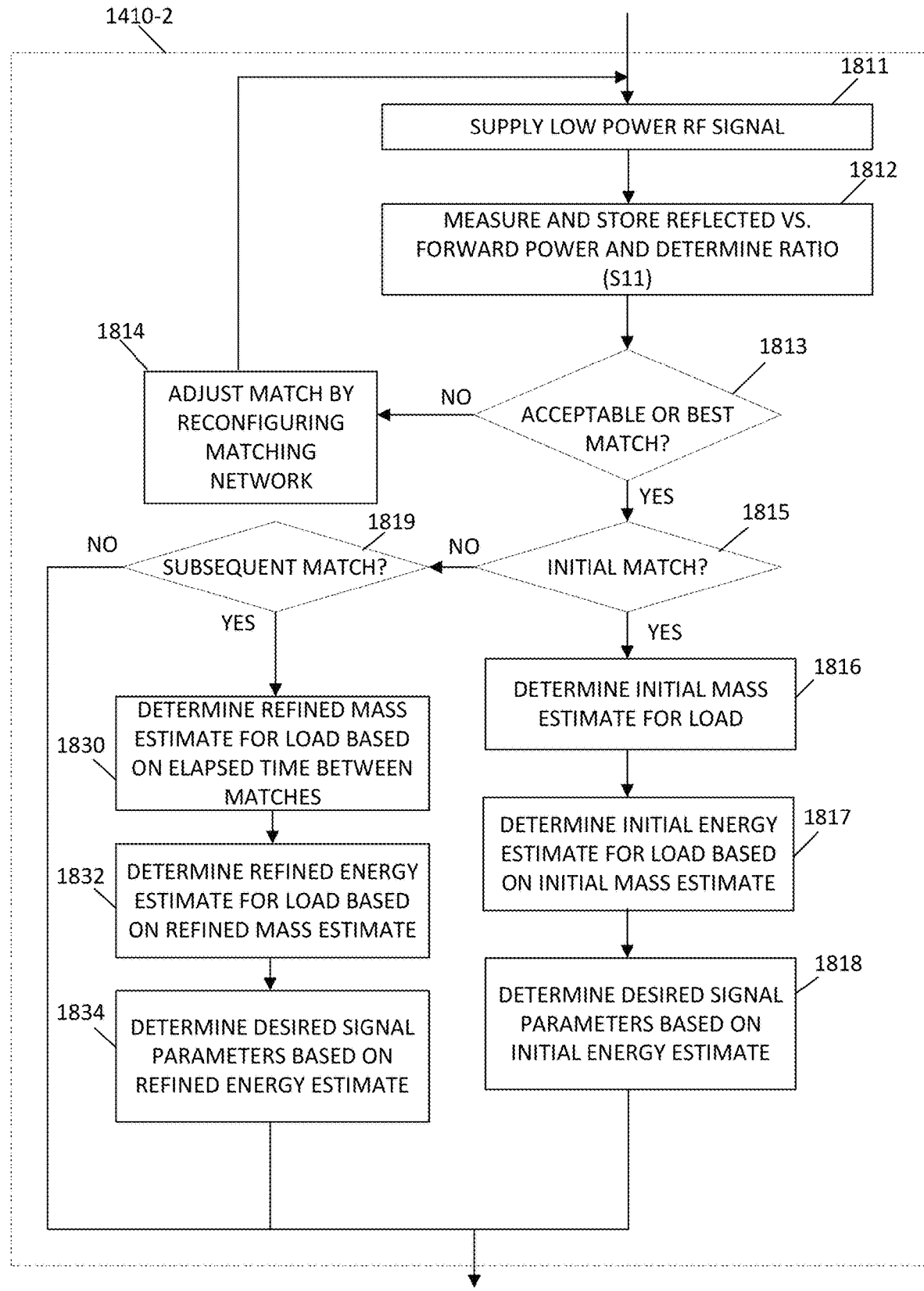
FIG. 14C is a flowchart of a method of variable matching network reconfiguration, load mass estimation, load mass estimate refinement based on time elapsed between matches, and determining desired RF signal parameters in accordance with an example embodiment.
Figure 14D:
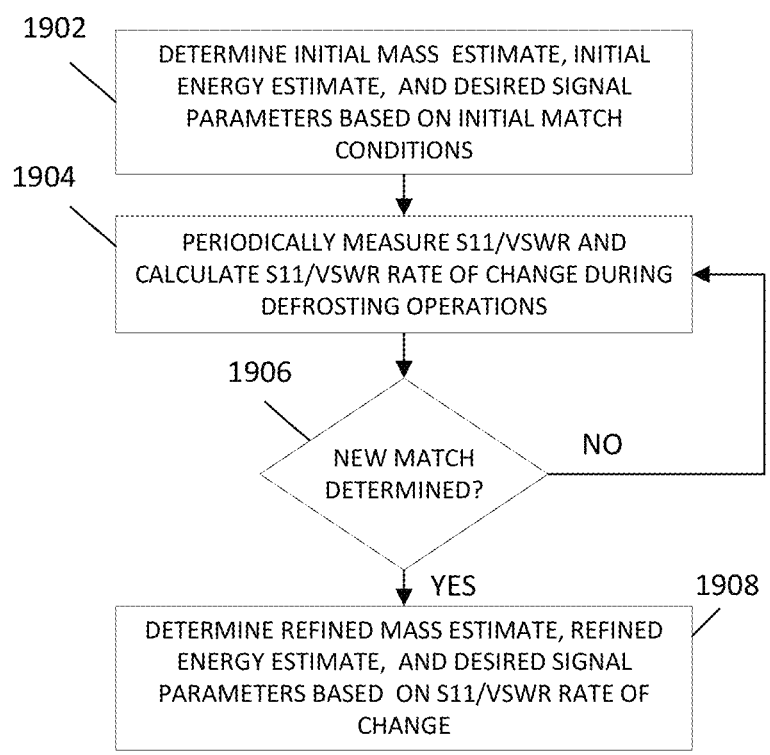
FIG. 14D is a flowchart of a method of refining an initial mass estimate based on the rate of change of one or more signal parameters and refining desired RF signal parameters in accordance with an example embodiment.

Now that embodiments of the electrical and physical aspects of defrosting systems have been described, various embodiments of methods for operating such defrosting systems will now be described in conjunction with FIGS. 14A, 14B, 14C, 14D, and 15. More specifically, FIG. 14A is a flowchart of a method of operating a defrosting system (e.g., system 100, 210, 220, 300, 700, 1100, FIGS. 1-3, 7, 11) with dynamic load matching, in accordance with an example embodiment, and FIG. 14B is a flowchart of a method for performing one of the steps of the flowchart of FIG. 14A, and more specifically the step for determining desired RF signal parameters based on load mass, in accordance with an embodiment. FIG. 14C is a flowchart of an alternative method to FIG. 14B for determining desired RF signal parameters based on load mass, in accordance with an embodiment. FIG. 14D is a flowchart of a method for periodically (e.g., each time a new match is determined for the defrosting system) refining a mass estimate and determining new desired RF signal parameters based on the refined mass estimate, in accordance with an embodiment.

Referring first to FIG. 14A, the method may begin, in block 1402, when the system controller (e.g., system controller 312, 712, 1130, FIGS. 3, 7, 11) receives an indication that a defrosting operation should start. Such an indication may be received, for example, after a user has place a load (e.g., load 364, 764, 1164, FIGS. 3, 7, 11) into the system's defrosting cavity (e.g., cavity 360, 760, 1174, FIGS. 3, 7, 11), has sealed the cavity (e.g., by closing a door or drawer), and has pressed a start button (e.g., of the user interface 380, 780, FIGS. 3, 7). In an embodiment, sealing of the cavity may engage one or more safety interlock mechanisms, which when engaged, indicate that RF power supplied to the cavity will not substantially leak into the environment outside of the cavity. As will be described later, disengagement of a safety interlock mechanism may cause the system controller immediately to pause or terminate the defrosting operation.

According to various embodiments, the system controller optionally may receive additional inputs indicating the load type (e.g., meats, liquids, or other materials), the initial load temperature, and/or the load mass. For example, information regarding the load type may be received from the user through interaction with the user interface (e.g., by the user selecting from a list of recognized load types). Alternatively, the system may be configured to scan a barcode visible on the exterior of the load, or to receive an electronic signal from an RFID device on or embedded within the load. Information regarding the initial load temperature may be received, for example, from one or more temperature sensors and/or IR sensors (e.g., sensors 390, 792, 790, 1192, FIGS. 3, 7, 11) of the system. Information regarding the initial load temperature may be received from the user through interaction with the user interface, or from one or more temperature sensors and/or IR sensors (e.g., sensor 390, 790, 1192, FIGS. 3, 7, 11) of the system. As indicated above, receipt of inputs indicating the load type, initial load temperature, and/or load mass is optional, and the system alternatively may not receive some or all of these inputs. It should be noted that, for embodiments in which load mass is input by the user, the automatic mass determination methods described in connection with block 1416, below, may be skipped, and the user-input mass may be used for determining one or more desired signal parameters for the RF signal that is supplied by the RF signal source.

Upper and lower thresholds may be placed on these user-inputs. For example, if a user accidentally enters a mass that is too high (e.g., above a predefined threshold), a user interface (e.g., a user interface of the control panels 120, 214, 224, FIGS. 1, 2) may provide an indication that the input is invalid. Alternatively, the system may automatically reduce the RF power to a level within the bounds of the upper and lower thresholds and/or may reduce the run time of the defrosting operation.

In block 1404, the system controller provides control signals to the variable matching network (e.g., network 370, 400, 440, 772, 800, 900, 1000, 1160, FIGS. 3, 4A, 4B, 7-11) to establish an initial configuration or state for the variable matching network. As described in detail in conjunction with FIGS. 4A, 4B, 5A, 5B, and 8-10, the control signals affect the values of various inductances and/or capacitances (e.g., inductances 410, 411, 414, 811, 816, 821, FIGS. 4A, 8, and capacitances 444, 448, 1013, 1018, 1024, FIGS. 4B, 10) within the variable matching network. For example, the control signals may affect the states of bypass switches (e.g., switches 511-514, 551-554, 931-934, 936-939, 941, 943, FIGS. 5A, 5B, 9), which are responsive to the control signals from the system controller (e.g., control signals 521-524, 561-564, 951-954, 956-959, 961, 963, FIGS. 5A, 5B, 9).

As also discussed previously, a first portion of the variable matching network may be configured to provide a match for the RF signal source (e.g., RF signal source 320, 720, 1120, FIGS. 3, 7, 11) or the final stage power amplifier (e.g., power amplifier 325, 724, FIGS. 3, 7), and a second portion of the variable matching network may be configured to provide a match for the cavity (e.g., cavity 360, 760, 1174, FIGS. 3, 7, 11) plus the load (e.g., load 364, 764, 1164, FIGS. 3, 7, 11). For example, referring to FIG. 4A, a first shunt, variable inductance network 410 may be configured to provide the RF signal source match, and a second shunt, variable inductance network 416 may be configured to provide the cavity plus load match. Referring to FIG. 4B, a first variable capacitance network 442, in conjunction with a second variable capacitance network 446, may be both configured to provide an optimum match between the RF signal source and the cavity plus load.

It has been observed that a best initial overall match for a frozen load (i.e., a match at which a maximum amount of RF power is absorbed by the load) typically has a relatively high inductance for the cavity matching portion of the matching network, and a relatively low inductance for the RF signal source matching portion of the matching network. For example, FIG. 15 is a chart plotting optimal cavity match setting versus RF signal source match setting through a defrost operation for two different loads, where trace 1510 corresponds to a first load (e.g., having a first type, mass, and so on), and trace 1520 corresponds to a second load (e.g., having a second type, mass, and so on). In FIG. 15, the optimal initial match settings for the two loads at the beginning of a defrost operation (e.g., when the loads are frozen) are indicated by points 1512 and 1522, respectively. As can be seen, both points 1512 and 1522 indicate relatively high cavity match settings in comparison to relatively low RF source match settings. Referring to the embodiment of FIG. 4A, this translates to a relatively high inductance for variable inductance network 416, and a relatively low inductance for variable inductance network 410. Referring to the embodiment of FIG. 8, this translates to a relatively high inductance for variable inductance networks 811 and 816, and a relatively low inductance for variable inductance network 821.

According to an embodiment, to establish the initial configuration or state for the variable matching network in block 1404, the system controller sends control signals to the first and second variable inductance networks (e.g., networks 410, 411, FIG. 4A) to cause the variable inductance network for the RF signal source match (e.g., network 410) to have a relatively low inductance, and to cause the variable inductance network for the cavity match (e.g., network 411) to have a relatively high inductance. The system controller may determine how low or how high the inductances are set based on load type/ mass /temperature information known to the system controller a priori. If no a priori load type/ mass /temperature information is available to the system controller, the system controller may select a relatively low default inductance for the RF signal source match and a relatively high default inductance for the cavity match.

Assuming, however, that the system controller does have a priori information regarding the load characteristics, the system controller may attempt to establish an initial configuration near the optimal initial matching point. For example, and referring again to FIG. 15, the optimal initial matching point 1512 for the first type of load has a cavity match (e.g., implemented by network 411, FIG. 4A or 811/816, FIG. 8) of about 80 percent of the network's maximum value, and has an RF signal source match (e.g., implemented by network 410 or 821, FIGS. 4A, 8) of about 10 percent of the network's maximum value. Assuming each of the variable inductance networks has a structure similar to network 500 of FIG. 5, for example, and assuming that the states from Table 1, above, apply, then for the first type of load, system controller may initialize the variable inductance network so that the cavity match network (e.g., network 411 or 811/816) has state 12 (i.e., about 80 percent of the maximum possible inductance of network 411 or 811/816), and the RF signal source match network (e.g., network 410 or 821) has state 2 (i.e., about 10 percent of the maximum possible inductance of network 410). Conversely, the optimal initial matching point 1522 for the second type of load has a cavity match (e.g., implemented by network 411 or 811/816) of about 40 percent of the network's maximum value, and has an RF signal source match (e.g., implemented by network 410 or 821) of about 10 percent of the network's maximum value. Accordingly, for the second type of load, system controller may initialize the variable inductance network so that the cavity match network (e.g., network 411 or 811/816) has state 6 (i.e., about 40 percent of the maximum possible inductance of network 411 or 811/816), and the RF signal source match network (e.g., network 410 or 821) has state 2 (i.e., about 10 percent of the maximum possible inductance of network 410 or 821). Generally, during a defrosting operation, adjustments to the impedance values of the RF signal source match network and the cavity match network are made in an inverse manner. In other words, when the impedance value of the RF signal source match network is decreased, the impedance value of the cavity match network is increased, and vice versa. Although not described in detail herein, a similar adjustment process may be performed to control the matching provided by a variable capacitance network embodiment (e.g., networks 440, FIG. 4B and 1000, FIG. 10).

Referring again to FIG. 14A, once the initial variable matching network configuration is established, the system controller may perform a process, at block 1410, of adjusting, when appropriate, the configuration of the variable impedance matching network to find an acceptable or best match based on actual measurements that are indicative of the quality of the match. Additionally, at block 1410, the system controller may estimate the mass of the load or may refine a previously determined mass estimate of the load (e.g., based on the rate of change of the S11 parameter or of the VSWR or based on the elapsed time between determining two consecutive matches via reconfiguration of the variable impedance matching network). The S11 parameter and the VSWR may be generally referred to herein as "RF signal ratios", as the S11 parameter is a ratio of the reflected power and the forward power measured between the RF signal source and the cavity, and the VSWR is a ratio of the maximum voltage magnitude of the RF signal and the minimum voltage magnitude of the RF signal.

Based on the mass of the load, the system controller may also determine specific values for a set of parameters of the RF signal to be provided by the RF signal source (e.g., RF signal source 320, 720, 1120, FIGS. 3, 7, 11). This set of RF signal parameters, as determined by the system controller based on the estimated load mass, is referred to below as a set of "desired signal parameters" for the RF signal, and the RF signal produced with the set of desired signal parameters is referred to below as a "mass-estimate-based RF signal." The desired signal parameters may be updated one or more times during defrosting operations as the estimated load mass is refined.

FIG. 14B shows tasks 1410-1 that may be performed at block 1410 of the method shown in FIG. 14A, according to an embodiment. At block 1411, the system controller causes the RF signal source to supply a relatively low power RF signal through the variable impedance matching network to the electrode(s) (e.g., first electrode 340 or both electrodes 740, 750, 1170, 1172, FIGS. 3, 7, 11). The system controller may control the RF signal power level through control signals to the power supply and bias circuitry (e.g., circuitry 326, 726, FIGS. 3, 7), where the control signals cause the power supply and bias circuitry to provide supply and bias voltages to the amplifiers (e.g., amplifier stages 324, 325, 724, FIGS. 3, 7) that are consistent with a desired signal power level. For example, the relatively low power RF signal may be a signal having a power level in a range of about 10 W to about 20 W, although different power levels alternatively may be used. Supplying a relatively low power level signal during block 1411 may be desirable to reduce the risk of damaging the cavity and/or load (e.g., if the initial match causes high reflected power), and to reduce the risk of damaging the switching components of the variable inductance or capacitance networks (e.g., due to arcing across the switch contacts).

In block 1412, at an "evaluation time", power detection circuitry (e.g., power detection circuitry 330, 730, 1180, FIGS. 3, 7, 11) then measures the reflected and (in some embodiments) forward power along the transmission path (e.g., path 328, 728, 1148, FIGS. 3, 7, 11) between the RF signal source and the electrode(s), and provides those measurements to the system controller. The system controller may then determine a ratio between the reflected and forward signal powers, and may determine the S11 parameter (e.g., corresponding to return loss) and/or the VSWR for the system based on the ratio. The system controller may store the received power measurements (e.g., the received reflected power measurements, the received forward power measurement, or both), and/or the calculated ratios, and/or S11 parameters, and/or VSWR for future evaluation or comparison, in an embodiment.

At block 1413, the system controller may determine, based on the reflected power measurements, and/or the reflected-to-forward signal power ratio, and/or the S11 parameter, and/or the VSWR, whether or not the match provided by the variable impedance matching network at the evaluation time is acceptable (e.g., the reflected power is below a threshold, or the reflected-to-forward signal power ratio is 10 percent or less (or below some other threshold), or the measurements or values compare favorably with some other criteria). Alternatively, the system controller may be configured to determine whether the match is the "best" match. A "best" match may be determined, for example, by iteratively measuring the reflected RF power (and in some embodiments the forward reflected RF power) for all possible impedance matching network configurations (or at least for a defined subset of impedance matching network configurations), and determining which configuration results in the lowest reflected RF power and/or the lowest reflected-to-forward power ratio. In some embodiments, a binary search algorithm or a regional search algorithm may instead be used to identify the "best match" configuration that results in the lowest reflected RF power and/or the lowest reflected-to-forward power ratio, which may reduce the amount of time needed to find the best match configuration.

When the system controller determines that the match is not acceptable or is not the best match, the system controller may adjust the match, in block 1414, by reconfiguring the variable impedance matching network. For example, this reconfiguration may be achieved by sending control signals to the variable impedance matching network, which cause the network to increase and/or decrease the variable inductances and/or variable capacitances within the network (e.g., by causing the variable inductance networks 410, 411, 415, 811, 816, 821 (FIGS. 4A, 8) or variable capacitance networks 422, 444, 446, 448, 1011, 1013, 1016, 1018, 1021, 1024 (FIGS. 4B, 10) to have different inductance or capacitance states, or by switching inductors 501-504, 911-914, 916-919, 921, 923, (FIGS. 5A, 9) or capacitors 541-544 (FIG. 5B) into or out of the circuit). Then-current inductance values or states of variable inductance networks (e.g., inductance values of inductors 410, 411, 415, 811, 816, 821, FIGS. 4A, 8) or capacitance values or states of variable capacitance networks (e.g., capacitance values of capacitors 442, 444, 446, 448, 1011, 1013, 1016, 1018, 1021, 1024, FIG. 4B, 10) in the variable impedance matching network may be stored in a memory of the system controller. For each of the variable inductors and variable capacitors, the inductance value and capacitance value associated with a particular evaluation time may be referred to herein as a "current variable component value," and a set of current variable component values for the one or more variable components in the variable inductance or capacitance networks at a particular evaluation time may be referred to herein as a "current variable component value set." After reconfiguring (or adjusting) the variable impedance network, blocks 1411, 1412, and 1413 may be iteratively performed until an acceptable or best match is determined in block 1413.

When the variable impedance network is configured in a state in which an acceptable or best match is achieved (e.g., as indicated by the reflected power, reflected-to-forward signal power ratio, and/or S11 parameter, and/or VSWR being below corresponding thresholds), the current variable component value set includes the then-current values of the one or more variable components in the variable impedance matching network. For the variable inductance matching networks 400 or 800 of FIG. 4A or 8, for example, the current variable component set may include the inductance values of variable inductances 410, 411, 811, 816, and 821 at the evaluation time (referred to herein as "current variable inductance values"), and for the variable capacitance matching networks 440 or 1000 of FIG. 4B or 10, for example, the current variable component set may include the capacitance values of variable capacitances 442 or 444, 446 or 448, 1011 or 1013, 1016 or 1018, and 1021 or 1024 at the evaluation time (referred to herein as "current variable capacitance values"). According to an embodiment, the current variable component value set then may be used to estimate the mass of the load using one or more look-up tables (LUTs), as will be described below. In some embodiments, estimation of the mass may be performed only once during a defrosting operation. Alternatively, the mass estimation process may be performed more than once.

Once an acceptable or best match is determined at block 1413, the system controller may determine, at block 1415, whether the match determined at block 1413 was an "initial match" corresponding to the first match performed during the present defrosting operation. For example, an "initial flag" may be asserted (or set) in memory at block 1413 when the initial match of the defrosting operation is determined, and the system controller may check the status of the initial flag at block 1415. If the initial flag is asserted, the system controller proceeds to block 1416 and de-asserts (or clears) the initial flag. If the initial flag is not asserted, the system controller proceeds to block 1419 for embodiments in which a refined mass estimate is determined only once, or proceeds directly to block 1430 via path 1435 for embodiments in which refined mass estimates are determined periodically throughout the defrosting operation.

If the system controller determines that the match that has just been determined at block 1415 is an initial match, at block 1416 the current variable component values of some or all of the variable components in the variable inductance networks and/or variable capacitance networks of the variable impedance matching network may be compared to entries within one or more LUTs, which may be stored in the memory of the system controller and/or memory otherwise accessible to the system controller, in order to estimate the mass of the load in the cavity. In some embodiments, the S11 parameter value of the initial match (sometimes referred to herein as the "initial S11 parameter value) may instead be compared to entries within the one or more LUTs as a basis for estimating the mass of the load. For example, an LUT may include a plurality of entries, where each entry includes a field for each variable component, a field for the S11 parameter value for the initial match, a field for an associated load mass, and/or a field for an associated load temperature. It should be noted that knowing the initial temperature of the load (e.g., via inputs received through the user interface or a temperature sensor in the cavity) may allow the system controller to more accurately estimate the mass of the load, but when no initial temperature of the load is provided or detectable, the system may automatically assume the load to be at a default initial temperature (e.g., −20° C. or some other temperature).

The configuration of the LUT (e.g., the fields in each LUT entry) depends at least in part on the configuration of the variable impedance matching network utilized in the system, and how many variable components are included in the variable impedance matching network. For example, FIG. 16A shows an illustrative example of a portion of an LUT 1600 associated with the variable inductance network 800 of FIG. 8, which includes three variable inductances 821, 811, 816, referred to below as "L1", "L2", and "L3," respectively. In some embodiments, the inductance 811 may have the same value as inductance 816, regardless of the value of the inductance 821. LUT 1600 includes a plurality of columns 1602, 1604, 1606, 1608, 1610, 1612, 1614, 1616, 1618, and a plurality of rows or entries 1622, 1624, 1626, 1628, 1630, 1632, where only a subset of the rows/entries are illustrated in FIG. 16A. Inductance values L1, L2, and L3 stored in the LUT 1600 may be referred to as "stored inductance values," and for a given row of LUT 1600, the inductance values L1, L2, and L3 in that row may be referred to as a "subset" of the stored inductance values. The intersection of each column and row is referred to herein as a "cell" of the LUT 1600.

In the present example, the cells in the column 1602, which is optional, includes various characterizations of the contents of the cavity of the system ("empty" or "ground beef" in the present example). The cells in the column 1604 include stored inductance values L1 for a first variable inductance network (e.g., variable inductance 821, FIG. 8). The cells in the column 1606 include stored inductance values L2 for a second variable inductance network (e.g., variable inductance 811, FIG. 8). The cells in the column 1608 include stored inductance values L3 for a third variable inductance network (e.g., variable inductance 816, FIG. 8). For embodiments in which the value of inductance 811 is the same as that of inductance 816, columns 1606 and 1608 could be combined into a single column to simplify the table, as the inductance values in the column 1606 would be the same as those of column 1608. It should be noted that the inductance values L1, shown in the column 1604, are normalized to 50 nH while the inductance values L2 and L3, respectively shown in the columns 1606 and 1608, are normalized to 100 nH. In other embodiments, the stored inductance values may not be normalized, or the stored inductance values may be normalized to other values.

The cells of column 1610 of LUT 1600 include stored S11 parameter values for the system, shown in decibels (dB), representing the input return loss for the system upon the determination of an initial match, which may be affected by the quality of the impedance match between the RF signal source and the cavity, which is affected by the mass of the load. In some embodiments, the stored S11 parameters may be used instead of or in combination with the values of L1, L2, and L3 in estimating the mass of the load in the cavity of the system.

The cells in the column 1612 may include the mass of the contents of the cavity in grams (g). As shown, the stored S11 parameter value decreases as the mass of the load increases (for the same initial temperature and load type) indicating that a better impedance match may be achieved for larger loads. The cells in the column 1614 may include the initial temperature of the contents of the cavity (e.g., of the load) in degrees Celsius (° C.).

The cells in the column 1616 may include different levels of RF power to be applied to a load based on the mass of the load and on the amount of time RF power is to be applied to the load. As shown, the amount of RF power applied to the load increases as the mass of the load increases, up to an illustrative maximum threshold of 300 W. It should be understood that the maximum threshold for RF power may vary depending on the operating parameters of the defrosting system.

The cells in the column 1618 may include different amounts of time for which RF power may be applied to a load based on the mass of the load and the amount of RF power to be applied to the load. As shown, even when the applied RF power has reached its maximum threshold in rows 1628, 1630, and 1632, loads having larger mass may be defrosted by increasing the amount of time for which the RF power is applied to the load.

The cells in the row 1622 correspond to an empty cavity. The cells in the row 1624 correspond to a cavity containing 200 g of ground beef at −20° C. The cells in the row 1626 correspond to a cavity containing 500 g of ground beef at −20° C. The cells in the row 1628 correspond to a cavity containing 1000 g of ground beef at −20° C. The cells in the row 1630 correspond to a cavity containing 1500 g of ground beef at −20° C. The cells in the row 1632 correspond to a cavity containing 2000 g of ground beef at −20° C.

LUT 1600 is stored in memory accessible to the system controller in accordance with an example embodiment. The system controller may compare or correlate current inductance values of variable inductance networks (e.g., the current inductance values corresponding to those stored in the memory of the system controller at block 1414 of FIG. 14B) in the variable impedance matching network to corresponding inductance values in the columns 1604, 1606, and 1608 of the LUT in order to estimate mass of the load.

As another example, FIG. 16B shows an illustrative example of a portion of a LUT 1700 associated with the variable capacitance network 1000 of FIG. 10, which includes three variable capacitances 1011, 1016, 1023, referred to below as "C1", "C2", and "C3," respectively. In some embodiments, the capacitance 1011 may have the same value as the capacitance 1016, regardless of the value of the capacitance 1023. LUT 1700 includes a plurality of columns 1702, 1704, 1706, 1708, 1710, 1712, 1714, 1716, 1718 and a plurality of rows or entries 1722, 1724, 1726, 1728, 1730, 1732, where only a subset of the rows/entries are illustrated in FIG. 16B. Capacitance values C1, C2, and C3 stored in the LUT 1700 may be referred to as "stored inductance values," and for a given row of the LUT 1700, the capacitance values C1, C2, and C3 in that row may be referred to as a "subset" of the stored capacitance values. The intersection of each column and row is referred to herein as a "cell" of the LUT 1700.

In the present example, the cells in the column 1702, which is optional, includes various characterizations of the contents of the cavity of the system ("empty" or "ground beef" in the present example). The cells in the column 1704 include stored capacitance values C1 for a first variable inductance network (e.g., variable capacitance 1011, FIG. 10). The cells in the column 1706 include stored capacitance values C2 for a second variable capacitance network (e.g., variable capacitance 1016, FIG. 10). For embodiments in which the value of the capacitance 1011 is the same as that of the capacitance 1016, the columns 1704 and 1706 could be combined into a single column to simplify the table, as the capacitance values in the column 1704 would be the same as those of the column 1706. The cells in the column 1708 include stored inductance values C3 for a third variable inductance network (e.g., variable inductance 1023, FIG. 8). It should be noted that the capacitance values C1 and C2, respectively shown in the columns 1704 and 1706, are normalized to 200 nF while the capacitance values C3, shown in the column 1708, are normalized to 500 nF. In other embodiments, the stored capacitance values may not be normalized, or the stored capacitance values may be normalized to other values.

The cells of the column 1710 of the LUT 1700 include stored S11 parameter values for the system, shown in decibels (dB), representing the input return loss for the system upon the determination of an initial match, which may be affected by the quality of the impedance match between the RF signal source and the cavity which is affected by the mass of the load. In some embodiments, the stored S11 parameters may be used instead of or in combination with the values of C1, C2, and C3 in estimating the mass of the load in the cavity of the system.

The cells in the column 1712 may include the mass of the contents of the cavity in grams (g). As shown, the stored S11 parameter value decreases as the mass of the load increases (for the same initial temperature and load type) indicating that a better impedance match may be achieved for larger loads. The cells in the column 1714 may include the initial temperature of the contents of the cavity (e.g., of the load) in degrees Celsius (° C.).

The cells in the column 1716 may include different levels of RF power to be applied to a load based on the mass of the load and on the amount of time RF power is to be applied to the load. As shown, the amount of RF power applied to the load increases as the mass of the load increases, up to an illustrative maximum threshold of 300 W. It should be understood that the maximum threshold for RF power may vary depending on the operating parameters of the defrosting system.

The cells in the column 1718 may include different amounts of time for which RF power may be applied to a load based on the mass of the load and the amount of RF power to be applied to the load. As shown, even when the applied RF power has reached its maximum threshold in the rows 1728, 1730, and 1732, loads having larger mass may be defrosted by increasing the amount of time for which the RF power is applied to the load.

The cells in the row 1722 correspond to an empty cavity. The cells in the row 1724 correspond to a cavity containing 200 g of ground beef at −20° C. The cells in the row 1726 correspond to a cavity containing 500 g of ground beef at −20° C. The cells in the row 1728 correspond to a cavity containing 1000 g of ground beef at −20° C. The cells in the row 1730 correspond to a cavity containing 1500 g of ground beef at −20° C. The cells in the row 1732 correspond to a cavity containing 2000 g of ground beef at −20° C.

The LUT 1700 is stored in memory accessible to the system controller in accordance with an example embodiment. The system controller may compare or correlate current capacitance values of variable capacitance networks (e.g., the current capacitance values corresponding to those stored in the memory of the system controller at block 1414 of FIG. 14B) in the variable impedance matching network to corresponding capacitance values in the columns 1704, 1706, and 1708 of LUT 1700 in order to estimate mass of the load.

It should be understood that the LUTs associated with variable inductance networks and variable capacitance networks described in connection with FIGS. 16A and 16B are meant to be illustrative and not limiting. Other variable impedance networks (e.g., including variable impedance networks for unbalanced (e.g., single-ended) systems such as the networks 400, 440, 500, 540, FIGS. 4A, 4B, 5A, and 5B, differently-configured variable inductance networks, differently-configured variable capacitance networks, and networks that include both variable inductors and variable capacitors) could alternatively be used in the system, and variable component values of these networks may populate the entries of one or more differently-configured LUTs stored in the memory of the system controller. In addition, it should be noted that a "variable network" may include fixed components, as well as variable components, and may also may include variable or fixed resistors. It should further be noted that, a "variable capacitor" or "variable inductor" may include switching elements (e.g., transistors or mechanical relays, as reflected in FIGS. 5A, 5B, and 9) that cause the capacitance or inductance between input and output nodes to be variable. Additional switching elements may be included that may switch some or all of the passive components into or out of the variable impedance network(s). Alternatively, such a variable component may itself be physically modifiable to provide a variable value (e.g., by tapping into different locations on an inductor coil or moving plates of a capacitor closer or further apart).

Given knowledge of the set of current variable component values that correspond to the acceptable/best match (e.g., determined in block 1413), the system controller may compare or correlate each of the one or more variable component values within the current component value set to the corresponding stored component value(s) within each entry (e.g., row) listed in the LUT(s) stored in the memory of the system controller. For example, referring again to the example LUT 1600 in FIG. 16A, the current variable component value for inductance value L1 (e.g., inductance 821, FIG. 8) may be compared with the corresponding stored values for L1 in the column 1604 to determine first differences between the current variable component value for inductor L1 and each stored L1 value. Similarly, the current variable component value for inductor L2 may be compared with the corresponding stored values for L2 in the column 1606 to determine second differences between the current variable component value for inductor L2 and each stored L2 value, and so on. In the context of the comparison process, the current variable component values may be normalized (assuming that the corresponding stored values in LUT 1600 also are normalized).

Based on this comparison process, the controller may determine which entry of the LUT corresponds to the best match (e.g., an identical match or a closest match) having stored variable component values that most closely correlate with the current variable component values. The row or entry corresponding to the "best match" is referred to herein as a "correlated entry." An example implementation of determining the best match involves iteratively adjusting the impedance values of the variable impedance matching network and measuring the S11 parameter value as low RF power is applied at each iteration to identify the lowest S11 parameter value achievable. The variable impedance matching network configuration corresponding the lowest S11 parameter value achievable would then be identified by the defrosting system (e.g., by the system controller) as providing the best match.

Alternate methods of identifying the best match may instead be applied, which, rather than testing all possible configurations of the variable impedance matching network, only test configurations within a predetermined range of the current configuration. Some methods may predict which variable impedance matching network configurations to test based on historical configuration data stored in the memory of the defrosting system (e.g., collected during previously performed defrosting/heating operations). In some embodiments, the best match may be identified as any variable impedance matching network configuration determined to allow more than a predetermined threshold percentage (e.g., 95%-99%) of the applied RF energy is absorbed by the load.

In some embodiments, the accuracy of the determination of the correlated entry may be enhanced by comparing an initial temperature of the load to stored temperature values listed in the LUT (e.g., in the column 1614 of LUT 1600). In such embodiments, the controller may determine which entry of the LUT is the correlated entry based on comparisons between not only the current and stored variable component values, but also between the initial temperature of the load and the stored temperature values. Otherwise, the initial temperature of the load may be assumed by the system controller to be a default temperature (e.g., −20° C. or some other temperature). For example, the controller may determine that the entry of the LUT having stored variable component values and/or S11 parameter value that most closely correlate with the current variable component values and/or initial S11 parameter value, and having a stored temperature value that most closely correlates with the initial temperature value is the correlated entry. The system controller may then estimate the mass of the load as the mass included in the correlated entry of the LUT.

In some embodiments, multiple entries in the LUT may have identical stored variable component values, but different stored temperature values and/or stored load type specifiers. Accordingly, multiple correlated entries may be determined in the above-described process, where the multiple correlated entries have identical stored component values but different temperature and/or load types. In such an embodiment, given a user-provided or sensed temperature of the load and/or a user-provided or sensed load type (e.g., ground beef at −20 degrees Celsius, in a present example), one of the multiple correlated entries may be selected as a final correlated entry (e.g., the correlated entry with a stored mass or stored temperature value that most closely matches the user-provided or sensed load type or temperature). After determining the correlated entry, the mass of the load may be estimated (e.g., by the system controller) as the mass value listed in the column 1612 of the correlated entry. Again, in an embodiment, the correlated entry is an entry for which the corresponding subset of inductance values L1, L2, and L3 stored in the columns 1604, 1606, and 1608 most closely match or correlate with the current variable component value set (e.g., more specifically the current inductance values of variable inductance network(s) of the variable impedance matching circuit).

To summarize, given knowledge of the set of component values that correspond to the acceptable/best match (e.g., the current component values determined in block 1413), the system controller may compare the set of current component values to the component values listed in a LUT stored in the memory of the system controller, and then may determine which entry/row of the LUT corresponds to the best match (e.g., an identical match or a closest match).

As indicated previously, there may be instances for which the current inductance values (e.g., current L1, L2, and L3 values of the variable inductance network) do not exactly match any subset of inductance values in an entry of LUT 1600. In such instances, the system controller may identify two (or multiple) correlated entries, and may interpolate between (e.g., using linear interpolation), mathematically average, or otherwise mathematically manipulate the two (or multiple) corresponding mass values in the two (or multiple) correlated entries to determine an initial estimated mass value.

For example, referring to the example stored values shown in the LUT 1600, when the current inductance values L1, L2, and L3 are 1.3, 2.55, and 2.55, respectively, the system controller may identify entries 1626 and 1628 as potential correlated entries, and may interpolate the two mass values of 500 and 1000 (in the column 1612), since entries 1626 and 1628 correspond to the two most closely matching subsets of stored inductance values L1, L2, and L3 in the LUT 1600. Assuming the interpolation corresponds to an average between the two values, this may result in an initial mass estimate of the load of 750 grams.

While the present example values in the LUT 1600 includes data corresponding to ground beef at −20° C., this intended to be illustrative and not limiting. It should be understood that other LUTs including data corresponding to loads of varying mass, temperature, and type may be stored in the memory of the system controller. A given LUT may, for example, be characterized in advance, with loads of various /masses, temperatures, and types being tested and corresponding variable component values (e.g., inductance values L1, L2, and L3) and initial S11 parameters being collected and stored in the LUT. It should be understood that while S11 parameters are described in connection with FIGS. 16A and 16B as being a basis for determining an estimated mass of a load, other RF signal parameters, such as VSWR or reflected power of the RF signal may instead or additionally be included in the LUT 1600 or the LUT 1700 and used as a basis for determining the estimated mass of the load.

Returning to FIG. 14B, once the system controller has determined an initial mass estimate for the load in the cavity, the system controller may estimate an amount of energy (sometimes referred to herein as an initial energy estimate) required to warm the load to the desired temperature in the cavity, at block 1417, based on the initial mass estimate (e.g., using Equation 1 (or other applicable equation) or a LUT derived from Equation 1 (or other applicable equation) and stored in the memory of the system) in combination with the known (e.g., provided as an input at block 1402 or measured via a temperature sensor in the cavity) or assumed temperature of the load (e.g., a default starting temperature stored in the memory of the system controller; such as about −20° C. or some other temperature).

The RF signal provided by the RF signal source may be characterized by multiple signal parameters. For example, RF signal parameters may include, but are not limited to, a frequency, an amplitude, and a power level, and each of these parameters have a particular value at any given time. At block 1418, the system controller may determine one or more "desired signal parameters" for the RF signal produced by the RF signal source based on the initial energy estimate (e.g., according to a LUT stored in the memory of the system). For example, the desired signal parameter(s) may include, but are not limited to, a desired frequency, a desired amplitude, and a desired power level (e.g., a desired RF power level) of the RF signal. Since the desired signal parameters may be determined based on initial energy estimate, and the initial energy estimate is determined based on the initial mass estimate for the load, a "initial-mass-estimate-based RF signal," as used herein, refers to an RF signal that is characterized by the one or more desired RF signal parameters following the initial match and prior to a subsequent match. The system controller may further determine the amount of time needed to apply the initial-mass-estimate-based RF signal in order to deliver the initially estimated amount of energy to the load.

Block 1419 is performed in embodiments where a refined mass estimate is determined only once subsequent to the determination of the initial mass estimate by the system controller. For other embodiments (e.g., in which multiple refined mass estimates are determined periodically, and/or at multiple times throughout the defrosting operation), block 1419 may be bypassed, and the system controller may proceed directly to block 1430 through via path 1435.

At block 1419, the system controller may determine whether the match determined at block 1413 was a "subsequent match" corresponding to a non-initial match performed during the present defrosting operation. For example, a "second flag" may be asserted (e.g., set) in memory at block 1413 when the subsequent match of the defrosting operation is determined, and the system controller may check the status of the second flag at block 1419. If the second flag is asserted, the system controller proceeds to block 1430 and de-asserts (e.g., clears) the second flag. Otherwise, if the second flag is not asserted, the system controller may identify that a refined mass estimate has already been determined in a previous iteration of block 1410, bypass blocks 1430, 1432, and 1434, and proceed to block 1420.

Generally, there is a negative correlation between the rate at which the impedance of a cavity containing a load changes during defrosting operations (e.g., as the temperature of the load increases) and the mass of the load. For example, the impedance of a load having a smaller mass may change more quickly as RF energy is applied to the load (e.g., to heat the load) compared to the impedance change rate of a load having a larger mass to which the same amount of RF energy is applied. The change in impedance of the load is reflected in the change in the quality of the impedance match between the cavity and the RF signal source, which correlates with the rate of change of the S11 parameter or the VSWR, for example. Thus, by monitoring the rate of change of the S11 parameter or the rate of change of the VSWR during defrosting operations, the mass of a load can be determined. As the rate of change of the S11 parameter and/or the VSWR are unknown at the outset of the defrosting process, an initial mass estimate for the load may be made using an alternative method (e.g., at block 1416), and may then be refined based on the rate of change of the S11 parameter or the rate of change of the VSWR.

At block 1430, a refined mass estimate is determined based on the initial mass estimate and the rate of change of a system parameter, such as the S1 i parameter or the VSWR (e.g., monitored at block 1420) between the RF signal source and the electrode(s) at the cavity. For example, the refined mass estimate may be determined by comparing the rate of change of the S11 parameter or the rate of change of the VSWR and the supplied RF power level to entries of a LUT stored in memory accessible to the system controller. The LUT may include a set of stored load mass values, a set of stored RF power levels, and a set of stored S11 and/or VSWR rates of change (sometimes referred to as stored parameter rates of change), all organized into multiple correlated entries. Each entry of the correlated entries may include a stored load mass value, a stored RF power level (e.g., the amount of RF energy applied to the load), and a stored S11 and/or VSWR rate of change (e.g., observed when the stored RF power level is applied to a load corresponding to the stored load mass value), in accordance with an embodiment. The system controller may search the LUT to identify an entry corresponding (or most closely corresponding) to the S11 parameter or VSWR rate of change measured for the defrosting system and the RF power level of the RF signal being supplied to the electrodes at the cavity containing the load. If the identified entry includes a stored load mass value that does not match the initial mass estimate (or the most recently made mass estimate, according to some embodiments), the system controller may determine a refined mass estimate that is equal to the load mass listed in the identified entry.

Once the system controller has determined a refined mass estimate for the load in the cavity, the system controller may determine a refined energy estimate by estimating an amount of energy required to warm the load to the desired temperature in the cavity, at block 1432, based on the refined mass estimate (e.g., using Equation 1 (or another suitable equation) or a LUT derived from Equation 1 (or another suitable equation) and stored in the memory of the system) in combination with the known (e.g., provided as an input at block 1402 or measured via a temperature sensor in the cavity) or assumed temperature of the load (e.g., a default starting temperature stored in the memory of the system controller; such as about −20° C. or some other temperature).

At block 1434, the system controller may update or "refine" the desired signal parameters for the RF signal produced by the RF signal source based on the refined energy estimate. These updated desired signal parameters may sometimes be referred to herein as "refined signal parameters" or "refined desired signal parameters". Since the desired signal parameters may be determined based on a refined energy estimate, and the refined energy estimate is determined based on the refined mass estimate for the load, a "refined-mass-estimate-based RF signal," as used herein, refers to an RF signal that is characterized by the one or more desired RF signal parameters following the second (or subsequent) match. The system controller may further determine the amount of time needed to apply the refined-mass-estimate-based RF signal in order to deliver the refined estimated amount of energy to the load.

FIG. 14C shows tasks 1410-2 that may be performed at block 1410 of the method shown in FIG. 14A, according to an alternate embodiment. At block 1811, the system controller causes the RF signal source to supply a relatively low power RF signal through the variable impedance matching network to the electrode(s) (e.g., first electrode 340 or both electrodes 740, 750, 1170, 1172, FIGS. 3, 7, 11). The system controller may control the RF signal power level through control signals to the power supply and bias circuitry (e.g., circuitry 326, 726, FIGS. 3, 7), where the control signals cause the power supply and bias circuitry to provide supply and bias voltages to the amplifiers (e.g., amplifier stages 324, 325, 724, FIGS. 3, 7) that are consistent with a desired signal power level.

In block 1812, at an "evaluation time", power detection circuitry (e.g., power detection circuitry 330, 730, 1180, FIGS. 3, 7, 11) then measures the reflected and (in some embodiments) forward power along the transmission path (e.g., path 328, 728, 1148, FIGS. 3, 7, 11) between the RF signal source and the electrode(s), and provides those measurements to the system controller. The system controller may then determine a ratio between the reflected and forward signal powers, and may determine the S11 parameter (e.g., corresponding to return loss) and/or the VSWR for the system based on the ratio. The system controller may store the received power measurements (e.g., the received reflected power measurements, the received forward power measurement, or both), and/or the calculated ratios, and/or S11 parameters, and/or the VSWR for future evaluation or comparison, in an embodiment.

At block 1813, the system controller may determine, based on the reflected power measurements, and/or the reflected-to-forward signal power ratio, and/or the S11 parameter, and/or the VSWR whether or not the match provided by the variable impedance matching network at the evaluation time is acceptable (e.g., the reflected power is below a threshold, or the reflected-to-forward signal power ratio is 10 percent or less (or below some other threshold), or the measurements or values compare favorably with some other criteria). Alternatively, the system controller may be configured to determine whether the match is the best match, as defined previously. In some embodiments, a binary search algorithm or a regional search algorithm may instead be used to identify the "best match" configuration that results in the lowest reflected RF power and/or the lowest reflected-to-forward power ratio, which may reduce the amount of time needed to find the best match configuration.

When the system controller determines that the match is not acceptable or is not the best match, the system controller may adjust the match, in block 1814, by reconfiguring the variable impedance matching network. For example, this reconfiguration may be achieved by sending control signals to the variable impedance matching network, which cause the network to increase and/or decrease the variable inductances and/or variable capacitances within the network (e.g., by causing the variable inductance networks 410, 411, 415, 811, 816, 821 (FIGS. 4A, 8) or variable capacitance networks 422, 444, 446, 448, 1011, 1013, 1016, 1018, 1021, 1024 (FIGS. 4B, 10) to have different inductance or capacitance states, or by switching inductors 501-504, 911-914, 916-919, 921, 923, (FIGS. 5A, 9) or capacitors 541-544 (FIG. 5B) into or out of the circuit). Then-current inductance values or states of variable inductance networks (e.g., inductance values of inductors 410, 411, 415, 811, 816, 821, FIGS. 4A, 8) or capacitance values or states of variable capacitance networks (e.g., capacitance values of capacitors 442, 444, 446, 448, 1011, 1013, 1016, 1018, 1021, 1024, FIG. 4B, 10) in the variable impedance matching network may be stored in a memory of the system controller. After reconfiguring (or adjusting) the variable impedance network, blocks 1811, 1812, and 1813 may be iteratively performed until an acceptable or best match is determined in block 1813.

When the variable impedance network is configured in a state in which an acceptable or best match is achieved (e.g., as indicated by the reflected power, reflected-to-forward signal power ratio, VSWR, and/or S11 parameter being below corresponding thresholds), the current variable component value set includes the then-current values of the one or more variable components in the variable impedance matching network. For the variable inductance matching networks 400 or 800 of FIG. 4A or 8, for example, the current variable component set may include the inductance values of variable inductances 410, 411, 811, 816, and 821 at the evaluation time, and for the variable capacitance matching networks 440 or 1000 of FIG. 4B or 10, for example, the current variable component set may include the capacitance values of variable capacitances 442 or 444, 446 or 448, 1011 or 1013, 1016 or 1018, and 1021 or 1024 at the evaluation time. According to an embodiment, the current variable component value set then may be used to estimate the mass of the load using one or more LUTs. In some embodiments, estimation of the mass may be performed only once during a defrosting operation. Alternatively, the mass estimation process may be performed more than once.

Once an acceptable or best match is determined at block 1813, the system controller may determine, at block 1815, whether the match determined at block 1813 was an "initial match" corresponding to the first match performed during the present defrosting operation. For example, an "initial flag" may be asserted (e.g., set) in memory at block 1813 when the initial match of the defrosting operation is determined (e.g., at a first evaluation time), and the system controller may check the status of the initial flag at block 1815. If the initial flag is asserted, the system controller proceeds to block 1816 and de-asserts (e.g., clears) the initial flag. If the initial flag is not asserted, the system controller proceeds to block 1819.

If the system controller determines that the match that has just been determined at block 1815 is an initial match, at block 1816 the current variable component values of some or all of the variable components in the variable inductance networks and/or variable capacitance networks of the variable impedance matching network may be compared to entries within one or more LUTs, which may be stored in the memory of the system controller and/or memory otherwise accessible to the system controller, in order to estimate the mass or mass of the load in the cavity. In some embodiments, the S11 parameter value of the initial match may instead be compared to entries within the one or more LUTs as a basis for estimating the mass of the load. For example, a LUT may include a plurality of entries, where each entry includes a field for each variable component, a field for the S11 parameter value for the initial match, a field for an associated load mass, and/or a field for an associated load temperature. It should be noted that knowing the initial temperature of the load (e.g., via inputs received through the user interface or a temperature sensor in the cavity) may allow the system controller to more accurately estimate the mass of the load, but when no initial temperature of the load is provided or detectable, the system may automatically assume the load to be at a default initial temperature (e.g., −20° C.). Examples of LUTs that may be accessed by the system controller in block 1816 are shown in FIGS. 16A and 16B, described above.

Once the system controller has determined an initial mass estimate for the load in the cavity, the system controller may estimate an amount of energy (sometimes referred to herein as an initial energy estimate) required to warm the load to the desired temperature in the cavity, at block 1817, based on the initial mass estimate (e.g., using Equation 1 (or another suitable equation) or a LUT derived from Equation 1 (or another suitable equation) and stored in the memory of the system) in combination with the known (e.g., provided as an input at block 1802 or measured via a temperature sensor in the cavity) or assumed temperature of the load (e.g., a default starting temperature stored in the memory of the system controller; such as about −20° C. or another temperature).

The RF signal provided by the RF signal source may be characterized by multiple signal parameters. For example, RF signal parameters may include, but are not limited to, a frequency, an amplitude, and a power level, and each of these parameters have a particular value at any given time. At block 1818, the system controller may determine one or more "desired signal parameters" for the RF signal produced by the RF signal source based on the initial energy estimate (e.g., according to a LUT stored in the memory of the system). For example, the desired signal parameter(s) may include, but are not limited to, a desired frequency, a desired amplitude, and a desired power level of the RF signal. The system controller may further determine the amount of time needed to apply the initial-mass-estimate-based RF signal in order to deliver the initial estimated amount of energy to the load.

Block 1819 is performed in embodiments where a refined mass estimate is determined only once subsequent to the determination of the initial mass estimate by the system controller. At block 1819, the system controller may determine whether the match determined at block 1813 was a "subsequent match" corresponding to a non-initial match performed during the present defrosting operation. For example, a "second flag" may be asserted (e.g., set) in memory at block 1813 when the subsequent match of the defrosting operation is determined (e.g., at a second evaluation time), and the system controller may check the status of the second flag at block 1819. If the second flag is asserted, the system controller proceeds to block 1830 and de-asserts (e.g., clears) the second flag. Otherwise, if the second flag is not asserted, the system controller may identify that a refined mass estimate has already been determined in a previous iteration of block 1410-2, bypass blocks 1830, 1832, and 1834, and proceed to block 1820.

At block 1830, a refined mass estimate is determined based on the elapsed time between the determination of the initial match and the determination of the subsequent match. For example, the system controller may determine the elapsed time to be the difference between the first evaluation time and the second evaluation time. The refined mass estimate may be determined by comparing the elapsed time between the initial match and the subsequent match and the supplied RF power level to entries of a LUT stored in memory accessible to the system controller. The LUT may include a set of stored load mass values, a set of stored RF power levels, and a set of elapsed time values, all organized into multiple correlated entry entries. Each entry of the correlated entries may include a stored load mass value, an RF power level (e.g., the amount of RF energy applied to the load), and a stored elapsed time (e.g., between the initial match and the subsequent match), in accordance with an embodiment. The system controller may search the LUT to identify an entry corresponding (or most closely corresponding) to the time elapsed between matches and the RF power level of the RF signal being supplied to the electrodes at the cavity containing the load. If the identified entry includes a stored load mass value that does not match the initial mass estimate (or the most recently made mass estimate, according to some embodiments), the system controller may determine a refined mass estimate that is equal to the load mass listed in the identified entry.

Once the system controller has determined a refined mass estimate for the load in the cavity, the system controller may determine a refined energy estimate by estimating an amount of energy required to warm the load to the desired temperature in the cavity, at block 1832, based on the refined mass estimate (e.g., using Equation 1 (or another suitable equation) or a LUT derived from Equation 1 (or another suitable equation) and stored in the memory of the system) in combination with the known (e.g., provided as an input at block 1802 or measured via a temperature sensor in the cavity) or assumed temperature of the load (e.g., a default starting temperature stored in the memory of the system controller; such as about −20° C. or another temperature).

At block 1834, the system controller may update or "refine" the desired signal parameters for the RF signal produced by the RF signal source based on the refined energy estimate. Since the desired signal parameters may be determined based on refined energy estimate, and the refined energy estimate is determined based on the refined mass estimate for the load, a "refined-mass-estimate-based RF signal," as used herein, refers to an RF signal that is characterized by the one or more desired RF signal parameters following the subsequent match. The system controller may further determine the amount of time needed to apply the refined-mass-estimate-based RF signal in order to deliver the refined estimated amount of energy to the load.

FIG. 14D shows a flowchart corresponding to a method that may be performed by a system controller (e.g., system controller 312, 712, 1130, FIGS. 3, 7, 11) of a defrosting system (e.g., system 100, 210, 220, 300, 700, 1100, FIGS. 1-3, 7, 11) with dynamic load matching to generate a refined mass estimate for a load being defrosted.

At block 1902, the system controller determines an initial mass estimate for a load to be defrosted by the defrosting system, an initial energy estimate of the amount of RF energy needed to warm the load to the desired temperature, and desired signal parameters for an RF signal applied to heat the load based on initial match conditions. The system controller may determine the initial mass estimate by comparing the initial match conditions to entries of a LUT stored in a memory accessible by the system controller. For example, the initial match conditions may include S11 parameter values and/or variable component values of a variable impedance matching network (e.g., network 772, 800, 900, 1000, FIGS. 7-10) upon the determination of a "best match" for the system (e.g., as described in connection with blocks 1416, 1816, FIGS. 14B, 14C) between an RF signal source (e.g., RF signal source (e.g., RF signal source 320, 720, 1120, FIGS. 3, 7, 11) and a defrosting cavity (e.g., cavity 360, 760, 1174, FIGS. 3, 7, 11). The system controller may calculate or otherwise determine an initial energy estimate corresponding to the amount of RF energy needed to be applied to the load in order to bring the load to a predetermined temperature (e.g., −1° C. or another temperature) based on the initial mass estimate (e.g., using Equation 1 (or another suitable equation) or a LUT derived from Equation 1 (or another suitable equation) and stored in the memory of the system) in combination with the known (e.g., provided as an input at block 1402 or measured via a temperature sensor in the cavity) or assumed initial temperature of the load (e.g., a default starting temperature stored in the memory of the system controller; such as about −20° C. or another temperature). The system controller may then determine one or more desired signal parameters for the RF signal produced by the RF signal source based on the initial energy estimate (e.g., according to a LUT stored in the memory of the system). For example, the desired signal parameter(s) may include, but are not limited to, a desired frequency, a desired amplitude, and a desired power level of the RF signal.

At block 1904, the system controller may periodically measure the S11 parameter or the VSWR derived from measurements of the forward and reflected power between the RF signal source and the defrosting cavity. The system controller may calculate and store the rate of change of the S11 parameter or of the VSWR based on these measurements.

At block 1906, if the system controller identifies that a new match has been determined via the reconfiguration of the variable impedance matching network, it proceeds to block 1908 to refine the mass estimate of the load and the desired signal parameters for the RF signal. Otherwise, the system controller returns to block 1904 to continue measuring the S11 parameter and/or the VSWR and calculating rates of change thereof.

At block 1908, the system controller may determine a refined mass estimate, a refined energy estimate, and refined, desired signal parameters based on the rate of change of the S11 parameter or the VSWR periodically determined at block 1904. For example, the system controller may compare the rate of change of the S11 parameter or the VSWR and an RF power level supplied to heat the load during defrosting operations to entries of a LUT stored in a memory accessible by the system controller to determine the refined mass estimate. The system controller may calculate or otherwise determine a refined energy estimate based on the refined mass estimate (e.g., using Equation 1 (or another suitable equation) or a LUT derived from Equation 1 (or another suitable equation) and stored in the memory of the system) in combination with the known or assumed initial temperature of the load. The system controller may then determine one or more refined, desired signal parameters for the RF signal produced by the RF signal source based on the refined energy estimate (e.g., according to a LUT stored in the memory of the system). For example, the desired signal parameter(s) may include, but are not limited to, a desired frequency, a desired amplitude, and a desired power level of the RF signal.

Returning to FIG. 14A, once an acceptable or best match and the one or more desired signal parameters are determined, the defrosting operation may commence or continue. Commencement or continuation of the defrosting operation includes, in block 1420, causing the RF signal source (e.g., RF signal source 320, 720, 1120, FIGS. 3, 7, 11) to produce the RF signal (or the mass-estimate-based RF signal) with the desired signal parameters (e.g., with a desired RF power level) that were determined in block 1418, 1818, 1434, or 1834, which corresponds to a relatively high power RF signal. Other RF signal parameters (e.g., frequency) also may be included as a "desired signal parameter", as indicated previously. Once again, the system controller may control the RF signal parameters, including the RF signal power level, through control signals to the RF signal source and to the power supply and bias circuitry (e.g., circuitry 326, 726, FIGS. 3, 7). The control signals to the RF signal source may control the frequency of the RF signal, for example, and the control signals to the power supply and bias circuitry may cause the power supply and bias circuitry to provide supply and bias voltages to the amplifiers (e.g., amplifier stages 324, 325, 724, FIGS. 3, 7) that are consistent with the desired signal power level. For example, the mass-estimate-based RF signal may be a signal having a power level in a range of about 50 W to about 500 W, although different power levels alternatively may be used.

In block 1422, power detection circuitry (e.g., power detection circuitry 330, 730, 730', 730", 1180, FIGS. 3, 7, 11) then periodically measures the reflected power and, in some embodiments, the forward power along the transmission path (e.g., path 328, 728, 1148, FIGS. 3, 7, 11) between the RF signal source and the electrode(s), and provides those measurements to the system controller. The system controller again may determine a ratio between the reflected and forward signal powers, and may determine the S11 parameter for the system based on the ratio and/or may determine the VSWR for the system based on the reflected and forward signal powers. The system controller may store the received power measurements, and/or the calculated ratios, VSWR, and/or S11 parameters for future evaluation or comparison, in an embodiment. According to an embodiment, the periodic measurements of the forward and reflected power may be taken at a fairly high frequency (e.g., on the order of milliseconds) or at a fairly low frequency (e.g., on the order of seconds). For example, a fairly low frequency for taking the periodic measurements may be a rate of one measurement every 10 seconds to 20 seconds.

In block 1424, the system controller may determine, based on one or more reflected signal power measurements, one or more calculated reflected-to-forward signal power ratios, and/or one or more calculated S11 parameters, and/or one or more calculated VSWR values, whether or not the match provided by the variable impedance matching network is acceptable. For example, the system controller may use a single reflected signal power measurement, a single calculated reflected-to-forward signal power ratio, or a single calculated S11 parameter in making this determination, or may take an average (or other calculation) of a number of previously-received reflected signal power measurements, previously-calculated reflected-to-forward power ratios, or previously-calculated Si i parameters or VSWR values in making this determination. To determine whether or not the match is acceptable, the system controller may compare the received reflected signal power, the calculated ratio, VSWR value, and/or S11 parameter to one or more corresponding thresholds, for example. For example, in one embodiment, the system controller may compare the received reflected signal power to a threshold of, for example, 5 percent (or some other value) of the forward signal power. A reflected signal power below 5 percent of the forward signal power may indicate that the match remains acceptable, and a ratio above 5 percent may indicate that the match is no longer acceptable. In another embodiment, the system controller may compare the calculated reflected-to-forward signal power ratio to a threshold of 10 percent (or some other value). A ratio below 10 percent may indicate that the match remains acceptable, and a ratio above 10 percent may indicate that the match is no longer acceptable. When the measured reflected power, or the calculated ratio or S11 parameter, or the VSWR is greater than the corresponding threshold (i.e., the comparison is unfavorable), indicating an unacceptable match, then the system controller may initiate re-configuration of the variable impedance matching network by returning to block 1410.

As discussed previously, the match provided by the variable impedance matching network may degrade over the course of a defrosting operation due to impedance changes of the load (e.g., load 364, 764, 1164, FIGS. 3, 7, 11) as the load warms up. It has been observed that, over the course of a defrosting operation, an optimal cavity match may be maintained by adjusting the cavity match inductance or capacitance and by also adjusting the RF signal source inductance or capacitance. Referring again to FIG. 15, for example, an optimal match for the first type of load at the end of a defrosting operation is indicated by point 1514, and an optimal match for the second type of load at the end of a defrosting operation is indicated by point 1524. In both cases, tracking of the optimal match between initiation and completion of the defrosting operations involves gradually decreasing the inductance of the cavity match and increasing the inductance of the RF signal source match.

According to an embodiment, in block 1410 when re-configuring the variable impedance matching network, the system controller may take into consideration this tendency. More particularly, when adjusting the match by reconfiguring the variable impedance matching network in block 1414 or 1814, the system controller initially may select states of the variable inductance networks for the cavity and RF signal source matches that correspond to lower inductances (for the cavity match, or network 411, FIG. 4A) and higher inductances (for the RF signal source match, or network 410, FIG. 4B). Similar processes may be performed in embodiments that utilize variable capacitance networks for the cavity and RF signal source. By selecting impedance values that tend to follow the expected optimal match trajectories (e.g., those illustrated in FIG. 15), the time to perform the variable impedance matching network reconfiguration process (e.g., in block 1410) may be reduced, when compared with a reconfiguration process that does not take these tendencies into account.

In an alternate embodiment, the system controller may instead iteratively test each adjacent configuration to attempt to determine an acceptable configuration. For example, referring again to Table 1, above, if the current configuration corresponds to state 12 for the cavity matching network and to state 3 for the RF signal source matching network, the system controller may test states 11 and/or 13 for the cavity matching network, and may test states 2 and/or 4 for the RF signal source matching network. If those tests do not yield a favorable result (i.e., an acceptable match), the system controller may test states 10 and/or 14 for the cavity matching network, and may test states 1 and/or 5 for the RF signal source matching network, and so on.

In actuality, there are a variety of different searching methods that the system controller may employ to re-configure the system to have an acceptable impedance match, including testing all possible variable impedance matching network configurations. Any reasonable method of searching for an acceptable configuration is considered to fall within the scope of the inventive subject matter. In any event, once an acceptable match is determined in block 1413 or 1813, the defrosting operation is resumed in block 1420, and the process continues to iterate.

Referring back to block 1424, when the system controller determines, based on one or more reflected power measurements, one or more calculated reflected-to-forward signal power ratios, one or more calculated VSWR values, and/or one or more calculated S11 parameters, that the match provided by the variable impedance matching network is still acceptable (e.g., the reflected power measurements, calculated ratio, or S11 parameter, or VSWR is less than a corresponding threshold, or the comparison is favorable), the system may evaluate whether or not an exit condition has occurred, in block 1426. In actuality, determination of whether an exit condition has occurred may be an interrupt driven process that may occur at any point during the defrosting process. However, for the purposes of including it in the flowchart of FIG. 14A, the process is shown to occur after block 1424.

In any event, several conditions may warrant cessation of the defrosting operation. For example, the system may determine that an exit condition has occurred when a safety interlock is breached. Alternatively, the system may determine that an exit condition has occurred upon expiration of a timer that was set by the user (e.g., through user interface 380, 780, FIGS. 3, 7) or upon expiration of a timer that was established by the system controller based on the system controller's estimate of how long the defrosting operation should be performed (e.g., based on a heating time determined by the system controller at block 1418 or 1818 based on the previously identified optimized RF signal power level and based on the previously identified amount of energy estimated to be required for defrosting the load). In still another alternate embodiment, the system may otherwise detect completion of the defrosting operation.

If an exit condition has not occurred, then the defrosting operation may continue by iteratively performing blocks 1422 and 1424 (and the matching network reconfiguration process 1410, as necessary). When an exit condition has occurred, then in block 1428, the system controller causes the supply of the RF signal by the RF signal source to be discontinued. For example, the system controller may disable the RF signal generator (e.g., RF signal generator 322, 722, FIGS. 3, 7) and/or may cause the power supply and bias circuitry (e.g., circuitry 326, 726, FIGS. 3, 7) to discontinue provision of the supply current. In addition, the system controller may send signals to the user interface (e.g., user interface 380, 780, FIGS. 3, 7) that cause the user interface to produce a user-perceptible indicia of the exit condition (e.g., by displaying "door open" or "done" on a display device, or providing an audible tone). The method may then end.

It should be understood that the order of operations associated with the blocks depicted in FIGS. 14A-D corresponds to an example embodiment, and should not be construed to limit the sequence of operations only to the illustrated order. Instead, some operations may be performed in different orders, and/or some operations may be performed in parallel.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

In an example embodiment, a thermal increase system may include a radio frequency (RF) signal source, at least one variable impedance network that includes at least one variable passive component having at least one current variable component value, and a controller. The at least one variable impedance network may be coupled between the RF signal source and the electrode. The controller may be configured to determine an initial estimated mass of a load that is proximate to the electrode based at least on the at least one current variable component value of the at least one variable impedance network, to determine one or more desired signal parameters for the RF signal, including a desired RF power level, based on at least the estimated mass of the load, to control the RF signal source to supply an initial-mass-estimate-based RF signal with the one or more desired signal parameters, to determine a rate of change of a parameter of the RF signal source while the initial-mass-estimate-based RF signal is supplied, to determine a refined estimated mass of the load based on at least the rate of change of the parameter, to determine one or more refined signal parameters for the RF signal based on at least the refined estimated mass of the load, and to control the RF signal source to supply a refined-mass-estimate-based RF signal with the one or more refined signal parameters. The parameter may an S11 parameter, a voltage standing wave ratio, or a reflected power of the RF signal.

In one embodiment, the controller may be configured to determine an initial estimated amount of energy sufficient to warm the load to a desired temperature based on the initial estimated mass of the load, and to determine a refined estimated amount of energy sufficient to warm the load to the desired temperature based on at least the refined estimated mass of the load. The controller may be configured to determine the one or more desired signal parameters for the RF signals based on the initial estimated amount of energy sufficient to warm the load to the desired temperature, and to determine the refined signal parameters for the RF signal based on the refined estimated amount of energy sufficient to warm the load to the desired temperature.

In one embodiment, the thermal increase system may include a memory configured to store a look-up table (LUT) that includes a set of stored load mass values, a set of stored RF power levels, and a set of stored parameter rates of change, and that is organized into multiple entries, each entry including a stored load mass value of the set of stored load mass values, a stored RF power level of the set of stored RF power levels, and a stored parameter rate of change of the set of stored parameter rates of change. The controller may be configured to determine the refined estimated mass of the load by comparing the rate of change of the parameter to the set of stored parameter rates of change of the LUT and comparing the desired RF power level to the set of stored RF power levels of the LUT to identify a correlated entry of the multiple entries. The correlated entry may include a first stored parameter rate of change that correlates with the rate of change of the parameter and a first stored RF power level that correlates with the desired RF power level, and by identifying a first stored load mass value of the set of stored load mass values that corresponds to the correlated entry. The first stored load mass value may be determined by the controller to be the refined estimated mass of the load. The at least one variable impedance network may include a double-ended variable impedance network that includes first and second inputs, first and second outputs, a first variable passive component that is connected between the first input and the first output, a second variable passive component that is connected between the second input and the second output, and a third variable passive component that is connected between the first input and the second input.

In one embodiment, the one or more refined signal parameters include at least one signal parameter selected from a group that includes a frequency of the RF signal and an amplitude of the RF signal.

In an example embodiment, a thermal increase system may be coupled to a cavity for containing a load. The thermal increase system may include a radio frequency (RF) signal source configured to supply an RF signal, a transmission path electrically coupled between the RF signal source and first and second electrodes that are positioned across the cavity, an impedance matching network electrically coupled along the transmission path, and a controller. The impedance matching network may include one or more variable passive components. Each of the one or more variable passive components may have a current variable component value at a first evaluation time, and a current variable component value set includes the current variable component value of each of the one or more variable passive components. The controller may be configured to determine an initial estimated mass of the load based on at least the current variable component value set, to determine one or more desired signal parameters for the RF signal, including a desired RF power level, based on at least the initial estimated mass of the load, to modify the RF signal source to supply an initial-mass-estimate-based RF signal with the one or more desired signal parameters, to reconfigure the impedance matching network at a second evaluation time, to determine an elapsed time between the first evaluation time and the second evaluation time, to determine a refined estimated mass of the load based on at least the elapsed time, to determine one or more refined signal parameters for the RF signal based on at least the refined estimated mass of the load, and to modify the RF signal source to supply a refined-mass-estimate-based RF signal with the one or more refined signal parameters.

In one embodiment, the controller may be configured to determine an initial estimated amount of energy sufficient to warm the load to a desired temperature based on at least the initial estimated mass of the load, and to determine a refined amount of energy sufficient to warm the load to the desired temperature based on at least the refined estimated mass of the load. The controller may be further configured to determine the one or more desired signal parameters for the RF signal based on the initial estimated amount of energy sufficient to warm the load to the desired temperature, and to determine the refined signal parameters for the RF signal based on the refined estimated amount of energy sufficient to warm the load to the desired temperature.

In one embodiment, the thermal increase system may include a memory configured to store a look-up table (LUT) that includes a set of stored load masses, a set of stored RF power levels, and a set of stored elapsed times, and that is organized into multiple entries each entry including a stored load mass of the set of stored load masses, a stored RF power level of the set of stored RF power levels, and a stored elapsed time of the set of stored elapsed times. In one embodiment, the controller may be configured to determine the refined estimated mass of the load by comparing the elapsed time to the set of stored elapsed times of the LUT and comparing the desired RF power level to the set of stored RF power levels of the LUT to identify a correlated entry of the multiple entries, wherein the correlated entry includes a first stored elapsed time that correlates with the elapsed time and a first stored RF power level that correlates with the desired RF power level and by identifying a first stored load mass of the set of stored load masses that corresponds to the correlated entry of the multiple entries in the LUT. The first stored load mass may be determined by the controller to be the refined estimated mass of the load.

In one embodiment, the one or more refined signal parameters may include at least one signal parameter selected from a group that includes a frequency of the RF signal and an amplitude of the RF signal.

In an example embodiment, a method of operating a thermal increase system that includes a cavity within which a load is contained may include supplying, by a radio frequency (RF) signal source, one or more RF signals to a transmission path that is electrically coupled between the RF signal source and one or more electrodes that are positioned proximate to the cavity, detecting, by power detection circuitry, reflected signal power along the transmission path, modifying, by a controller, one or more component values of one or more variable passive components of an impedance matching network that is electrically coupled along the transmission path to reduce the reflected signal power, determining, by the controller, an initial estimated mass of the load at least based on one or more current component values of the one or more variable passive components, determining, by the controller, one or more desired signal parameters for the RF signal at least based on the initial estimated mass of the load, the one or more desired signal parameters including a desired RF power level, controlling, by the controller, the RF signal source to supply an initial-mass-estimate-based RF signal with the one or more desired signal parameters, determining, by the controller, a rate of change of a parameter of the RF signal source while the initial-mass-estimate-based RF signal is supplied, wherein the parameter is selected from a group consisting of: an S11 parameter, a voltage standing wave ratio, and a reflected power of the RF signal, determining, by the controller, a refined estimated mass of the load based on at least the rate of change of the parameter, determining, by the controller, one or more refined signal parameters for the RF signal based on at least the refined estimated mass of the load, and controlling, by the controller, the RF signal source to supply a refined-mass-estimate-based RF signal with the one or more refined signal parameters.

In one embodiment, the method may include determining, by the controller, an initial estimated amount of energy sufficient to warm the load to a desired temperature based on the initial estimated mass of the load, and determining, by the controller, a refined estimated amount of energy sufficient to warm the load to the desired temperature based on the refined estimated mass of the load.

In one embodiment, the desired signal parameters may be determined based on the initial estimated amount of energy sufficient to warm the load to the desired temperature, and wherein the refined signal parameters are determined based on the refined estimated amount of energy sufficient to warm the load to the desired temperature.

In one embodiment, determining the initial estimated mass of the load may include comparing, by the controller, the one or more current component values with multiple stored component value sets stored in a memory of the thermal increase system, identifying, by the controller, a correlated stored component value set from the multiple stored component value sets that correlates with the one or more current component values, determining, by the controller, an identified stored mass of a plurality of stored masses that corresponds to the correlated stored component value set, and determining, by the controller, the initial estimated mass of the load to be the identified stored mass.

In one embodiment, wherein determining the refined mass estimate of the load includes comparing, by the controller, the rate of change of the parameter with multiple stored parameter rates of change stored in a memory of the thermal increase system, comparing, by the controller, the desired RF power level with multiple stored RF power levels stored in the memory of the system, identifying, by the controller, a correlated entry stored in the memory of the system, the correlated entry including a stored parameter rate of change that correlates with the rate of change of the parameter, and including a stored RF power level that correlates with the desired RF power level, and a stored load mass, and determining, by the controller, the refined estimated mass of the load to be the stored load mass of the correlated entry.

In one embodiment, the one or more refined signal parameters may include at least one signal parameter selected from a group that includes a frequency of the RF signal and an amplitude of the RF signal.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A thermal increase system comprising:
  a radio frequency (RF) signal source configured to supply an RF signal;
  an electrode coupled to the RF signal source;
  at least one variable impedance network that includes at least one variable passive component having at least one current variable component value, wherein the at least one variable impedance network is coupled between the RF signal source and the electrode; and
  a controller configured to determine an initial estimated mass of a load that is proximate to the electrode based at least on the at least one current variable component value of the at least one variable impedance network, to determine one or more desired signal parameters for the RF signal, including a desired RF power level, based on at least the estimated mass of the load, to control the RF signal source to supply an initial-mass-estimate-based RF signal with the one or more desired signal parameters, to determine a rate of change of a parameter of the RF signal source while the initial-mass-estimate-based RF signal is supplied, to determine a refined estimated mass of the load based on at least the rate of change of the parameter, to determine one or more refined signal parameters for the RF signal based on at least the refined estimated mass of the load, and to control the RF signal source to supply a refined-mass-estimate-based RF signal with the one or more refined signal parameters, wherein the parameter is selected from a group consisting of: an S11 parameter, a voltage standing wave ratio, and a reflected power of the RF signal.

2. The thermal increase system of claim 1, wherein the controller is configured to determine an initial estimated amount of energy sufficient to warm the load to a desired temperature based on the initial estimated mass of the load, and to determine a refined estimated amount of energy sufficient to warm the load to the desired temperature based on at least the refined estimated mass of the load.

3. The thermal increase system of claim 2, wherein the controller is configured to determine the one or more desired signal parameters for the RF signal based on the initial estimated amount of energy sufficient to warm the load to the desired temperature, and to determine the refined signal parameters for the RF signal based on the refined estimated amount of energy sufficient to warm the load to the desired temperature.

4. The thermal increase system of claim 2, further comprising:
  a memory configured to store a look-up table (LUT) that includes a set of stored load mass values, a set of stored RF power levels, and a set of stored parameter rates of change, and that is organized into multiple entries, each entry including a stored load mass value of the set of stored load mass values, a stored RF power level of the set of stored RF power levels, and a stored parameter rate of change of the set of stored parameter rates of change.

5. The thermal increase system of claim 4, wherein the controller is configured to determine the refined estimated mass of the load by comparing the rate of change of the parameter to the set of stored parameter rates of change of the LUT and comparing the desired RF power level to the set of stored RF power levels of the LUT to identify a correlated entry of the multiple entries, wherein the correlated entry includes a first stored parameter rate of change that correlates with the rate of change of the parameter and a first stored RF power level that correlates with the desired RF power level, and by identifying a first stored load mass value of the set of stored load mass values that corresponds to the correlated entry, wherein the first stored load mass value is determined by the controller to be the refined estimated mass of the load.

6. The thermal increase system of claim 5, wherein the at least one variable impedance network includes a double-ended variable impedance network that comprises:
  first and second inputs;
  first and second outputs;
  a first variable passive component that is connected between the first input and the first output;
  a second variable passive component that is connected between the second input and the second output; and
  a third variable passive component that is connected between the first input and the second input.

7. The thermal increase system of claim 1, wherein the at least one variable impedance network includes a single-ended variable impedance network that comprises:
  an input;
  an output;
  a set of passive components coupled between the input and the output; and one or more variable passive components that are connected between the input and a ground reference node and that have one or more component values.

8. The thermal increase system of claim 1, wherein the one or more refined signal parameters include at least one signal parameter selected from a group that includes a frequency of the RF signal and an amplitude of the RF signal.

9. A thermal increase system coupled to a cavity for containing a load, the thermal increase system comprising:
a radio frequency (RF) signal source configured to supply an RF signal;
a transmission path electrically coupled between the RF signal source and first and second electrodes that are positioned across the cavity;
an impedance matching network electrically coupled along the transmission path, wherein the impedance matching network comprises one or more variable passive components, wherein each of the one or more variable passive components has a current variable component value at a first evaluation time, and a current variable component value set includes the current variable component value of each of the one or more variable passive components; and
a controller configured to determine an initial estimated mass of the load based on at least the current variable component value set, to determine one or more desired signal parameters for the RF signal, including a desired RF power level, based on at least the initial estimated mass of the load, to modify the RF signal source to supply an initial-mass-estimate-based RF signal with the one or more desired signal parameters, to reconfigure the impedance matching network at a second evaluation time, to determine an elapsed time between the first evaluation time and the second evaluation time, to determine a refined estimated mass of the load based on at least the elapsed time, to determine one or more refined signal parameters for the RF signal based on at least the refined estimated mass of the load, and to modify the RF signal source to supply a refined-mass-estimate-based RF signal with the one or more refined signal parameters.

10. The thermal increase system of claim 9, wherein the controller is configured to determine an initial estimated amount of energy sufficient to warm the load to a desired temperature based on at least the initial estimated mass of the load, and to determine a refined amount of energy sufficient to warm the load to the desired temperature based on at least the refined estimated mass of the load.

11. The thermal increase system of claim 10, wherein the controller is configured to determine the one or more desired signal parameters for the RF signal based on the initial estimated amount of energy sufficient to warm the load to the desired temperature, and to determine the refined signal parameters for the RF signal based on the refined estimated amount of energy sufficient to warm the load to the desired temperature.

12. The thermal increase system of claim 10, further comprising:
a memory configured to store a look-up table (LUT) that includes a set of stored load masses, a set of stored RF power levels, and a set of stored elapsed times, and that is organized into multiple entries each entry including a stored load mass of the set of stored load masses, a stored RF power level of the set of stored RF power levels, and a stored elapsed time of the set of stored elapsed times.

13. The thermal increase system of claim 12, wherein the controller is configured to determine the refined estimated mass of the load by comparing the elapsed time to the set of stored elapsed times of the LUT and comparing the desired RF power level to the set of stored RF power levels of the LUT to identify a correlated entry of the multiple entries, wherein the correlated entry includes a first stored elapsed time that correlates with the elapsed time and a first stored RF power level that correlates with the desired RF power level and by identifying a first stored load mass of the set of stored load masses that corresponds to the correlated entry of the multiple entries in the LUT, wherein the first stored load mass is determined by the controller to be the refined estimated mass of the load.

14. The thermal increase system of claim 9, wherein the one or more refined signal parameters include at least one signal parameter selected from a group that includes a frequency of the RF signal and an amplitude of the RF signal.

15. A method of operating a thermal increase system that includes a cavity within which a load is contained, the method comprising:
supplying, by a radio frequency (RF) signal source, one or more RF signals to a transmission path that is electrically coupled between the RF signal source and one or more electrodes that are positioned proximate to the cavity;
detecting, by power detection circuitry, reflected signal power along the transmission path;
modifying, by a controller, one or more component values of one or more variable passive components of an impedance matching network that is electrically coupled along the transmission path to reduce the reflected signal power;
determining, by the controller, an initial estimated mass of the load at least based on one or more current component values of the one or more variable passive components;
determining, by the controller, one or more desired signal parameters for the RF signal at least based on the initial estimated mass of the load, the one or more desired signal parameters including a desired RF power level;
controlling, by the controller, the RF signal source to supply an initial-mass-estimate-based RF signal with the one or more desired signal parameters;
determining, by the controller, a rate of change of a parameter of the RF signal source while the initial-mass-estimate-based RF signal is supplied, wherein the parameter is selected from a group consisting of: an S11 parameter, a voltage standing wave ratio, and a reflected power of the RF signal;
determining, by the controller, a refined estimated mass of the load based on at least the rate of change of the parameter;
determining, by the controller, one or more refined signal parameters for the RF signal based on at least the refined estimated mass of the load; and
controlling, by the controller, the RF signal source to supply a refined-mass-estimate-based RF signal with the one or more refined signal parameters.

16. The method of claim 15, further comprising:
determining, by the controller, an initial estimated amount of energy sufficient to warm the load to a desired temperature based on the initial estimated mass of the load; and determining, by the controller, a refined estimated amount of energy sufficient to warm the load to the desired temperature based on the refined estimated mass of the load.

17. The method of claim 16, wherein the desired signal parameters are determined based on the initial estimated amount of energy sufficient to warm the load to the desired temperature, and wherein the refined signal parameters are determined based on the refined estimated amount of energy sufficient to warm the load to the desired temperature.

18. The method of claim 16, wherein determining the initial estimated mass of the load comprises:
   comparing, by the controller, the one or more current component values with multiple stored component value sets stored in a memory of the thermal increase system;
   identifying, by the controller, a correlated stored component value set from the multiple stored component value sets that correlates with the one or more current component values;
   determining, by the controller, an identified stored mass of a plurality of stored masses that corresponds to the correlated stored component value set; and
   determining, by the controller, the initial estimated mass of the load to be the identified stored mass.

19. The method of claim 16, wherein determining the refined mass estimate of the load comprises:
   comparing, by the controller, the rate of change of the parameter with multiple stored parameter rates of change stored in a memory of the thermal increase system;
   comparing, by the controller, the desired RF power level with multiple stored RF power levels stored in the memory of the system;
   identifying, by the controller, a correlated entry stored in the memory of the system, the correlated entry including a stored parameter rate of change that correlates with the rate of change of the parameter, and including a stored RF power level that correlates with the desired RF power level, and a stored load mass; and
   determining, by the controller, the refined estimated mass of the load to be the stored load mass of the correlated entry.

20. The method of claim 15, wherein the one or more refined signal parameters include at least one signal parameter selected from a group that includes a frequency of the RF signal and an amplitude of the RF signal.

* * * * *